United States Patent
Kanda

(10) Patent No.: US 11,024,346 B2
(45) Date of Patent: Jun. 1, 2021

(54) SEMICONDUCTOR CIRCUIT, DRIVING METHOD, AND ELECTRONIC DEVICE WITH LESS DISTURBANCE

(71) Applicant: SONY SEMICONDUCTOR SOLUTIONS CORPORATION, Kanagawa (JP)

(72) Inventor: Yasuo Kanda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/612,445

(22) PCT Filed: May 10, 2018

(86) PCT No.: PCT/JP2018/018054
§ 371 (c)(1),
(2) Date: Nov. 11, 2019

(87) PCT Pub. No.: WO2018/212056
PCT Pub. Date: Nov. 22, 2018

(65) Prior Publication Data
US 2020/0098401 A1 Mar. 26, 2020

(30) Foreign Application Priority Data

May 19, 2017 (JP) .............................. JP2017-099730

(51) Int. Cl.
*G11C 5/14* (2006.01)
*H01L 29/78* (2006.01)
(Continued)

(52) U.S. Cl.
CPC .............. *G11C 5/148* (2013.01); *G11C 5/147* (2013.01); *G11C 14/0072* (2013.01);
(Continued)

(58) Field of Classification Search
CPC ...... G11C 5/148; G11C 5/147; G11C 14/0072; G11C 11/2275; G11C 11/2293;
(Continued)

(56) References Cited

U.S. PATENT DOCUMENTS

| 8,106,877 | B2 * | 1/2012 | Park ...................... | H05B 41/285 |
| | | | | 345/102 |
| 2004/0141348 | A1 * | 7/2004 | Shau ...................... | G11C 15/04 |
| | | | | 365/49.1 |
| 2004/0141363 | A1 | 7/2004 | Ohtsuka et al. | |

FOREIGN PATENT DOCUMENTS

| JP | 01-222475 A | 9/1989 |
| WO | 2003/085741 A1 | 10/2003 |

OTHER PUBLICATIONS

International Search Report and Written Opinion of PCT Application No. PCT/JP2018/018054, dated Jul. 31, 2018, 09 pages of ISRWO.

* cited by examiner

*Primary Examiner* — Sultana Begum
(74) *Attorney, Agent, or Firm* — Chip Law Group

(57) ABSTRACT

A semiconductor circuit includes a first circuit to apply an inverted voltage of a voltage at a first node to a second node, a second circuit to apply an inverted voltage of a voltage at the second node to the first node, a first transistor that includes a gate, a drain, and a source, and stores a threshold state, a second transistor that couples the first node to a first terminal by being turned on, a third transistor that couples a first predetermined node to the gate of the first transistor, and a driving section that controls operations of the second transistor and the third transistor, and applies a control voltage to a second terminal. The first terminal is one of the drain or the source of the first transistor. The second terminal is another of the drain or the source of the first transistor.

26 Claims, 42 Drawing Sheets

(51) Int. Cl.
    *G11C 14/00*         (2006.01)
    *H01L 27/11*         (2006.01)
    *H01L 27/1159*       (2017.01)
    *H03K 3/356*         (2006.01)

(52) U.S. Cl.
    CPC ...... *H01L 27/1104* (2013.01); *H01L 27/1159* (2013.01); *H01L 29/78391* (2014.09); *H03K 3/356008* (2013.01)

(58) Field of Classification Search
    CPC ............ G11C 11/417; H01L 29/78391; H01L 27/1104; H01L 27/1159; H03K 3/356008; H03K 3/012; H03K 3/356
    See application file for complete search history.

[FIG. 1]
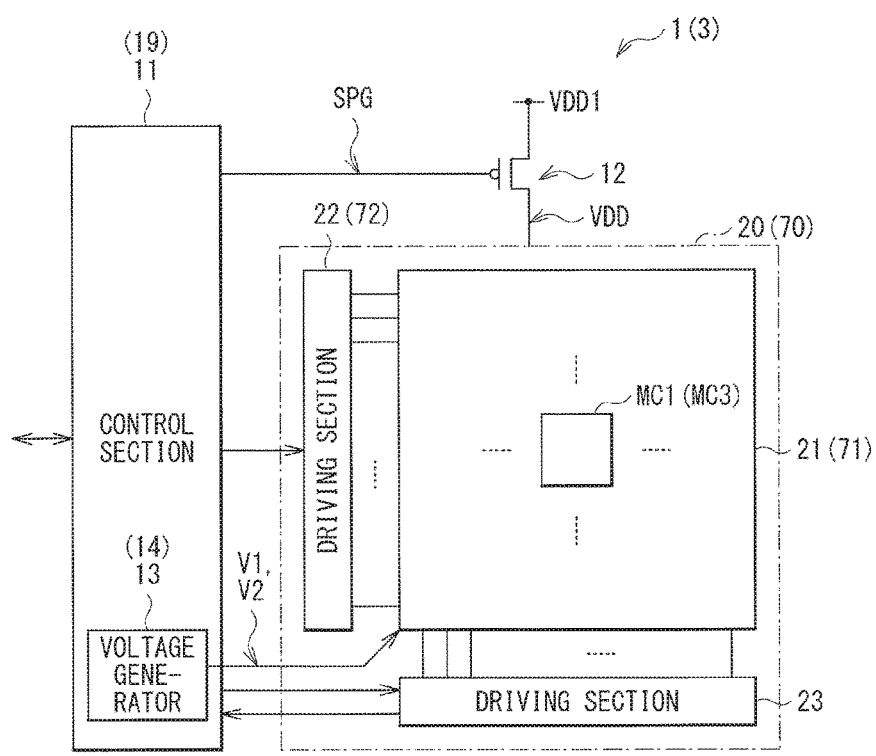

[FIG. 2]
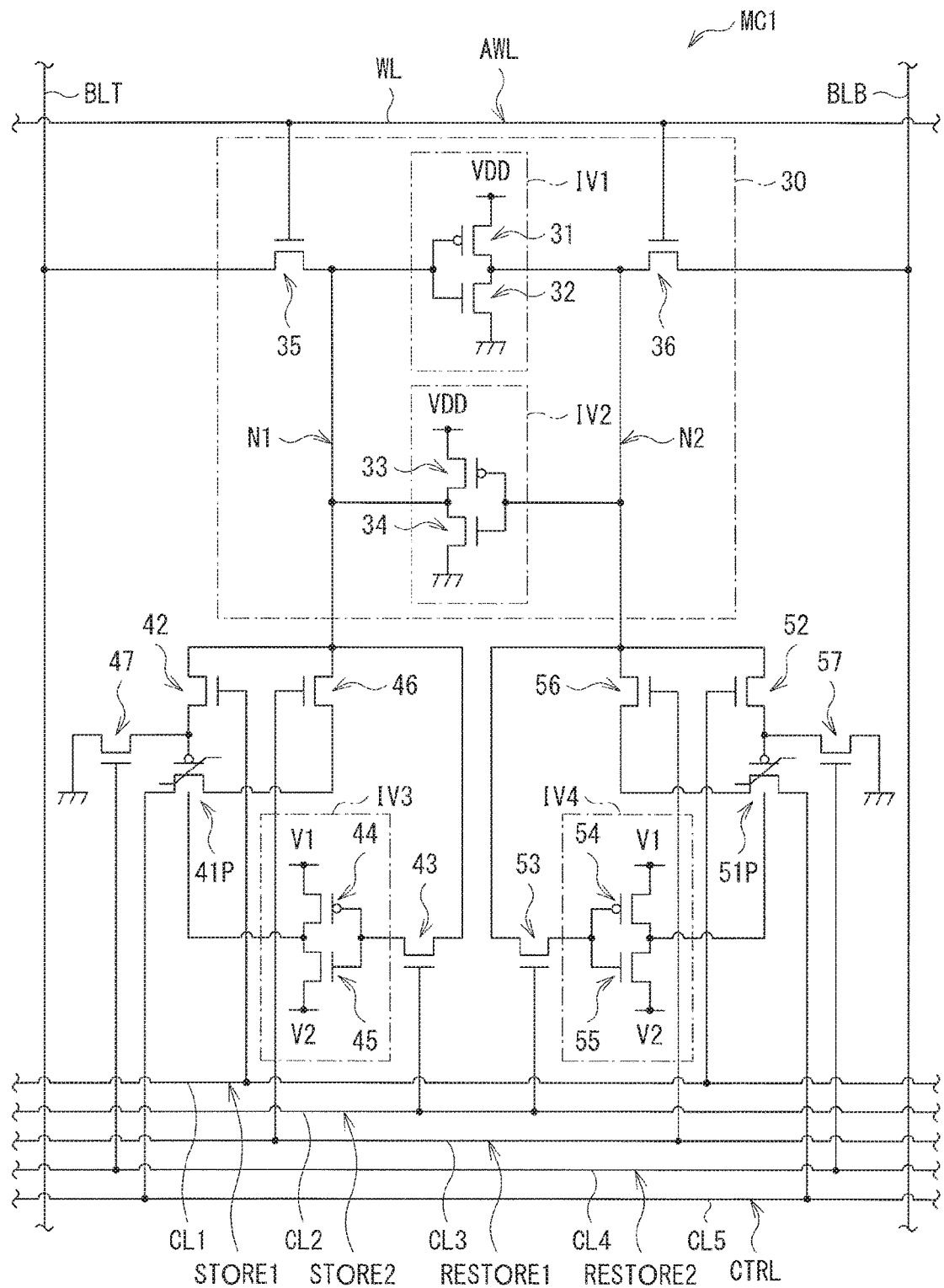

[FIG. 3]
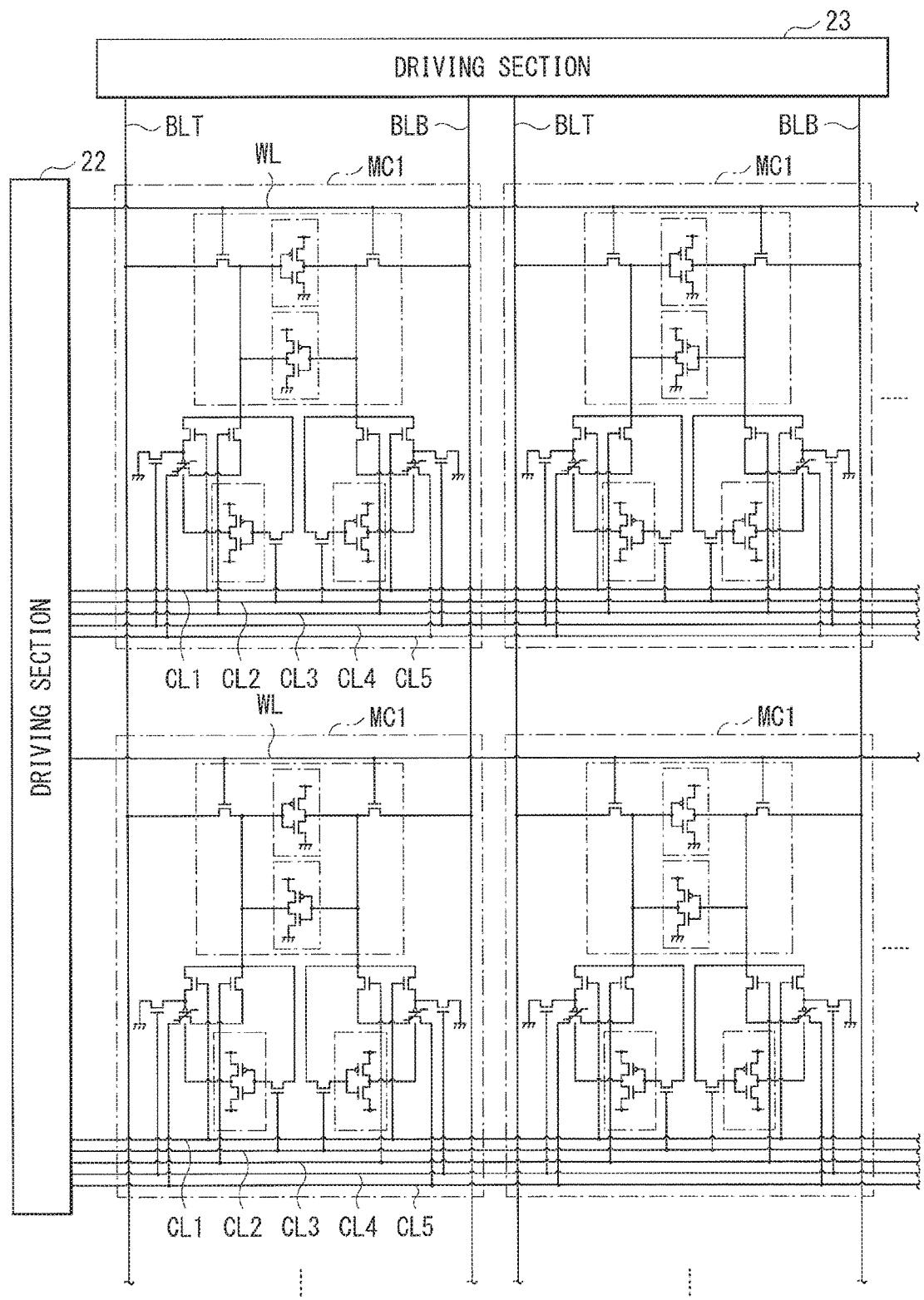

[ FIG. 4 ]
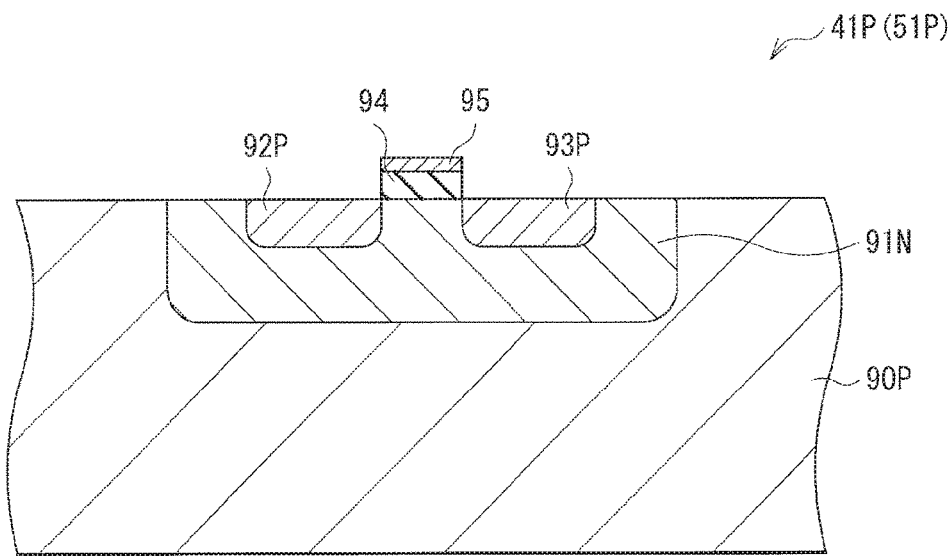
[ FIG. 5 ]
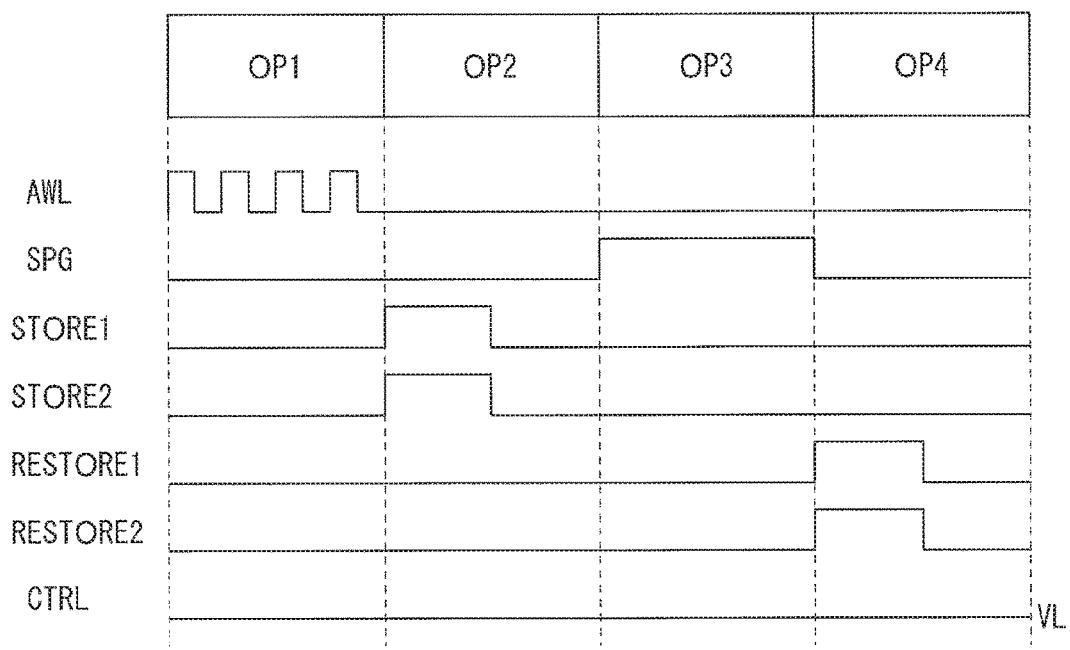

[FIG. 6A]
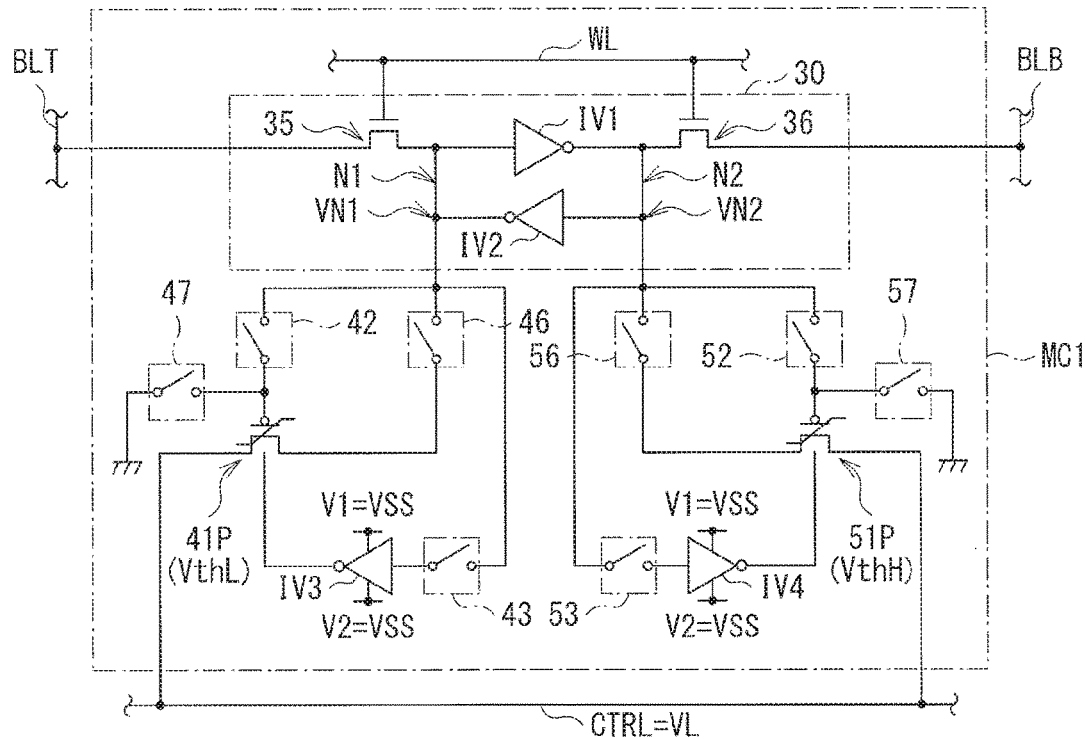
[FIG. 6B]
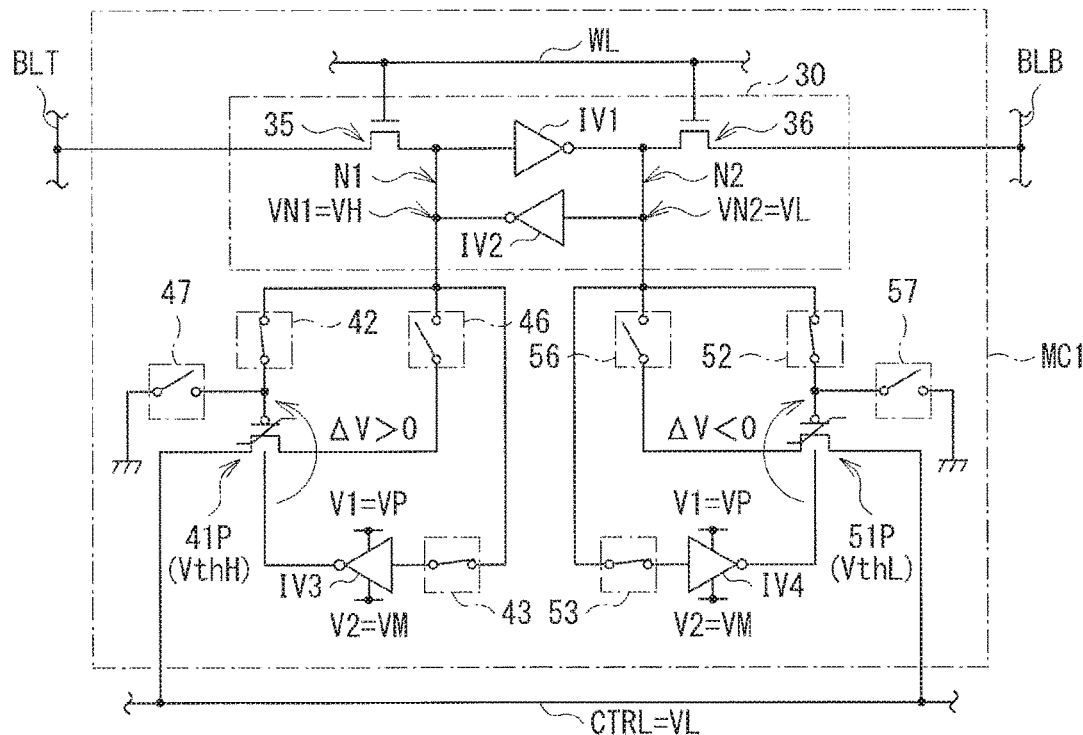

[FIG. 6C]
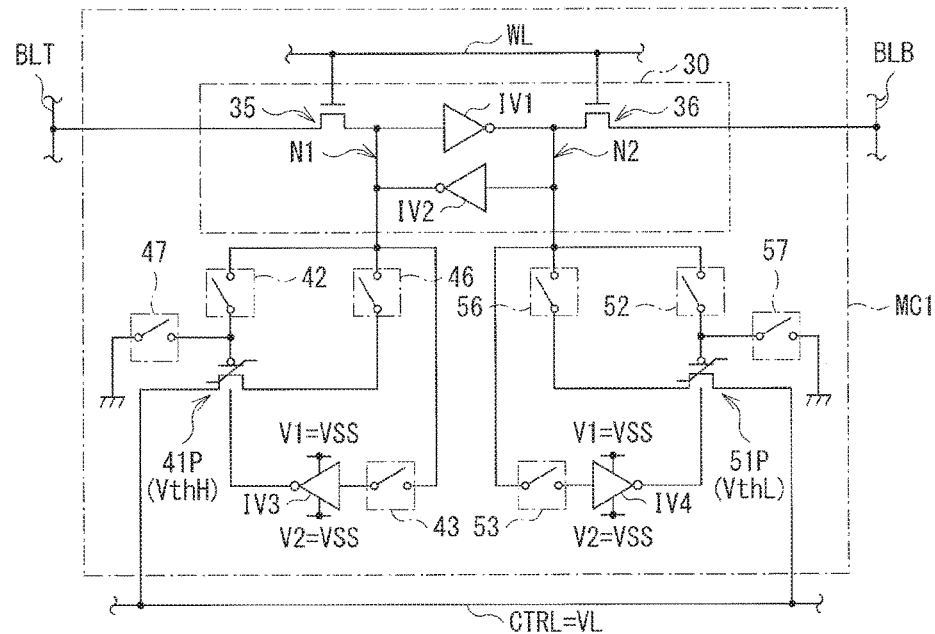
[FIG. 6D]
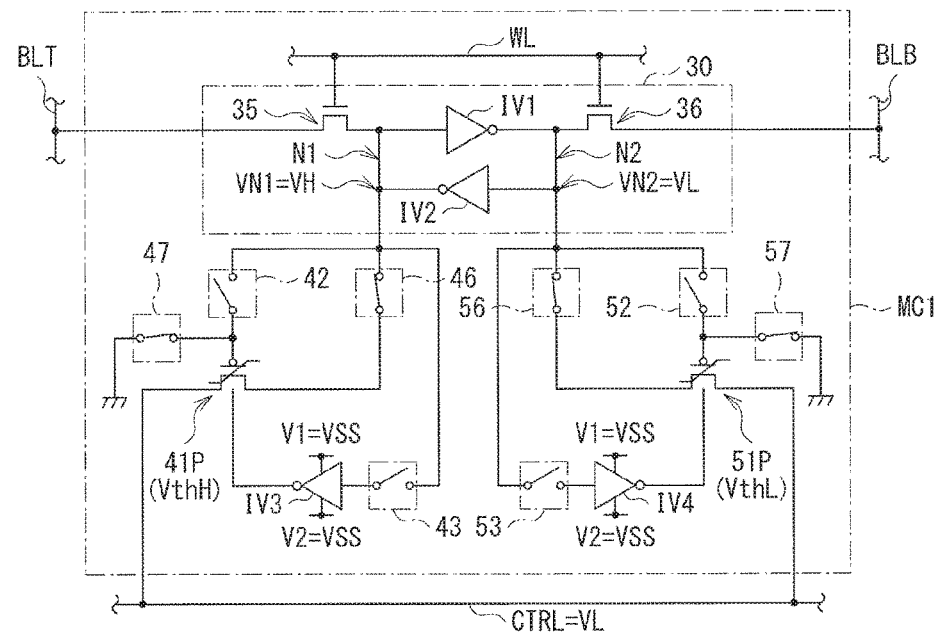

[FIG. 7]
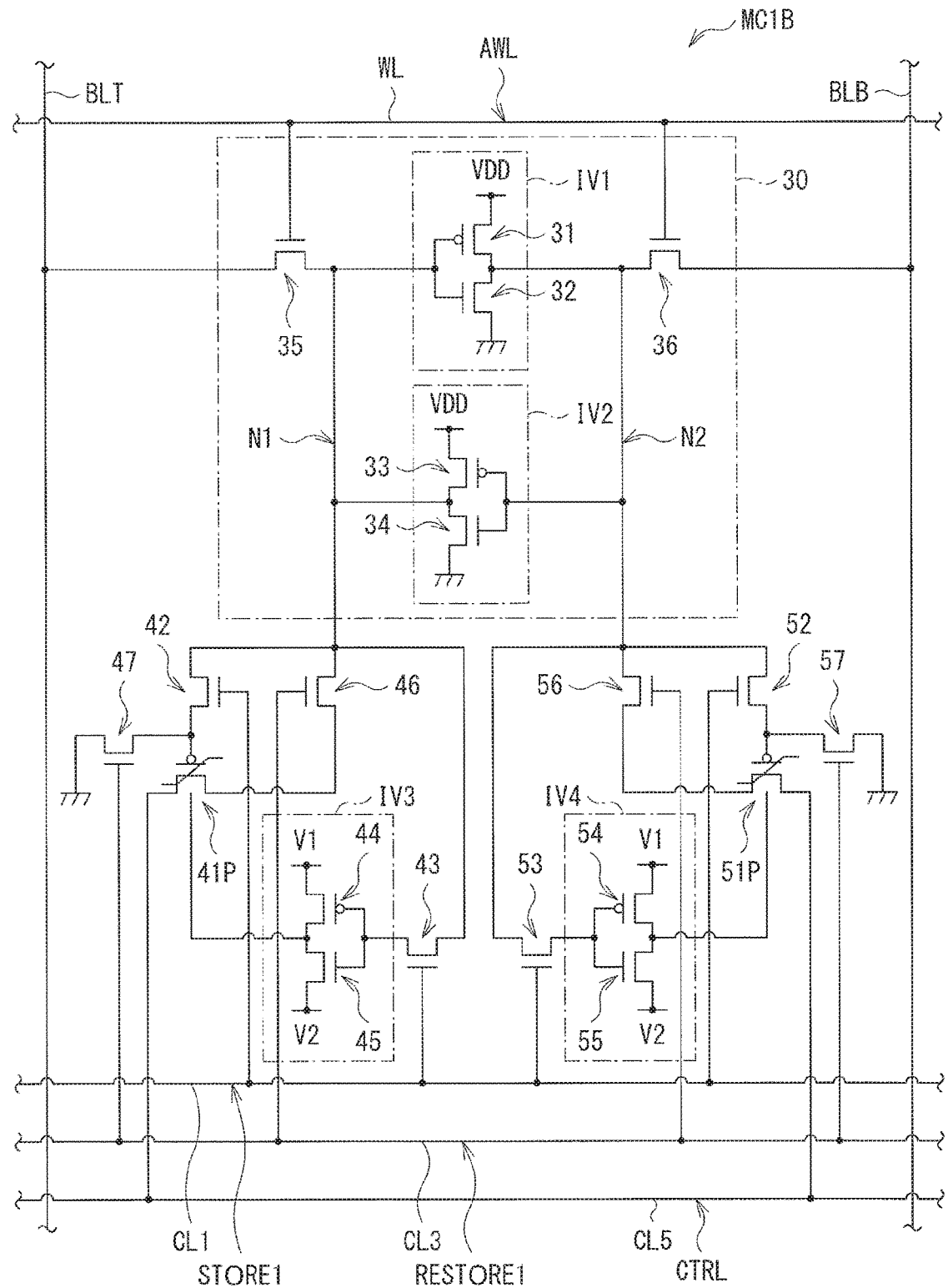

[ FIG. 8 ]
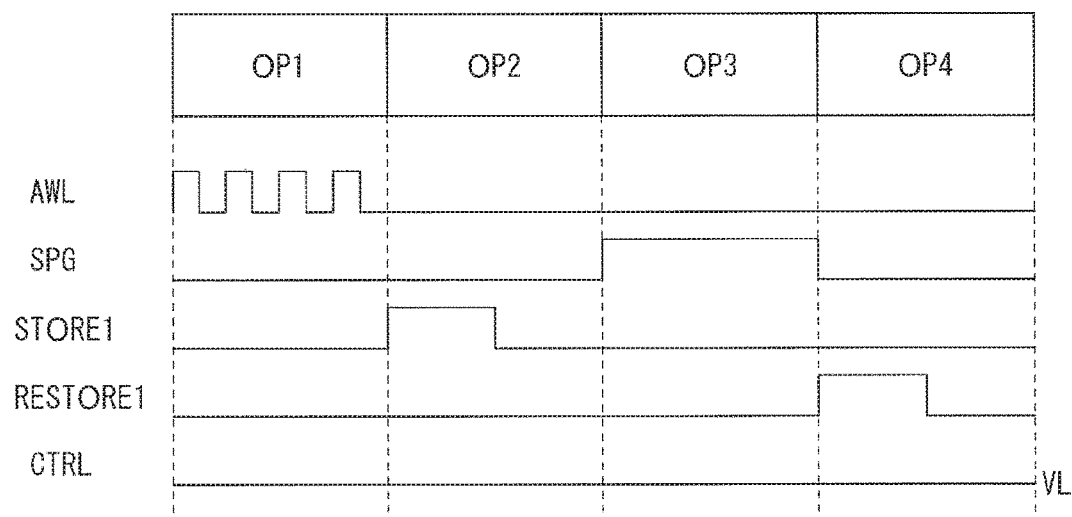

[FIG. 9]
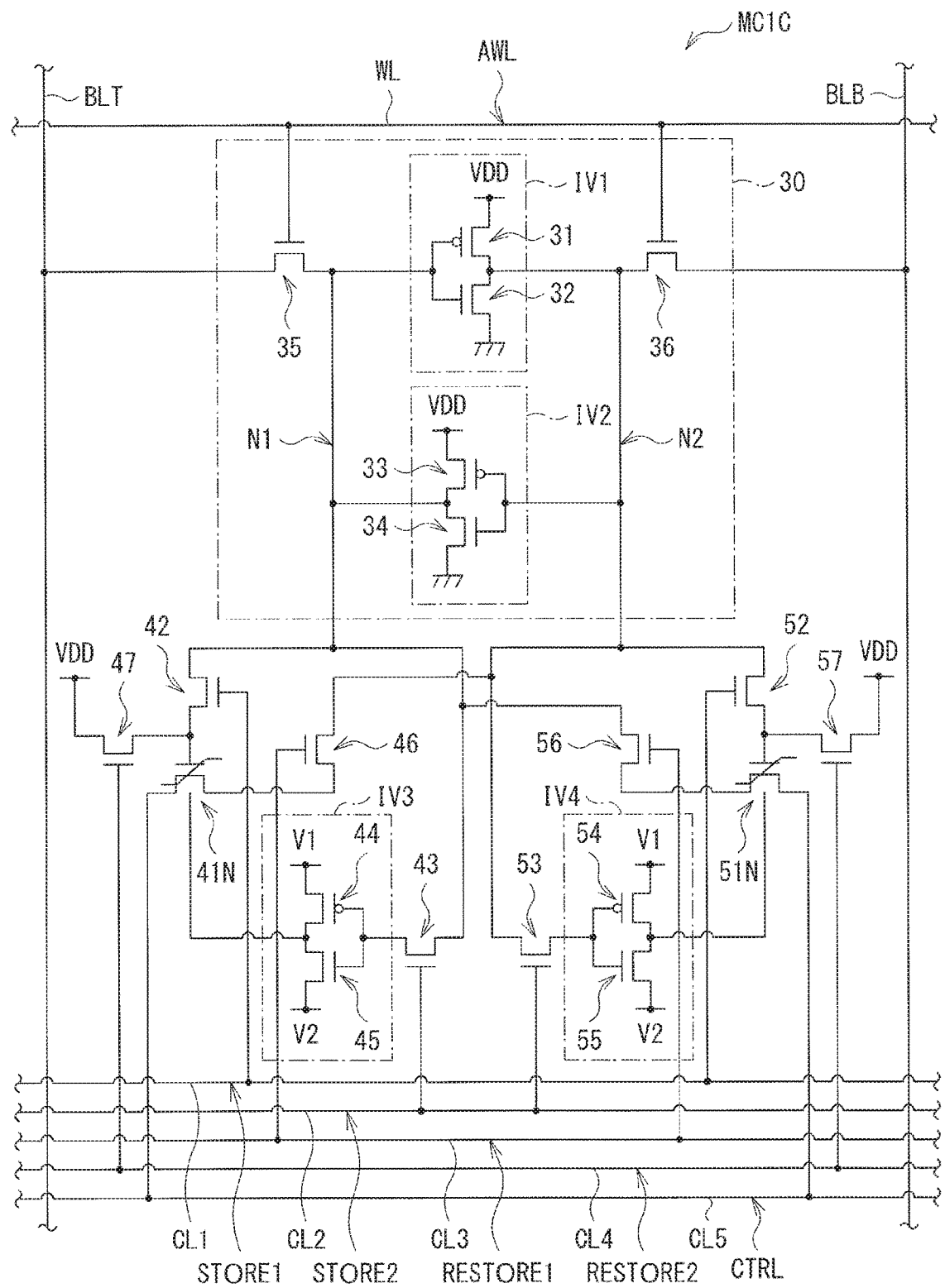

[ FIG. 10 ]
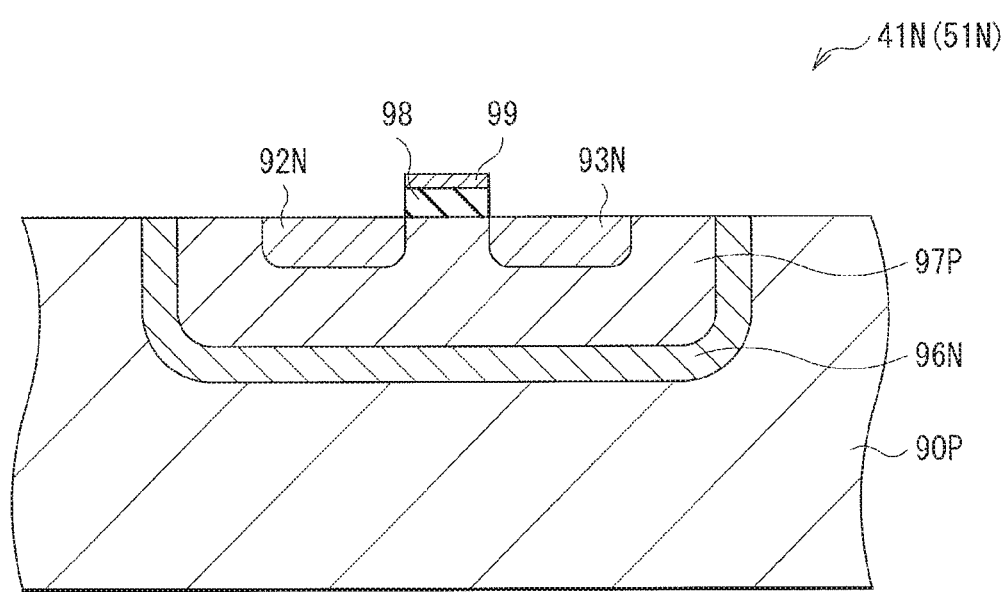

[ FIG. 11A ]
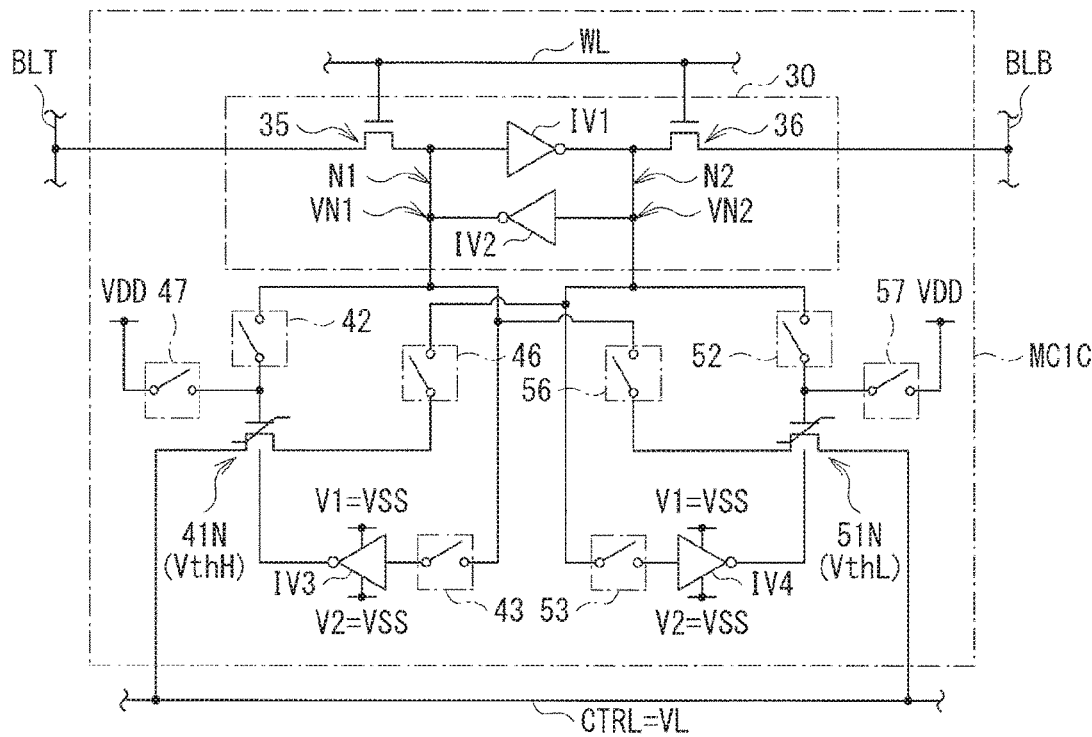
[ FIG. 11B ]
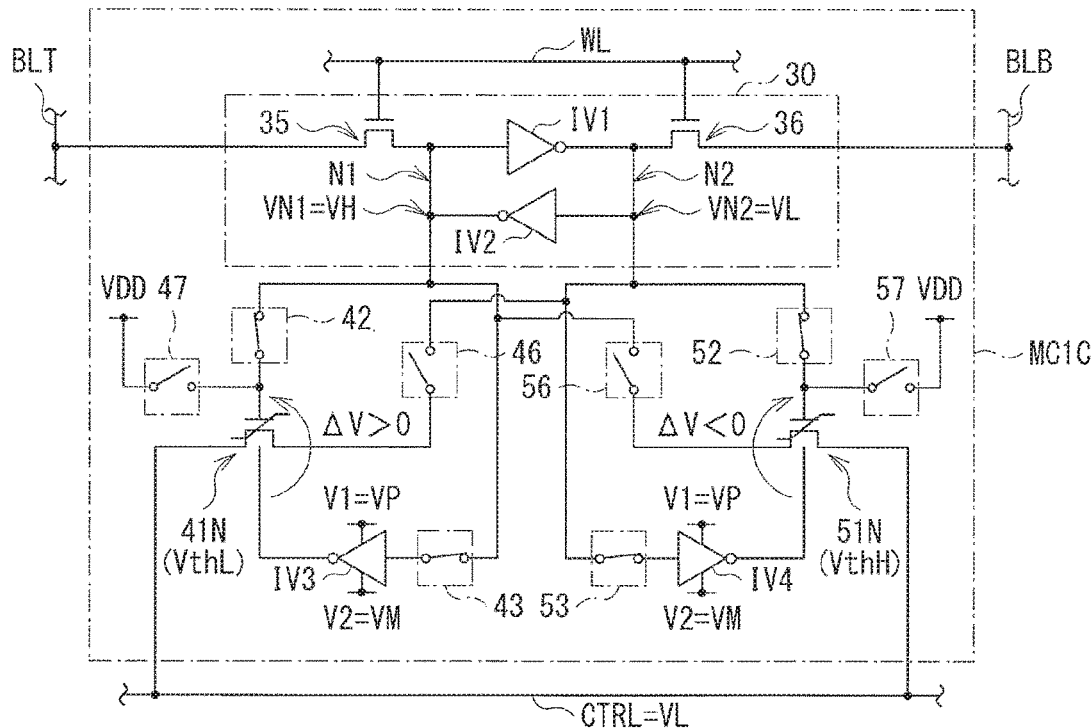

[ FIG. 11C ]
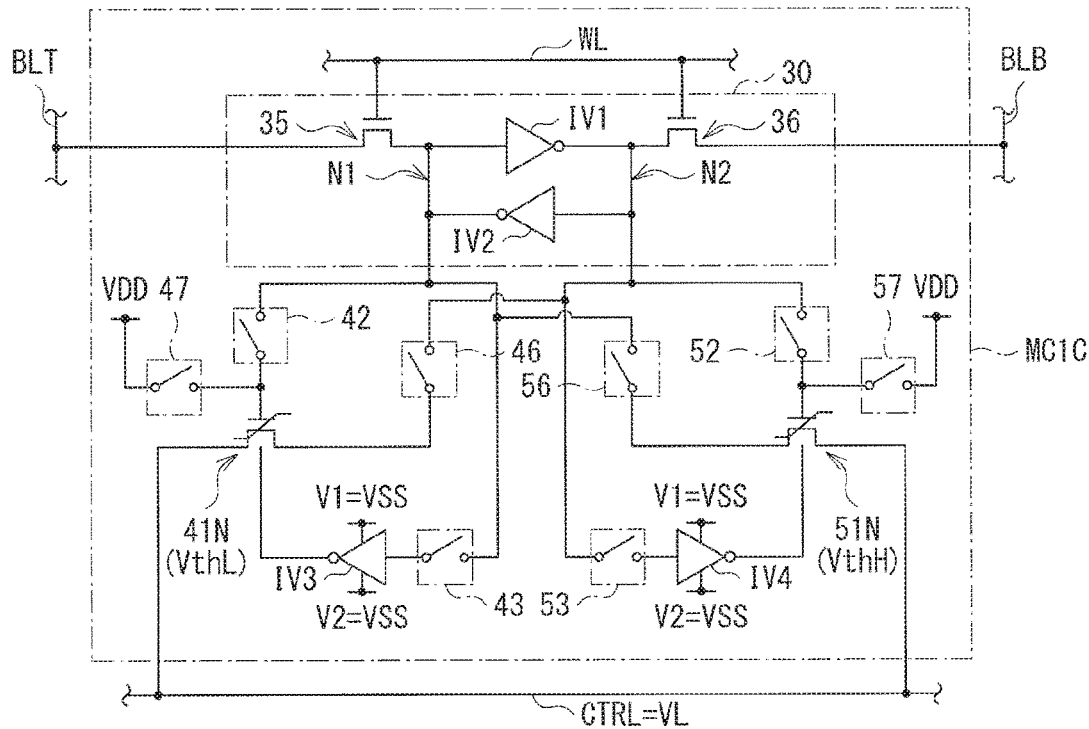
[ FIG. 11D ]
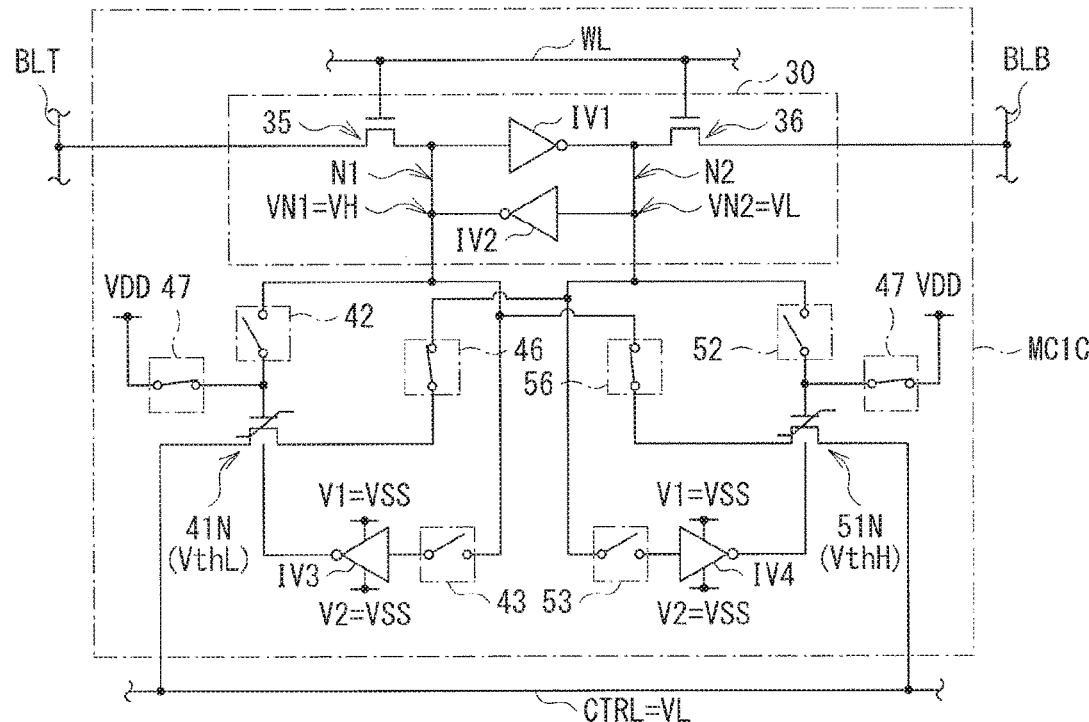

[FIG. 12]
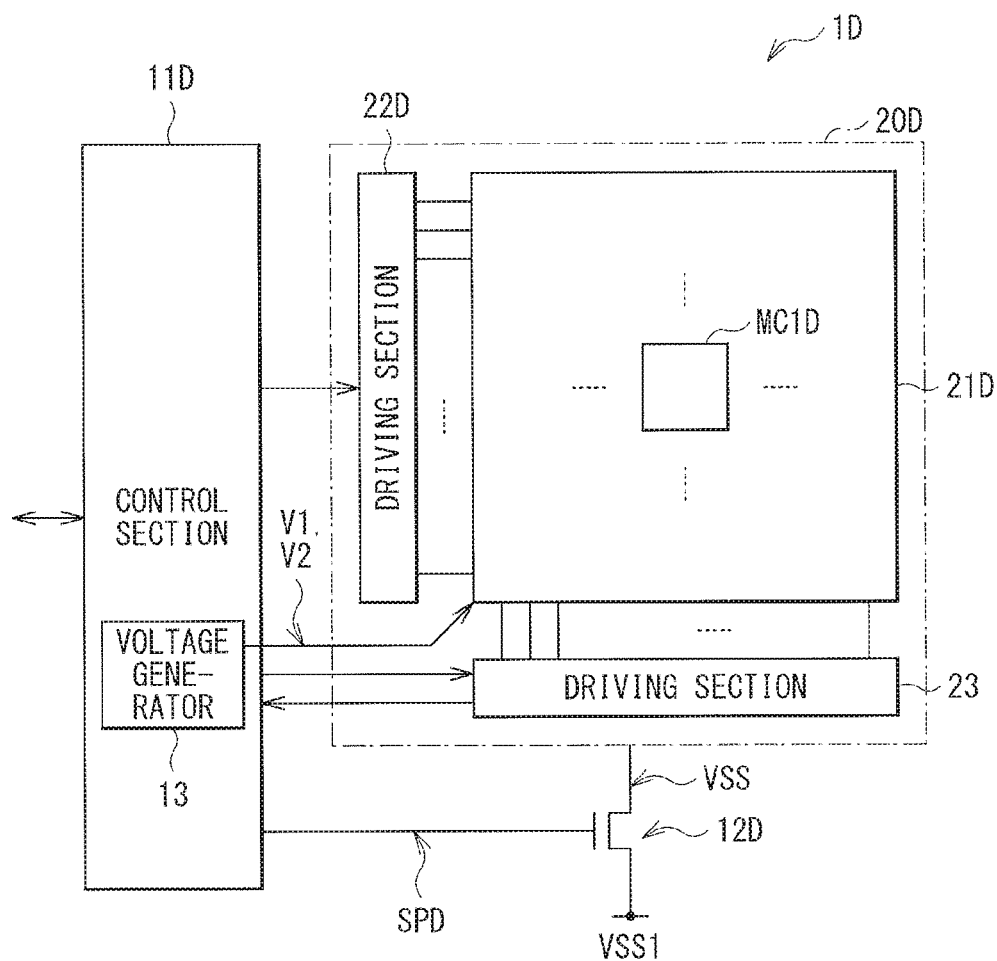

[FIG. 13]
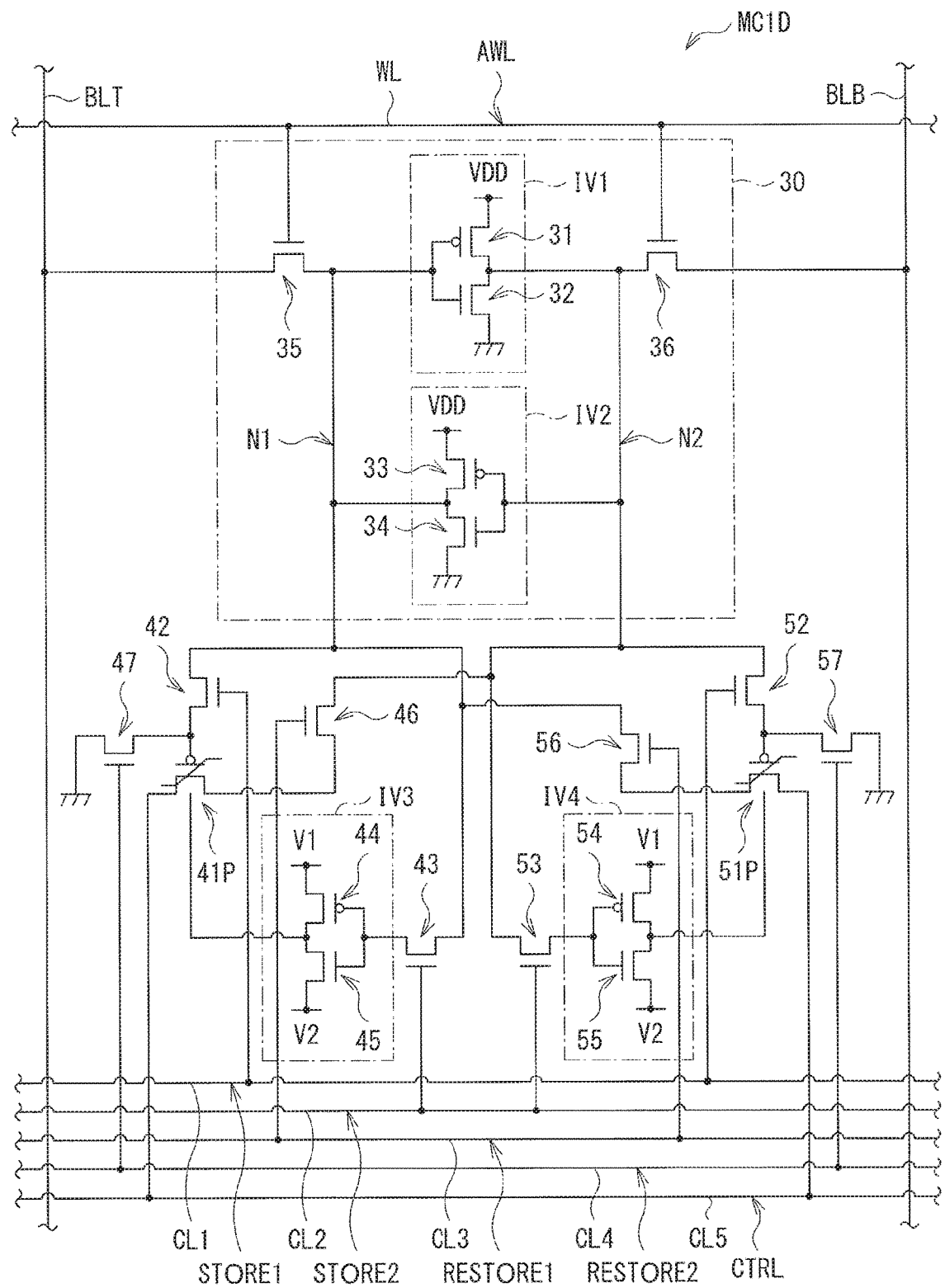

[ FIG. 14 ]
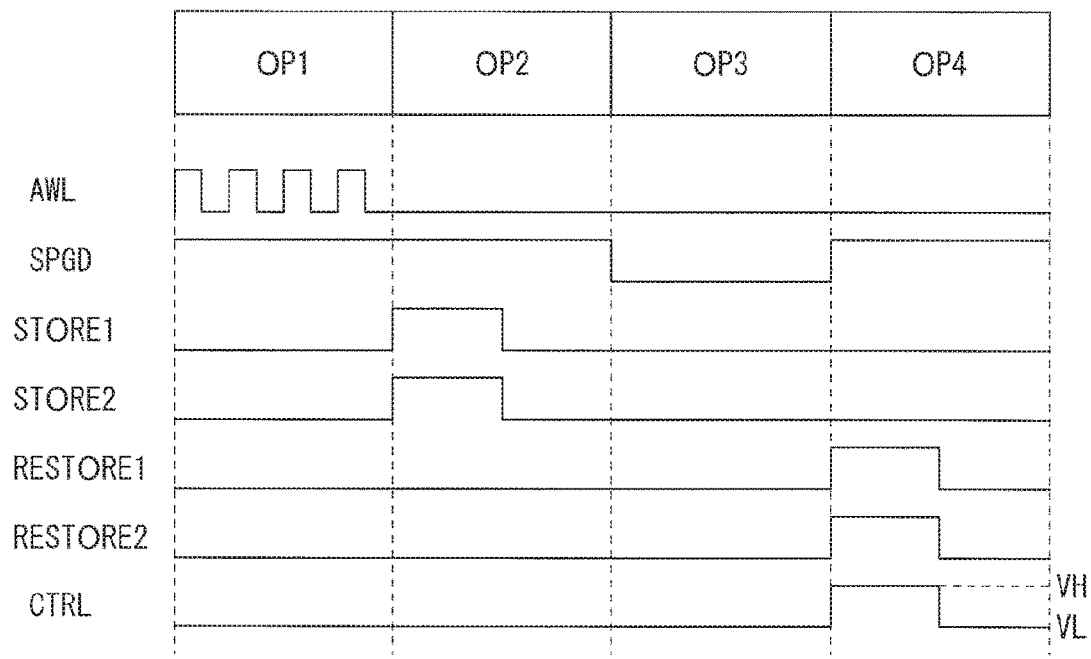

[ FIG. 15 ]
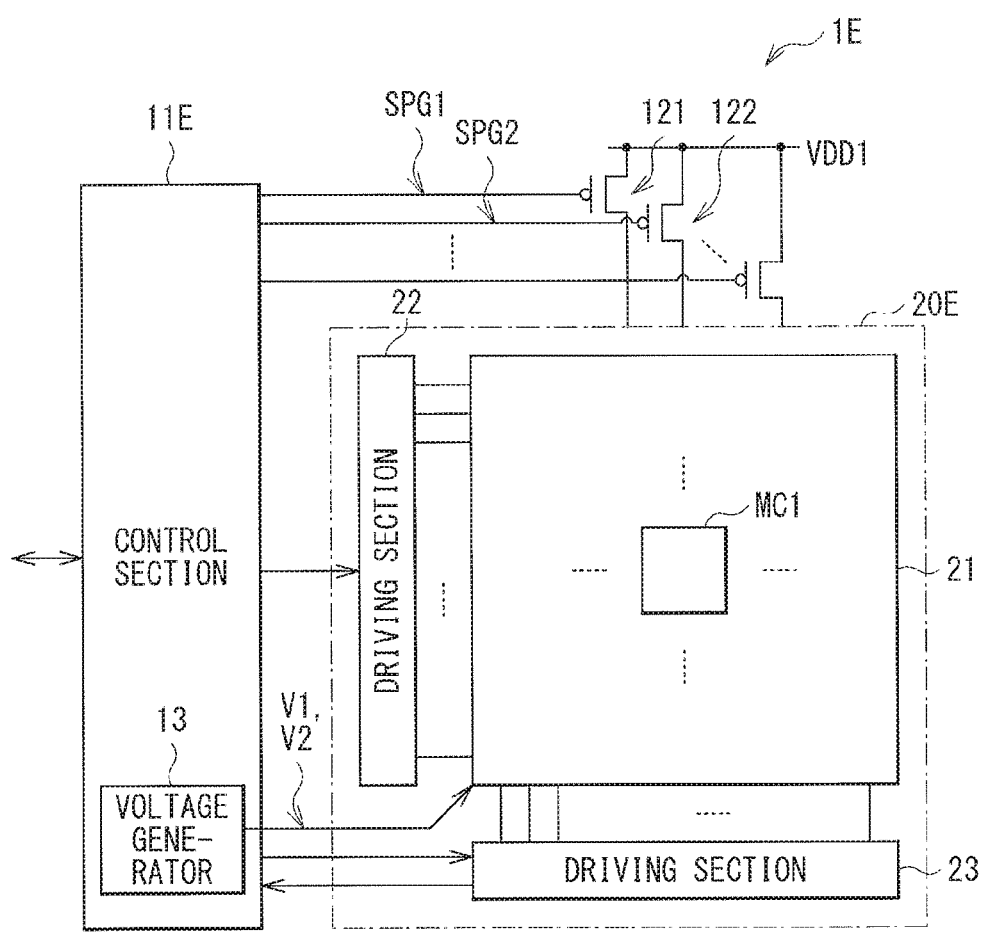

[ FIG. 16 ]
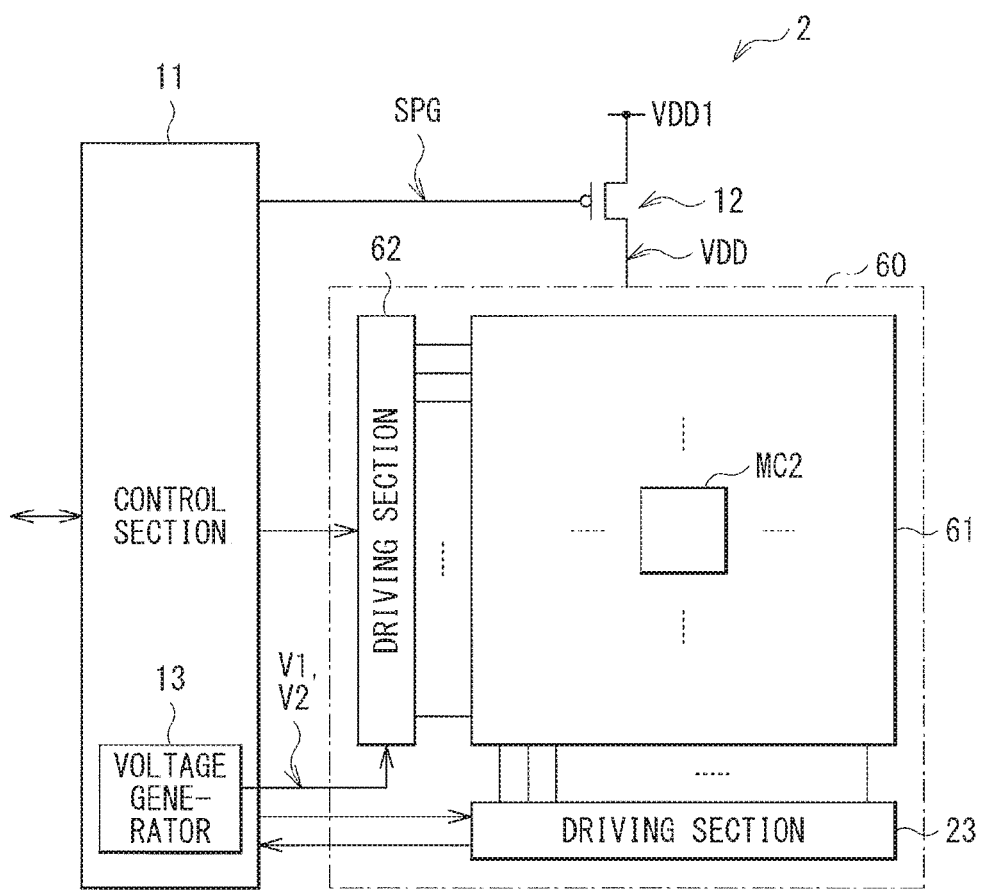

[ FIG. 17 ]
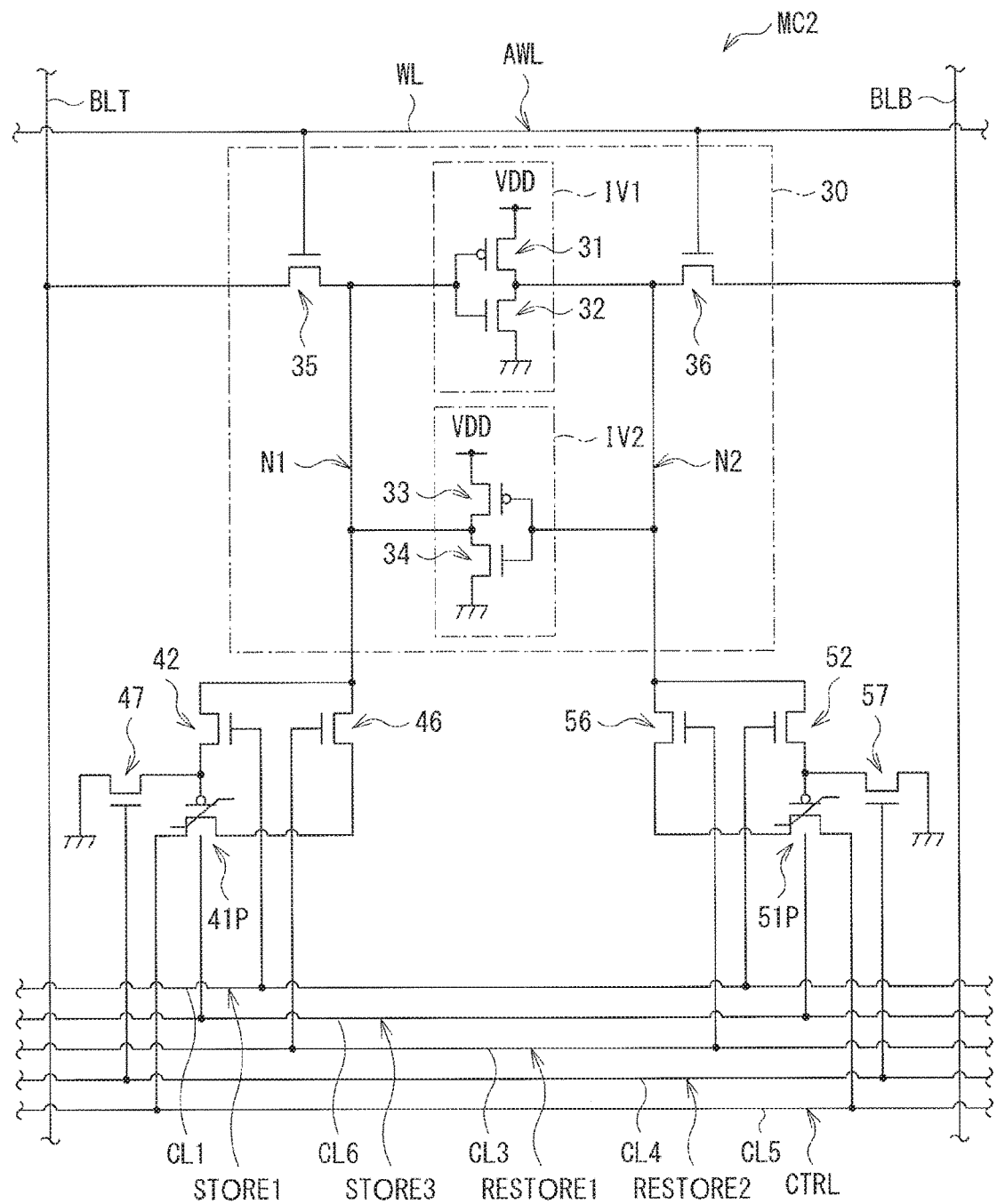

[FIG. 18]
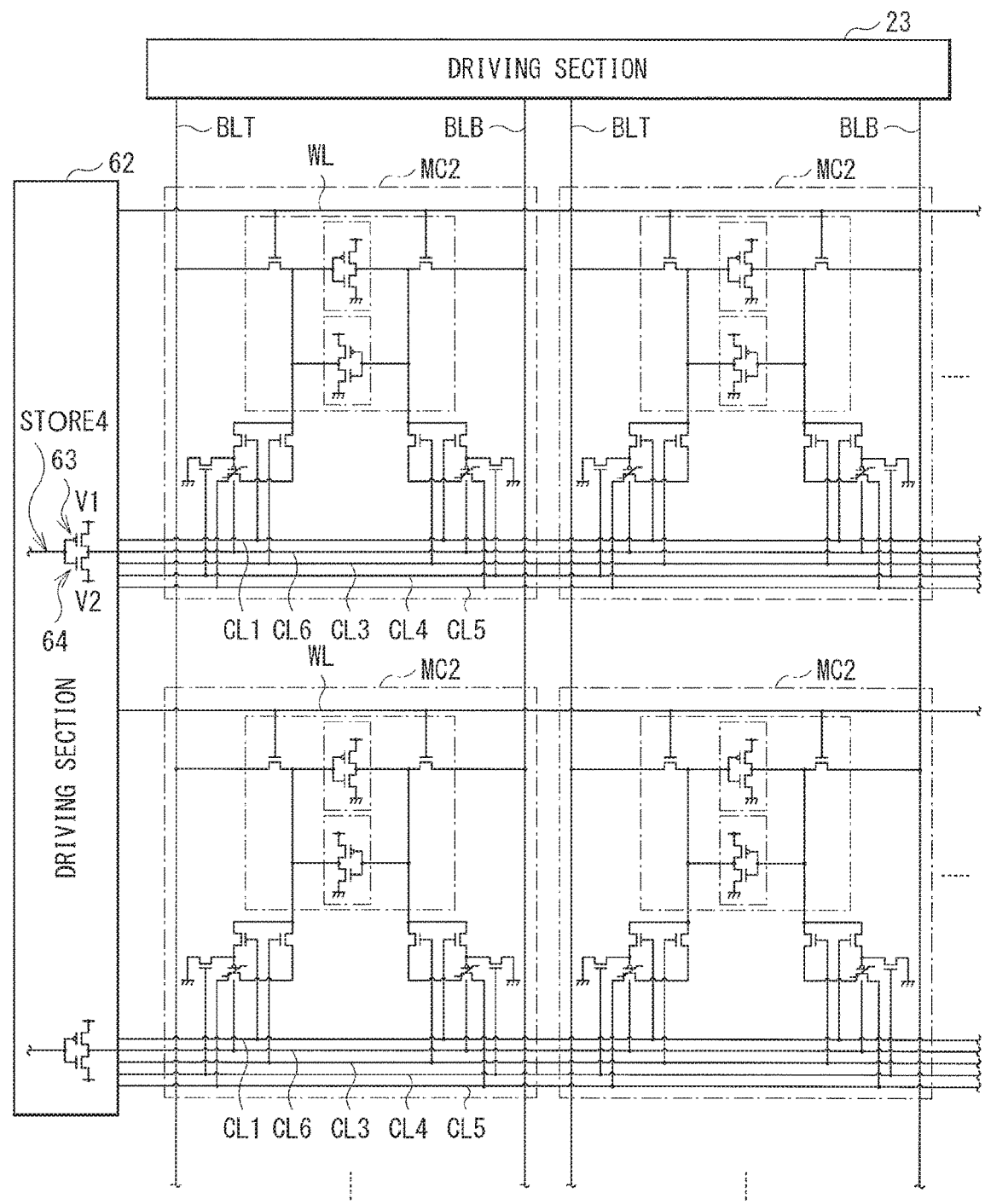

[ FIG. 19 ]
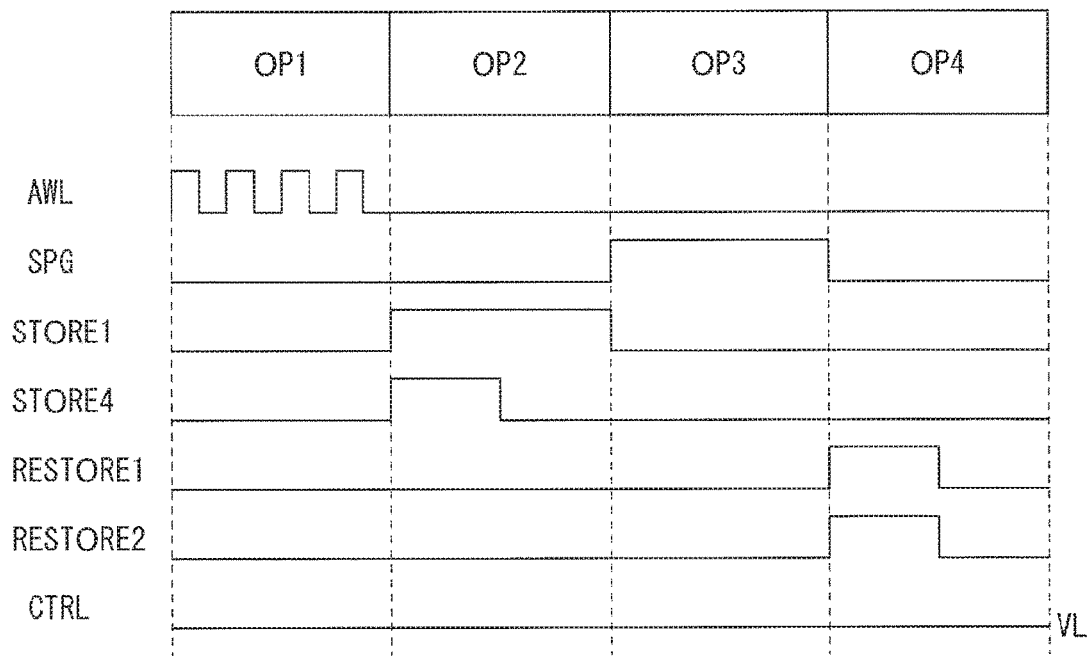
[ FIG. 20A ]
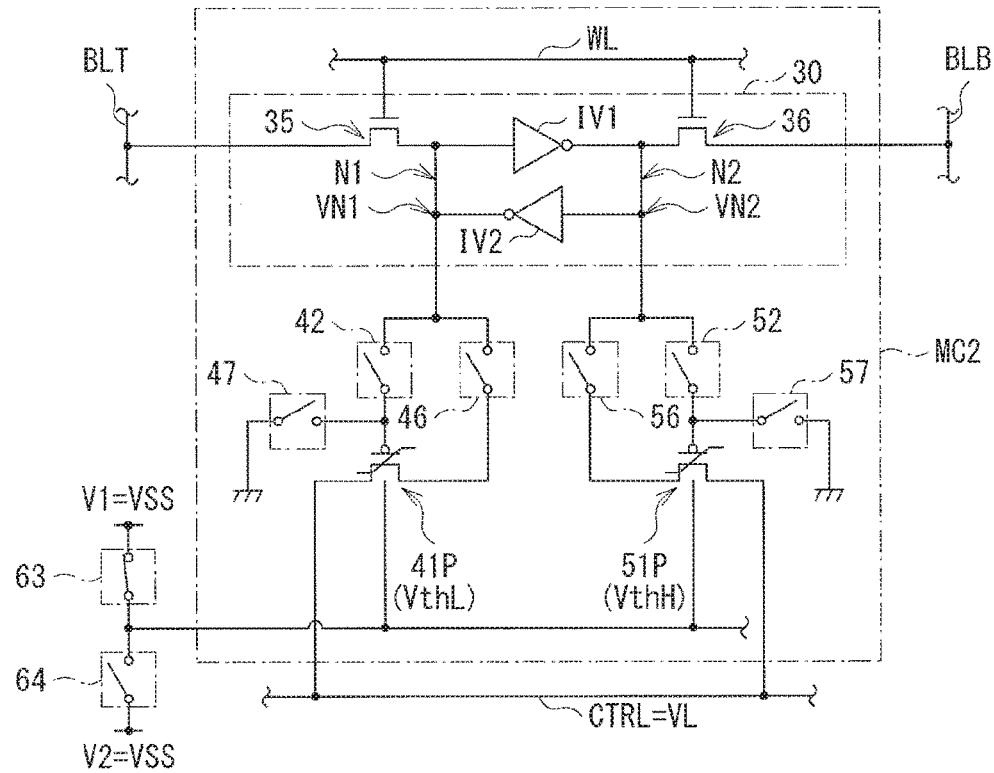

[FIG. 20B]
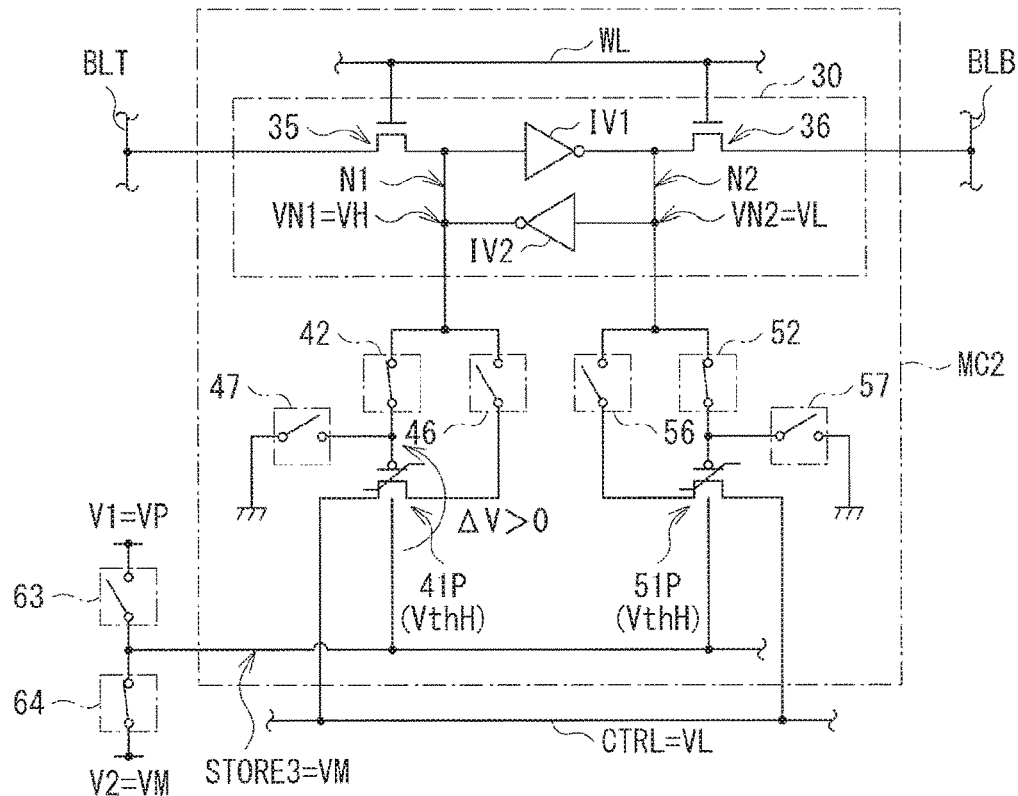
[FIG. 20B]
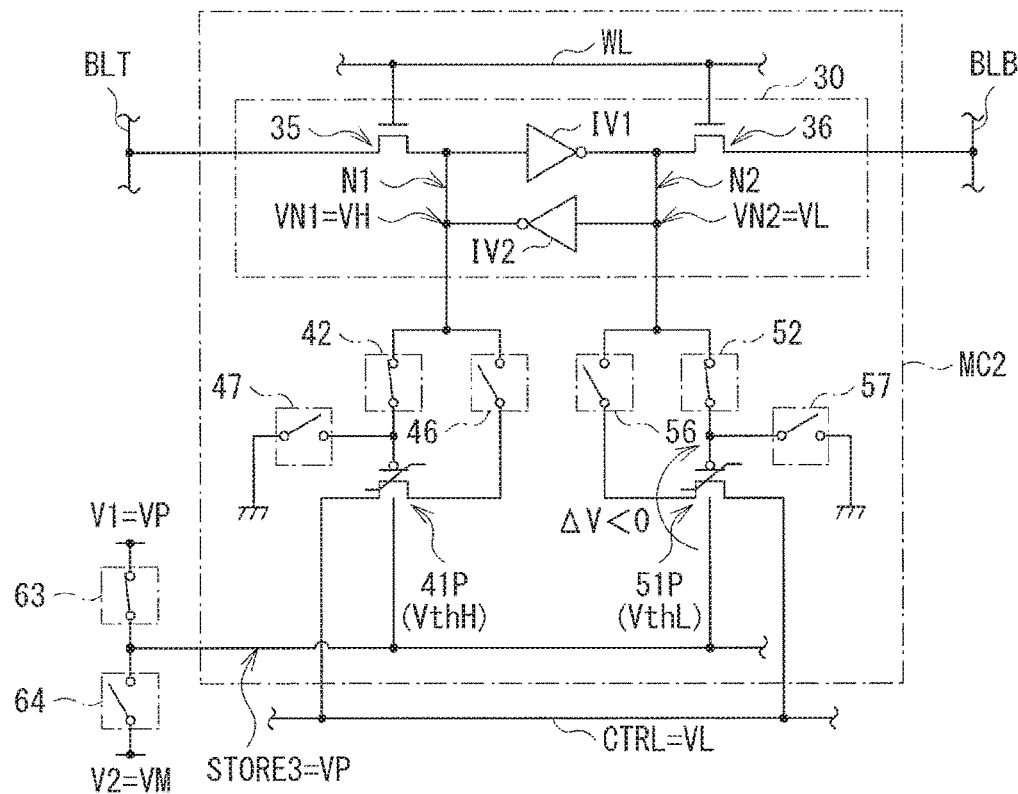

[ FIG. 20D ]
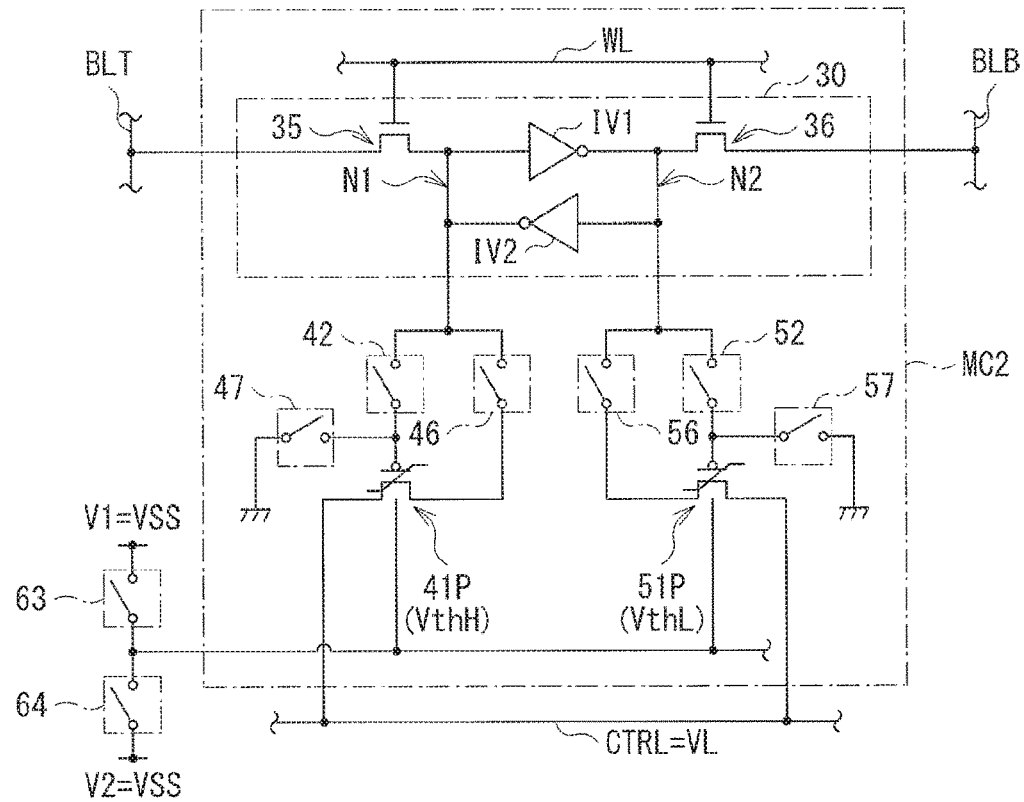
[ FIG. 20E ]
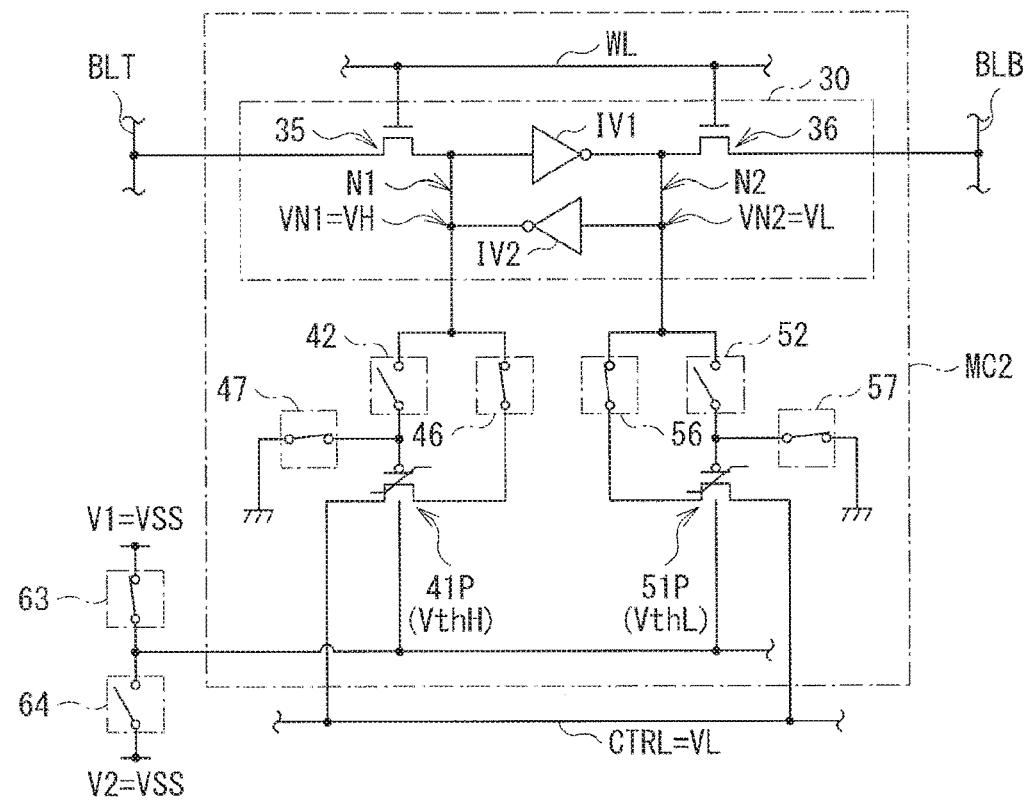

[FIG. 21]
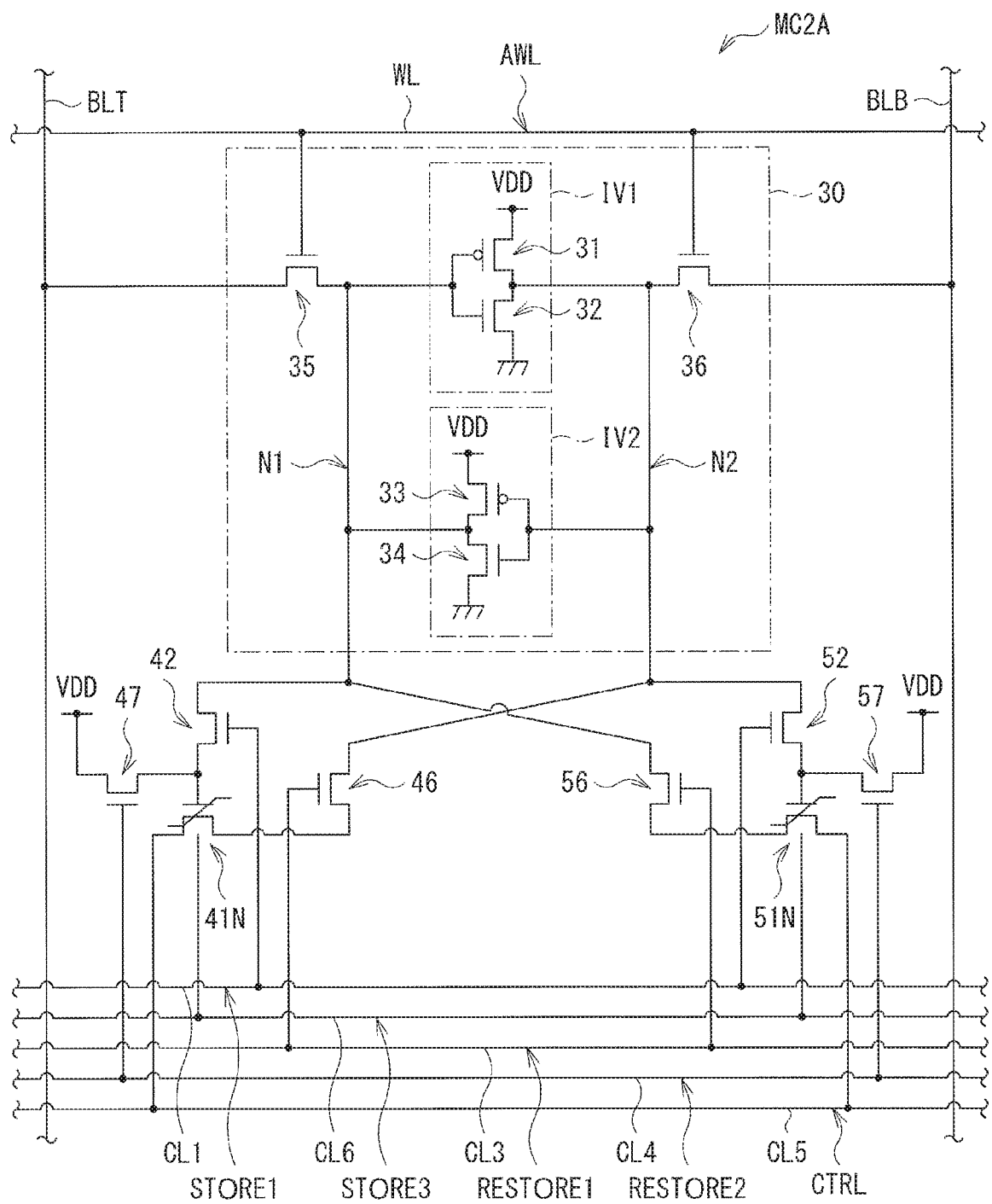

[FIG. 22A]
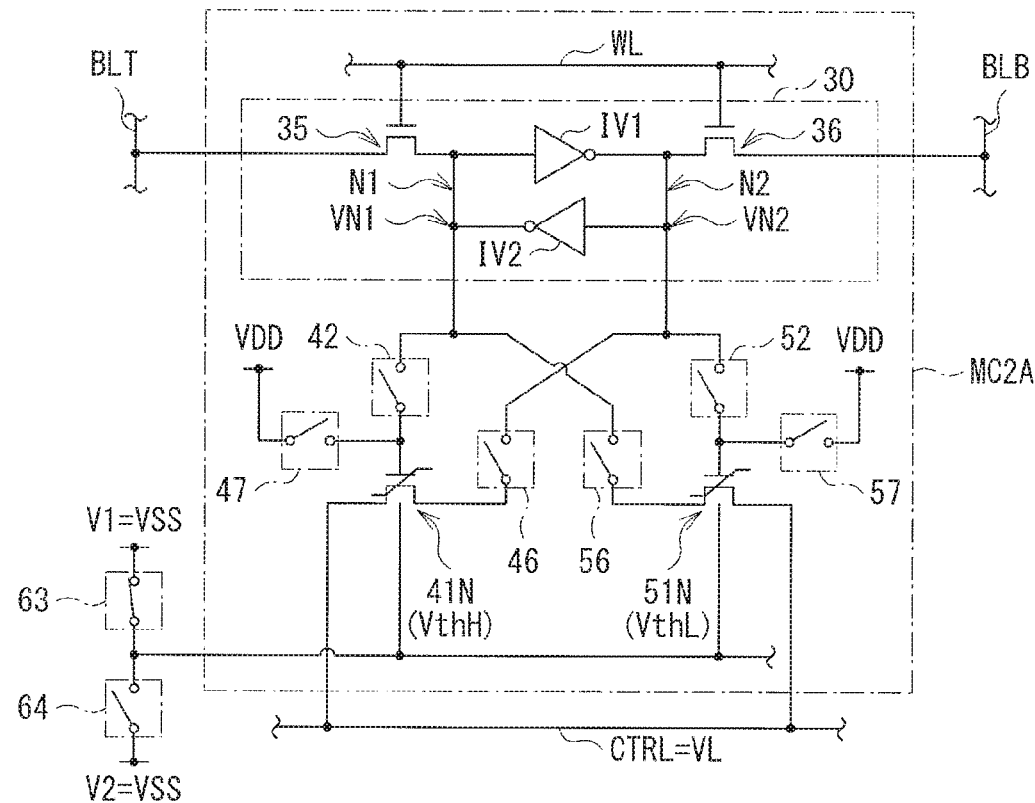
[FIG. 22B]
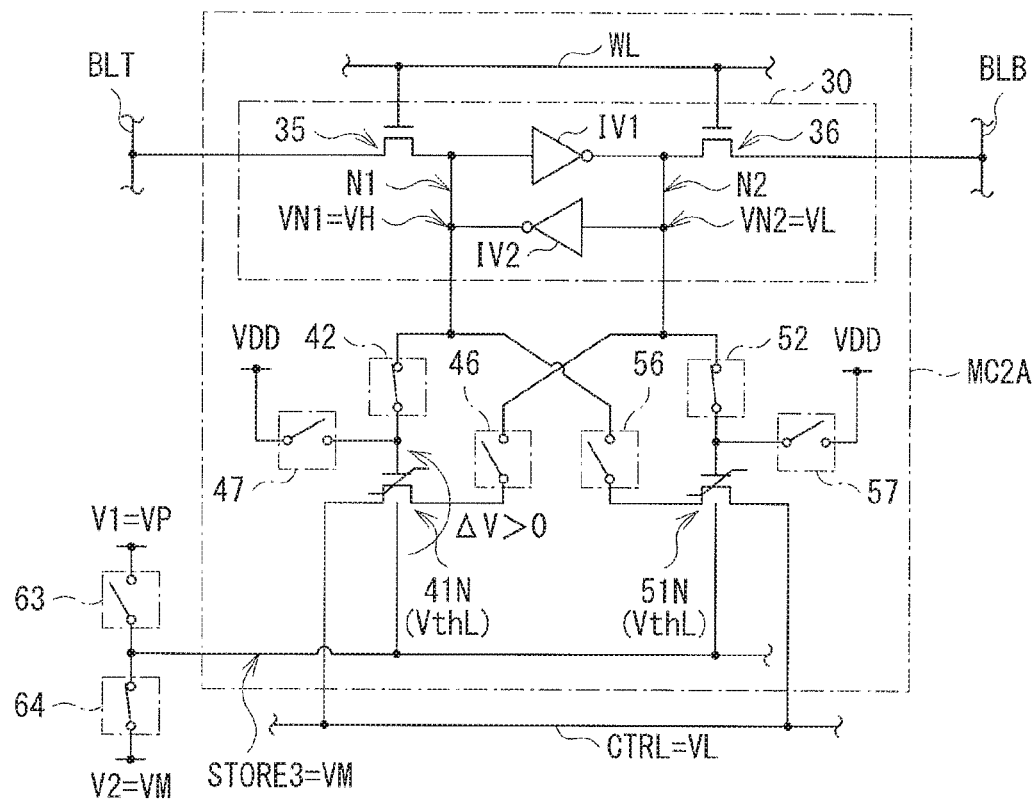

[FIG. 22C]
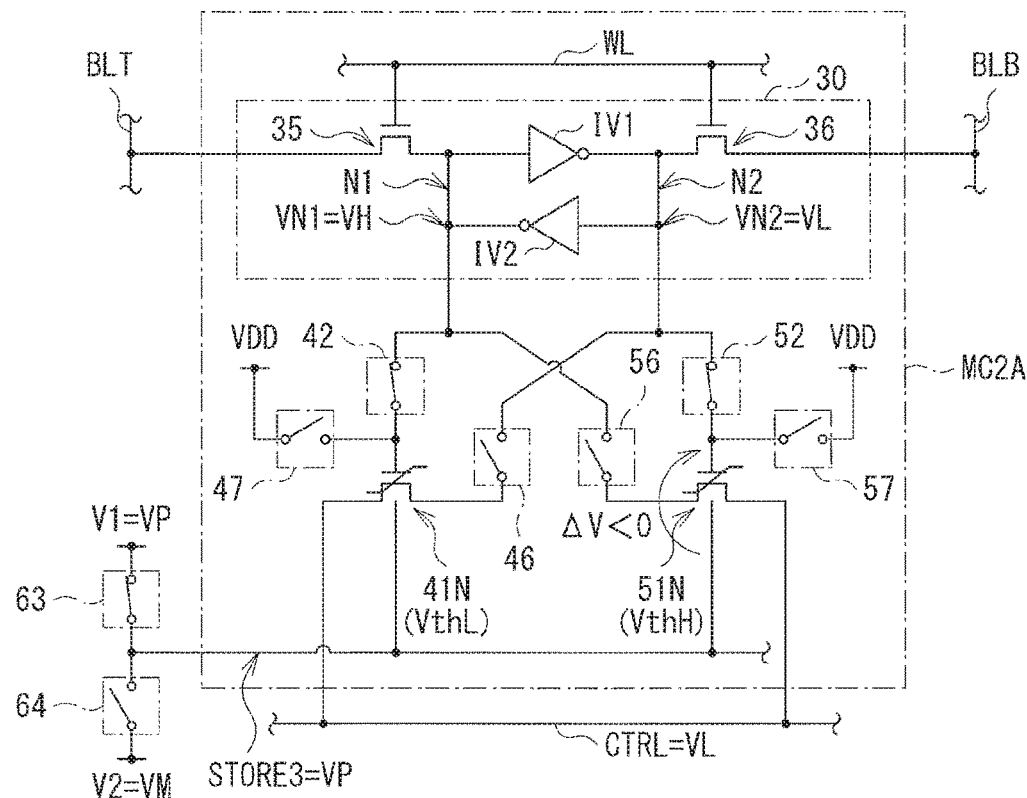
[FIG. 22D]
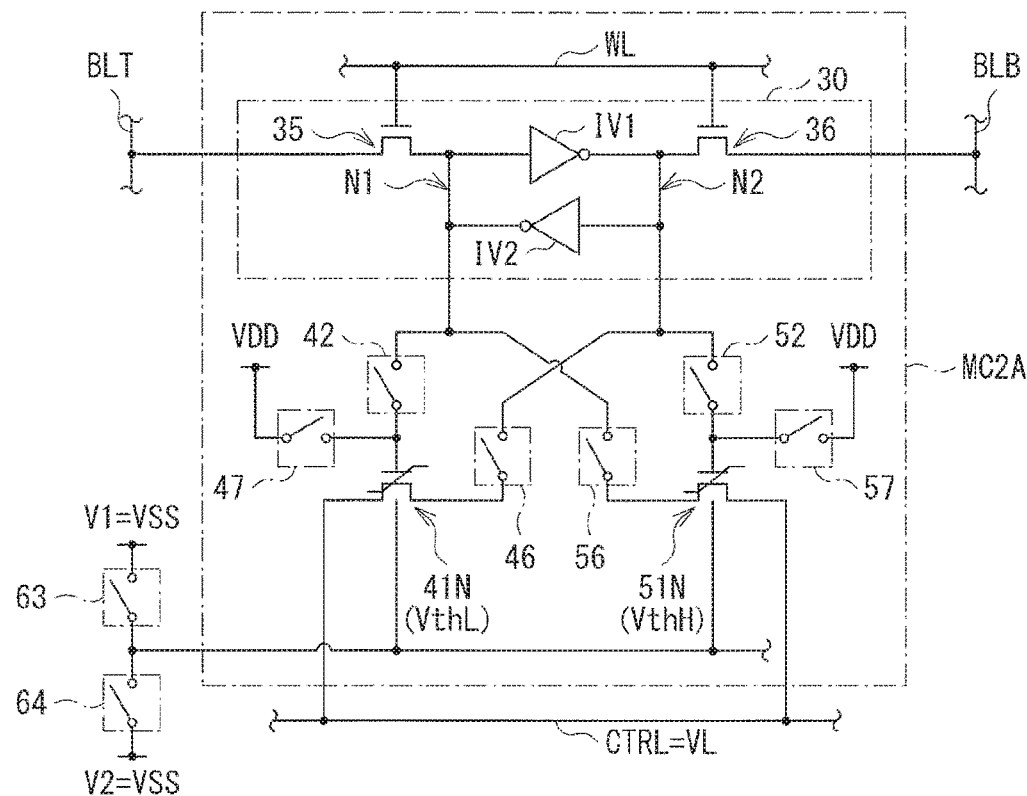

[FIG. 22E]
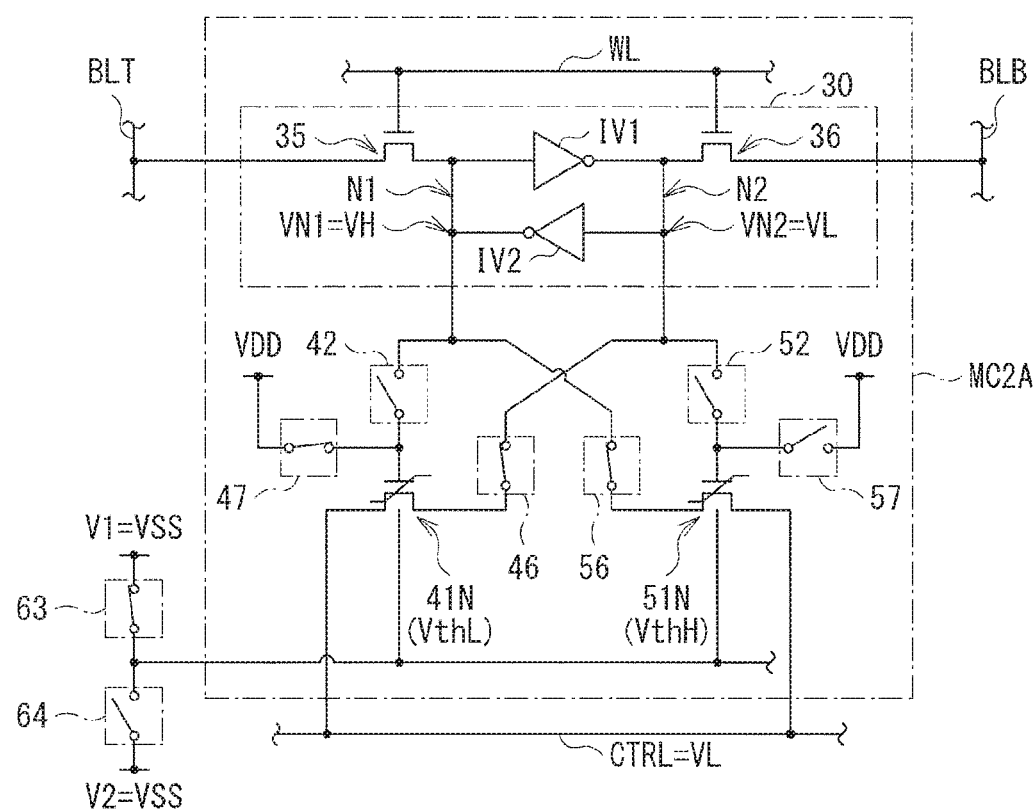

[FIG. 23]
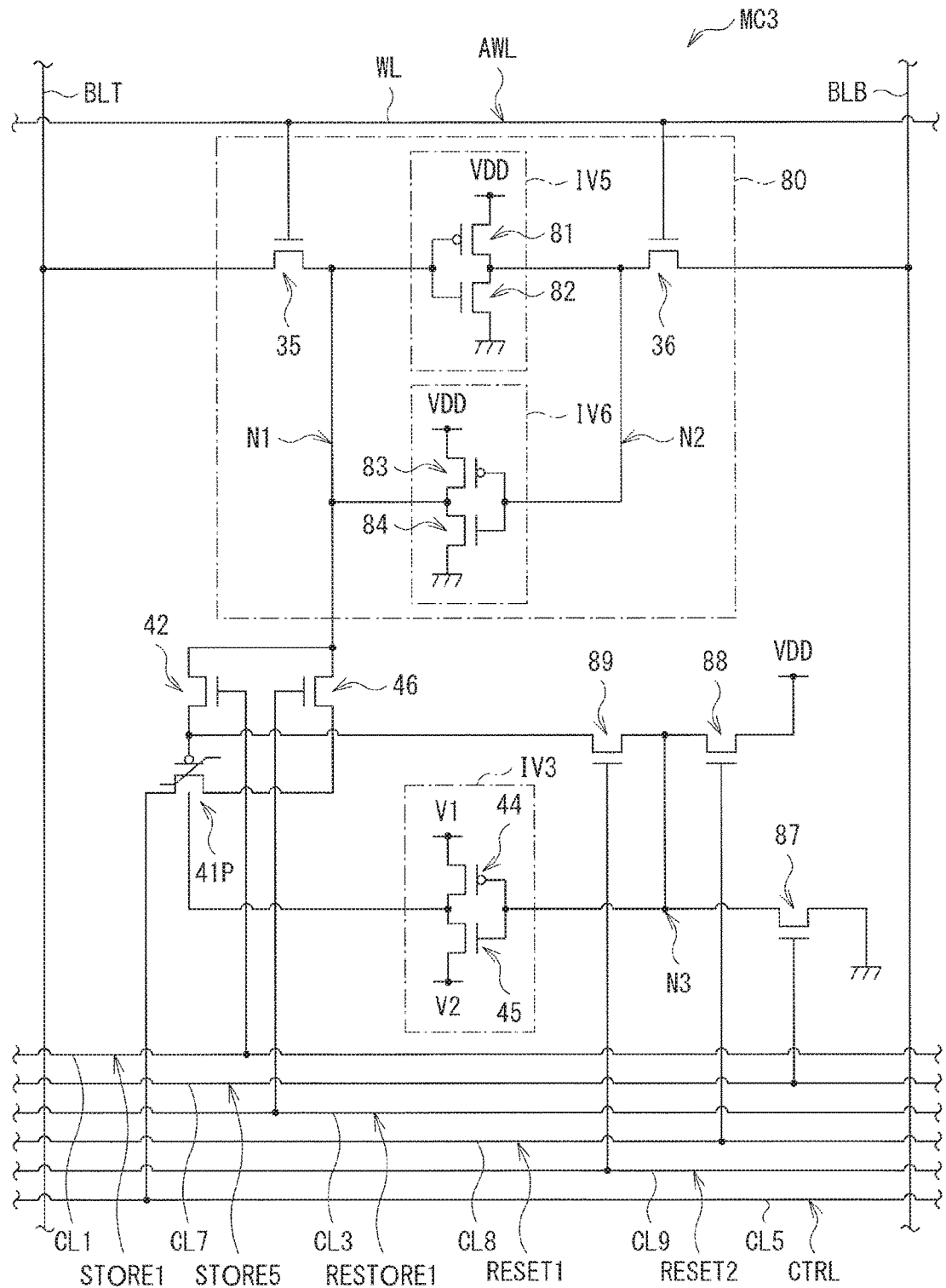

[FIG. 24]
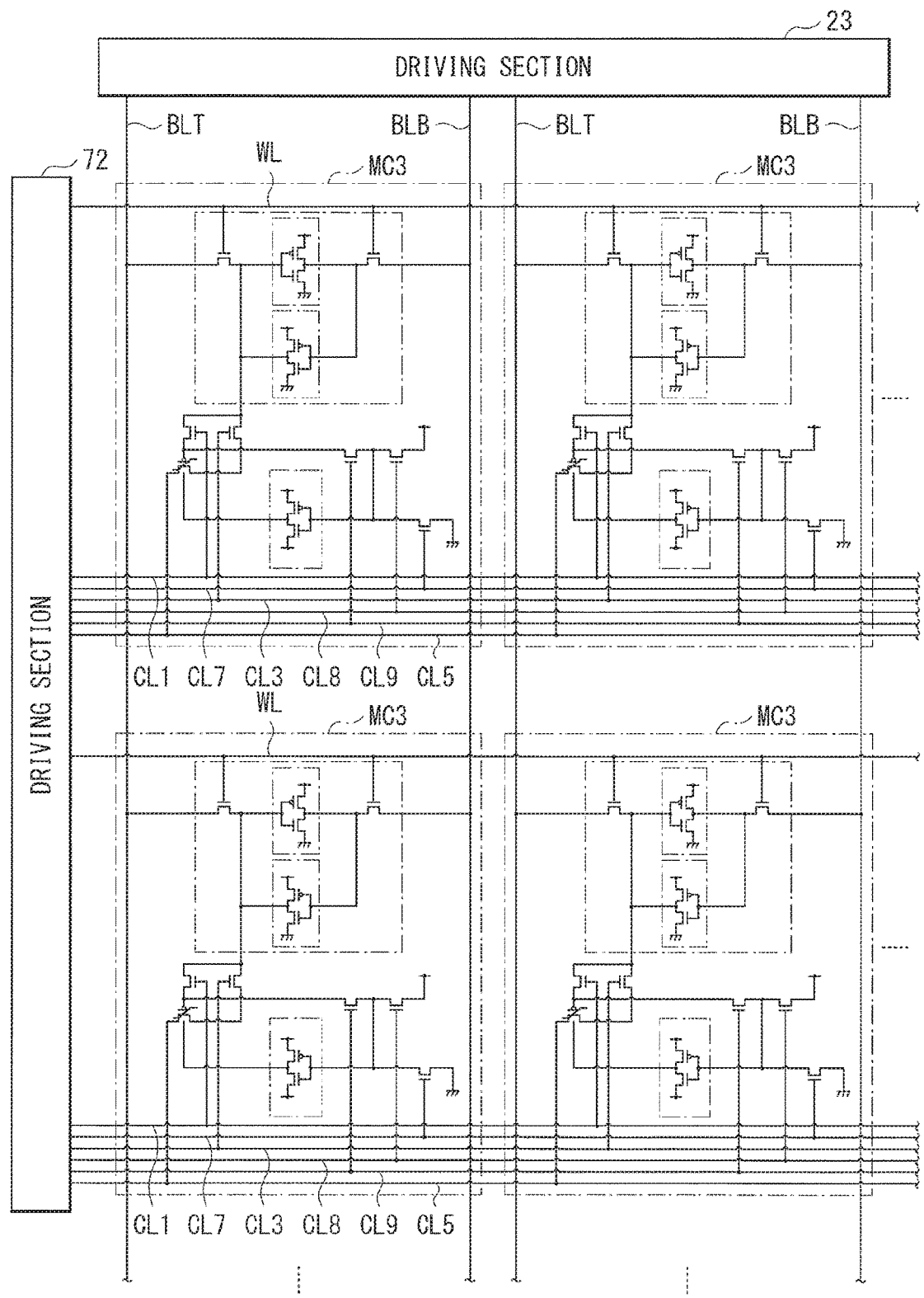

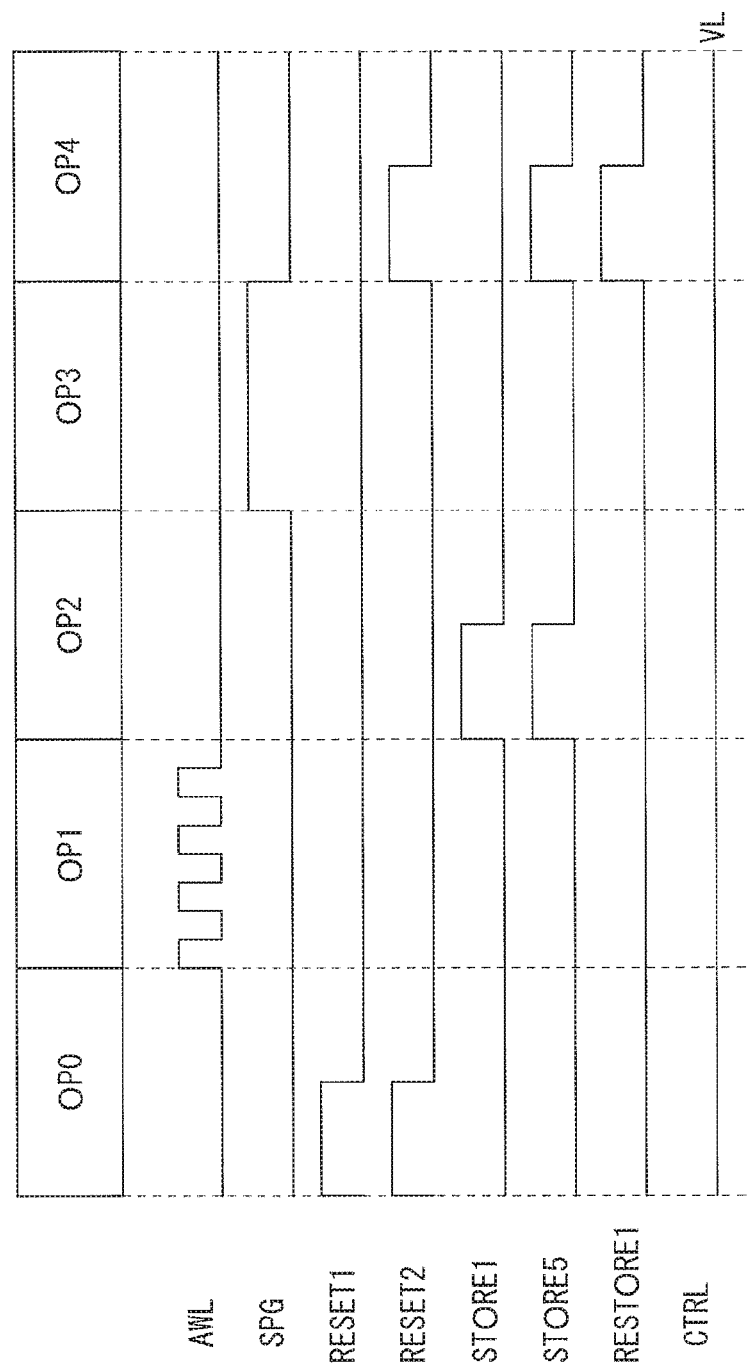
[FIG. 25]

[ FIG. 26A ]
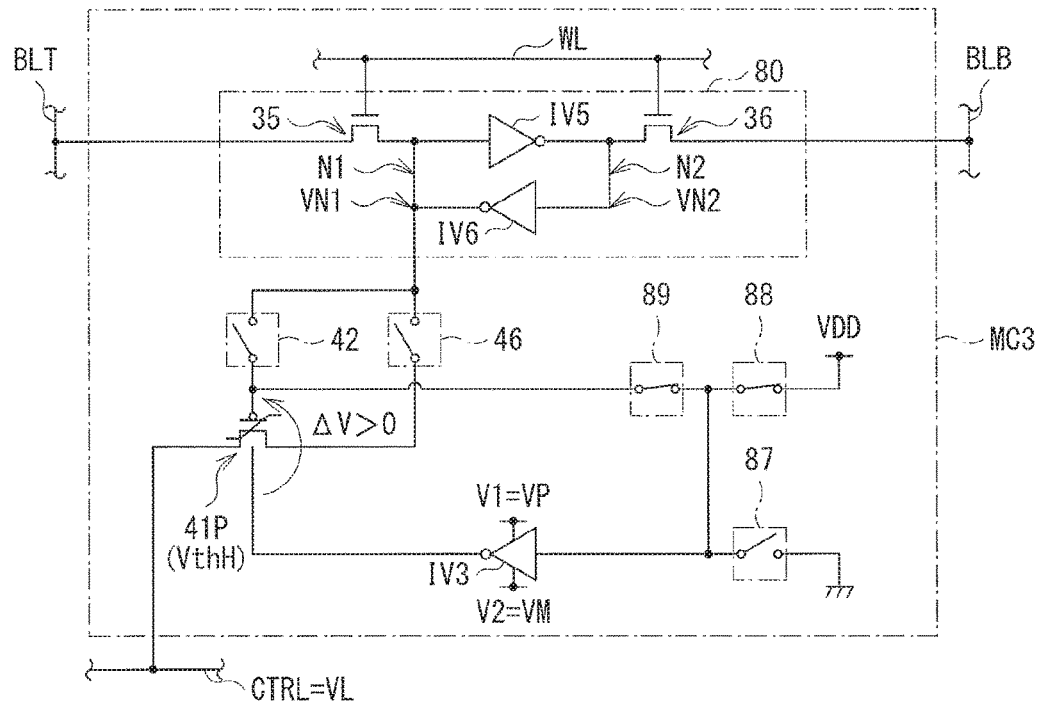
[ FIG. 26B ]
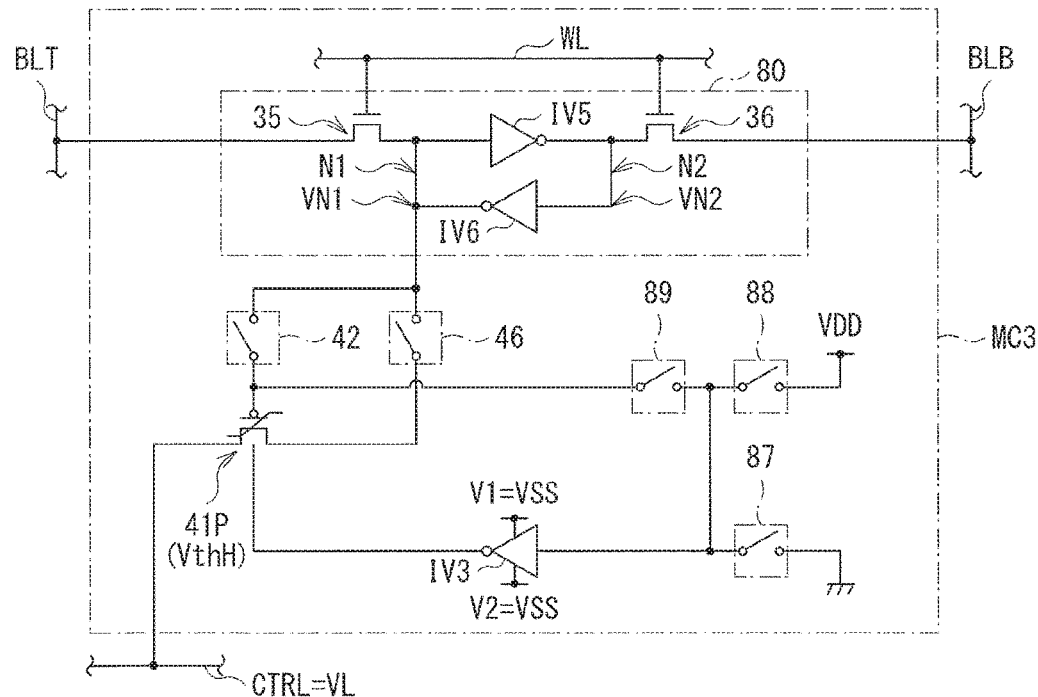

[ FIG. 27A ]
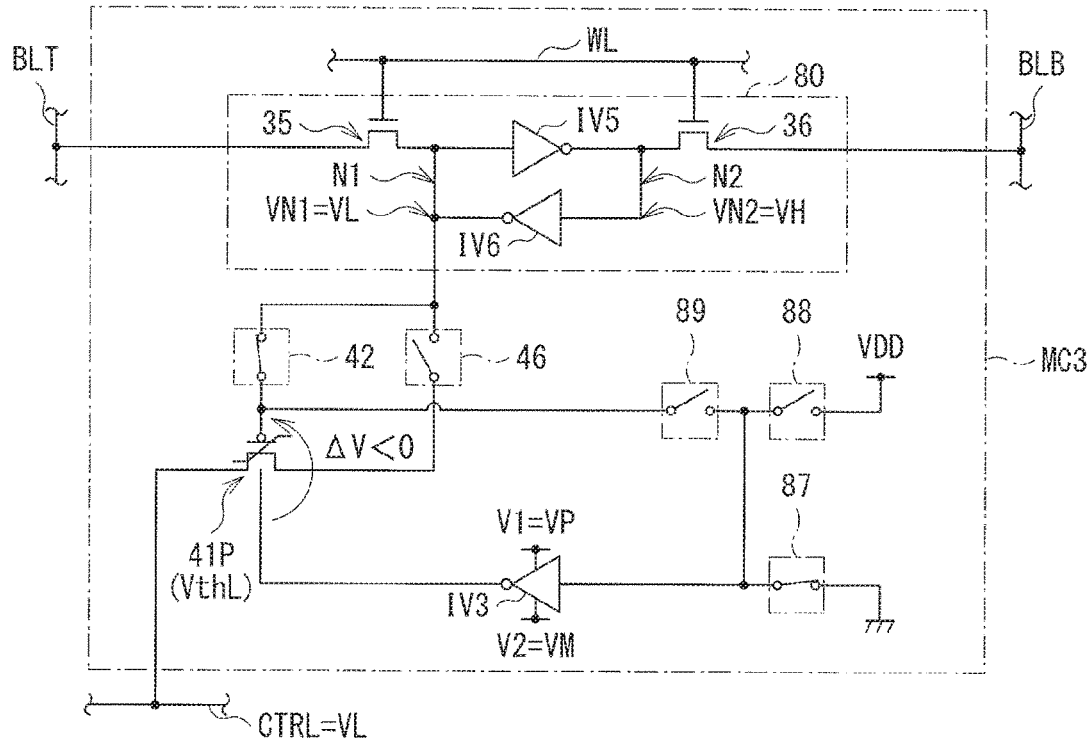
[ FIG. 27B ]
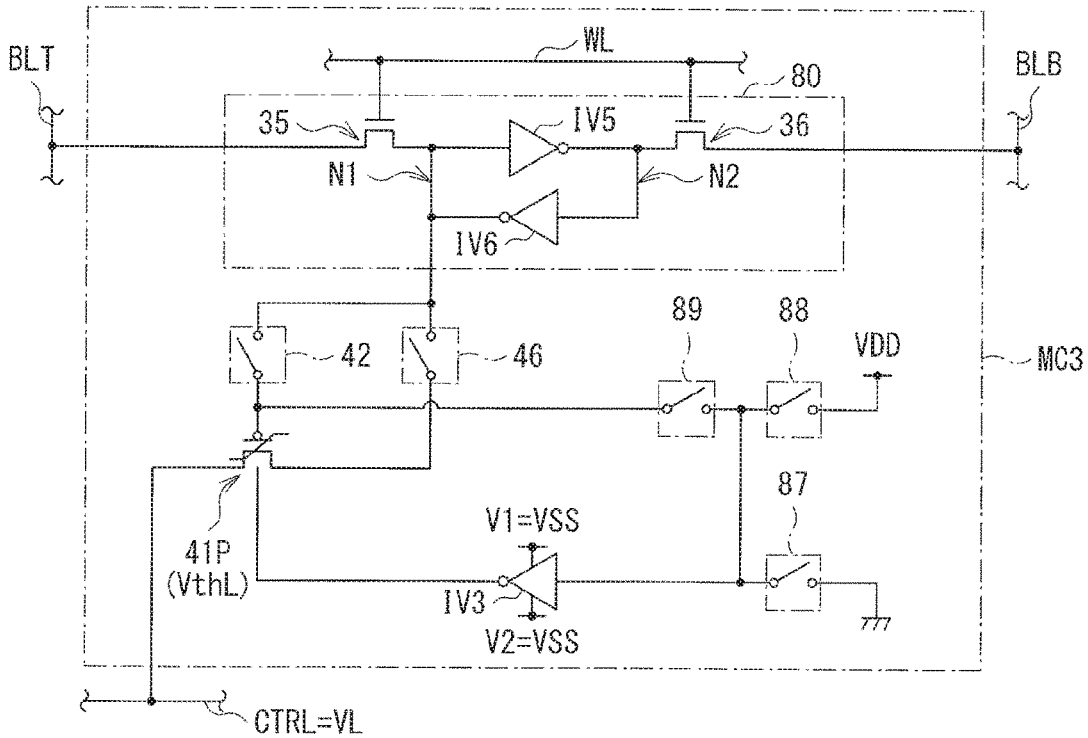

[ FIG. 27C ]
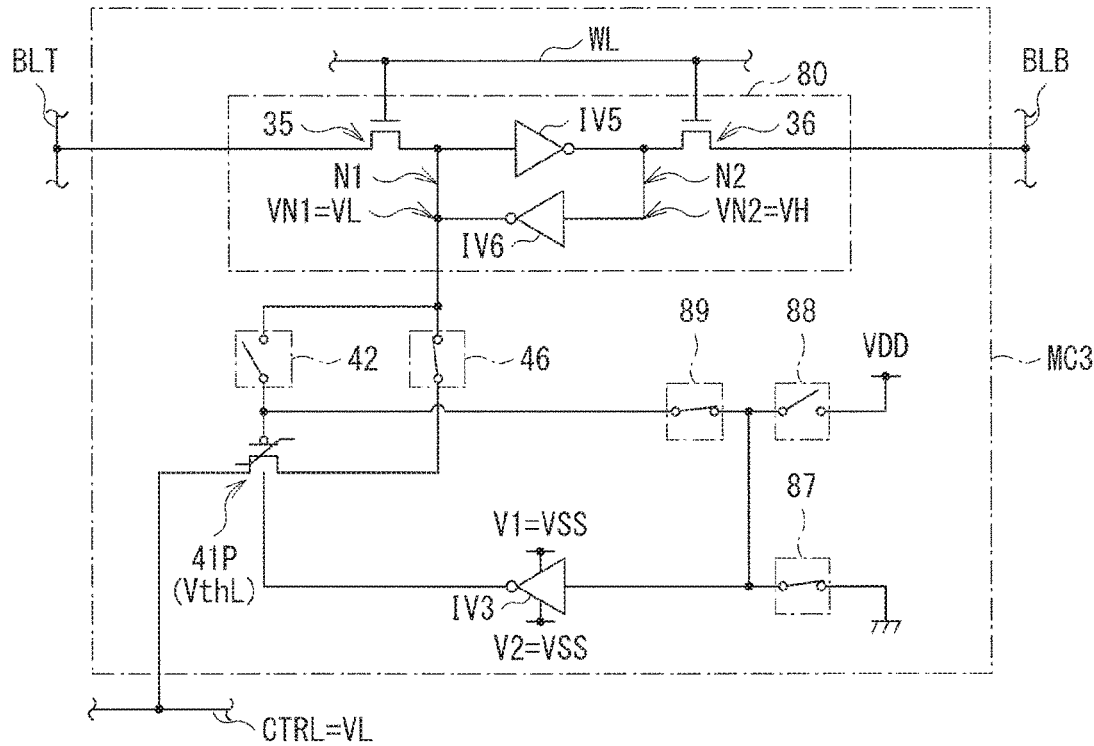
[ FIG. 28A ]
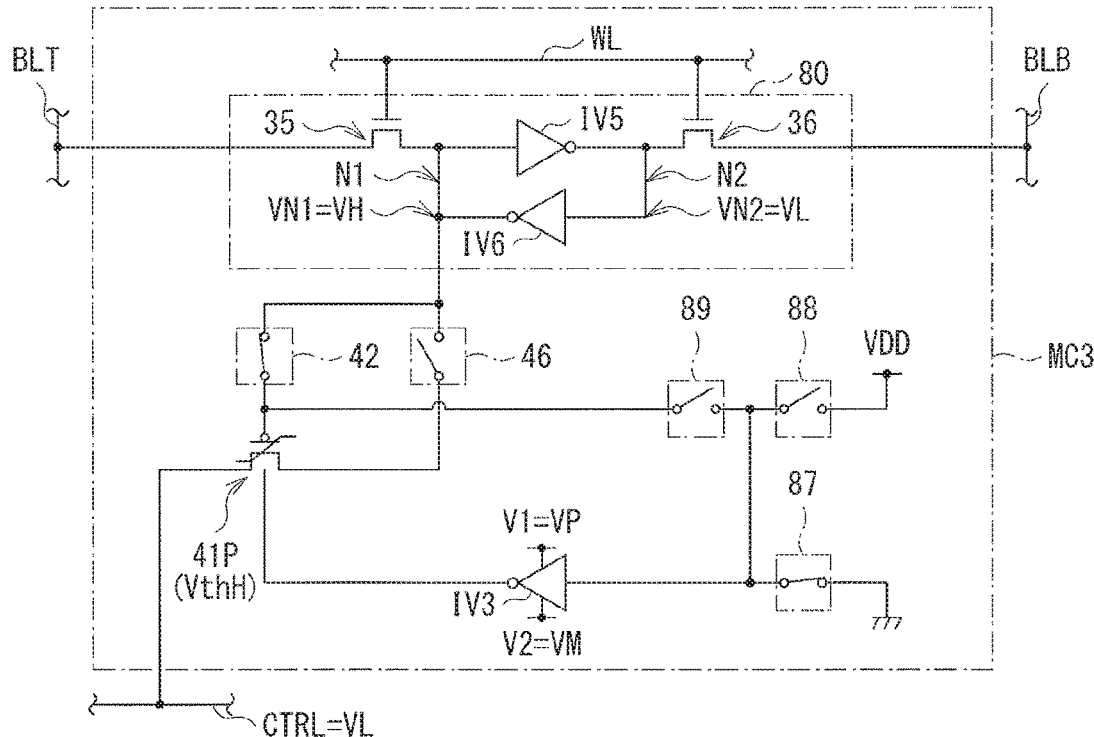

[ FIG. 28B ]
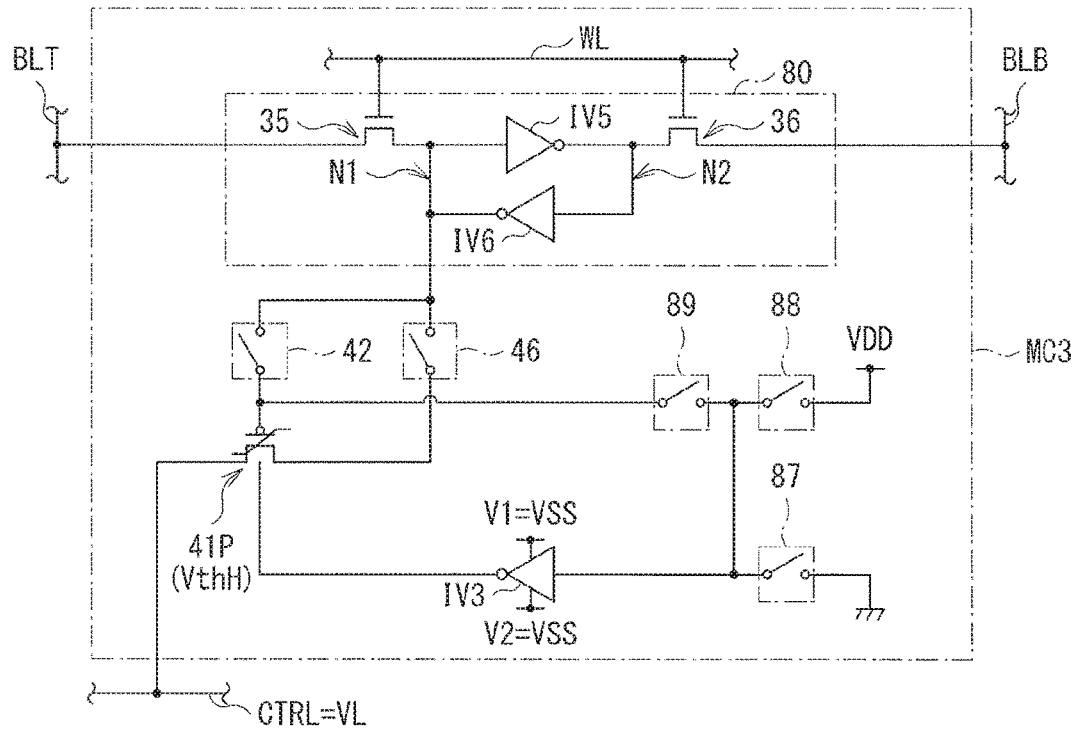
[ FIG. 28C ]
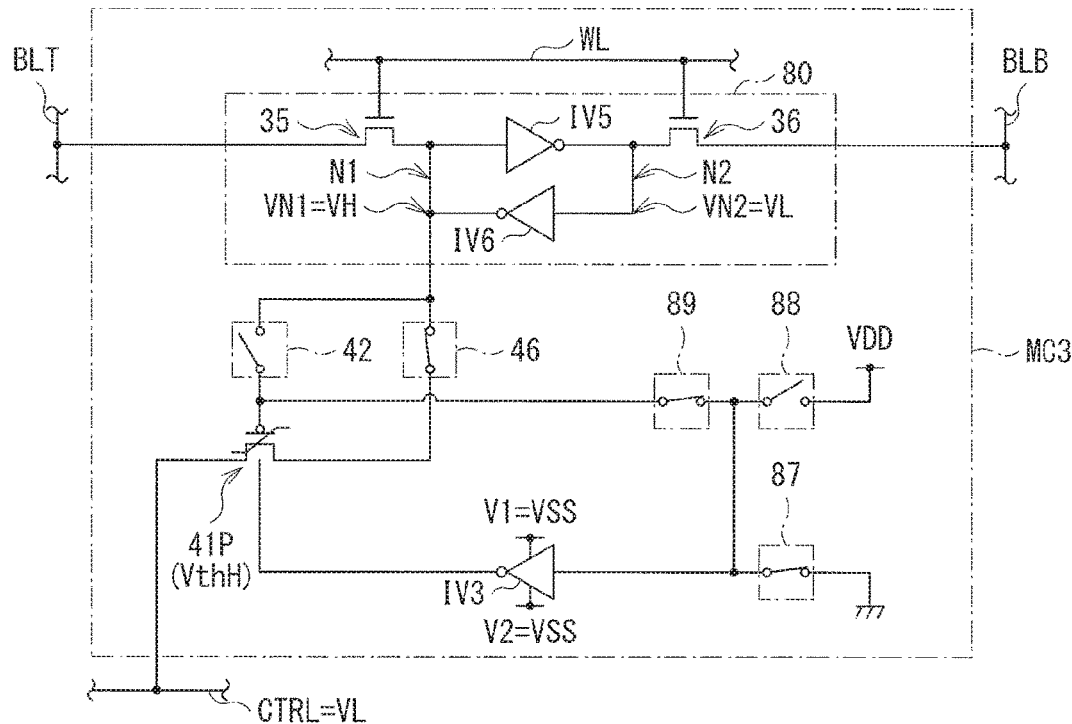

[FIG. 29]
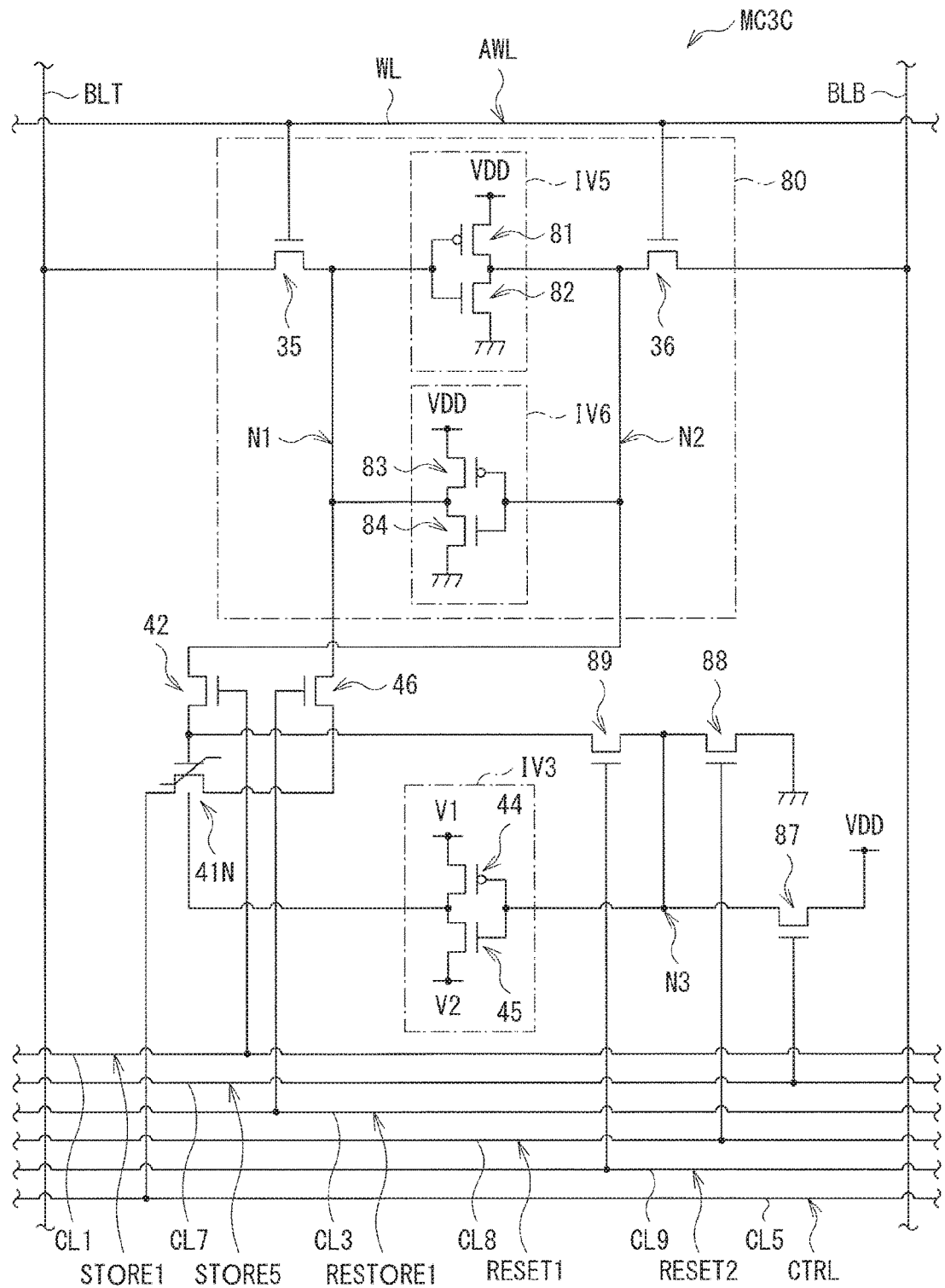

[ FIG. 30 A ]
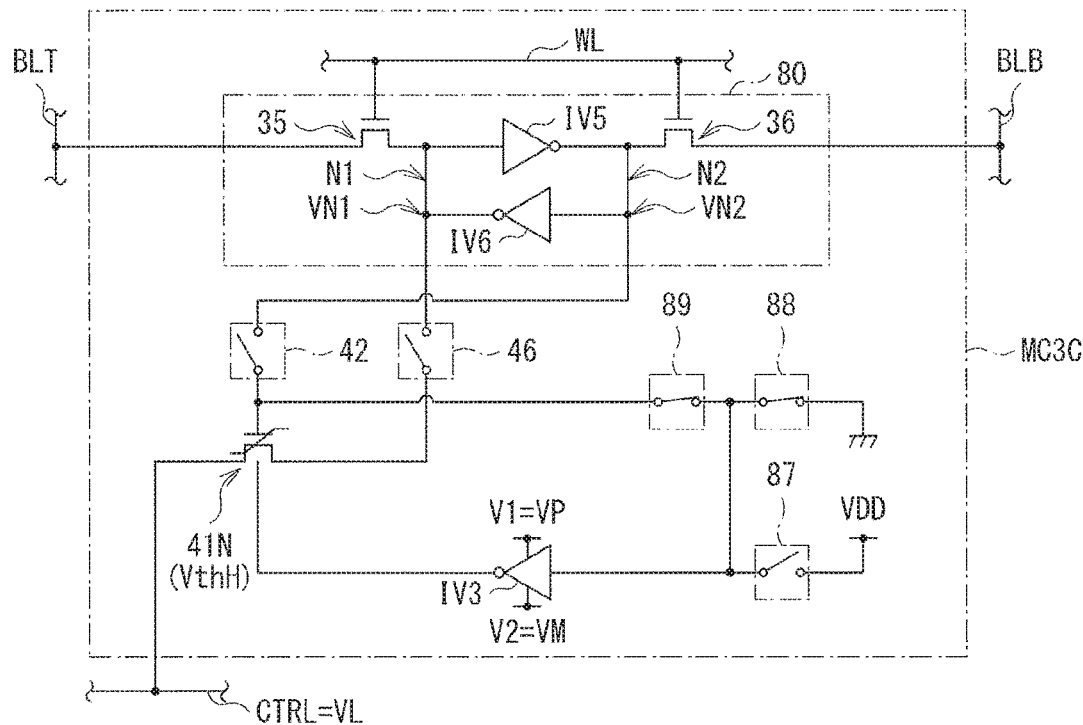
[ FIG. 30B ]
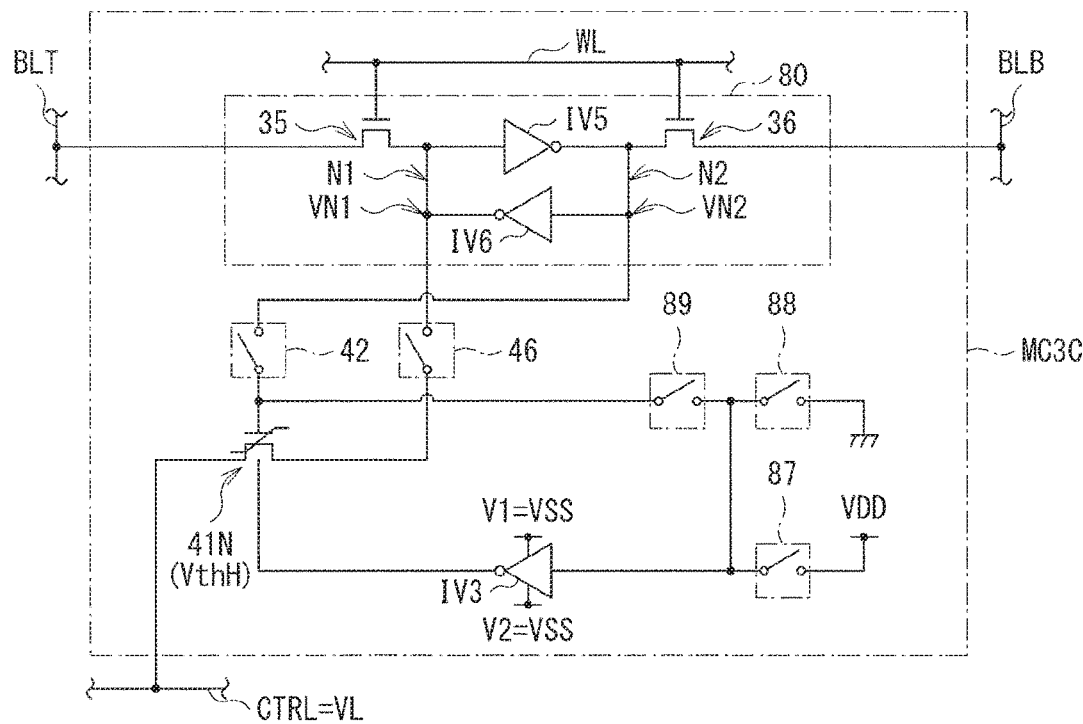

[FIG. 31A]
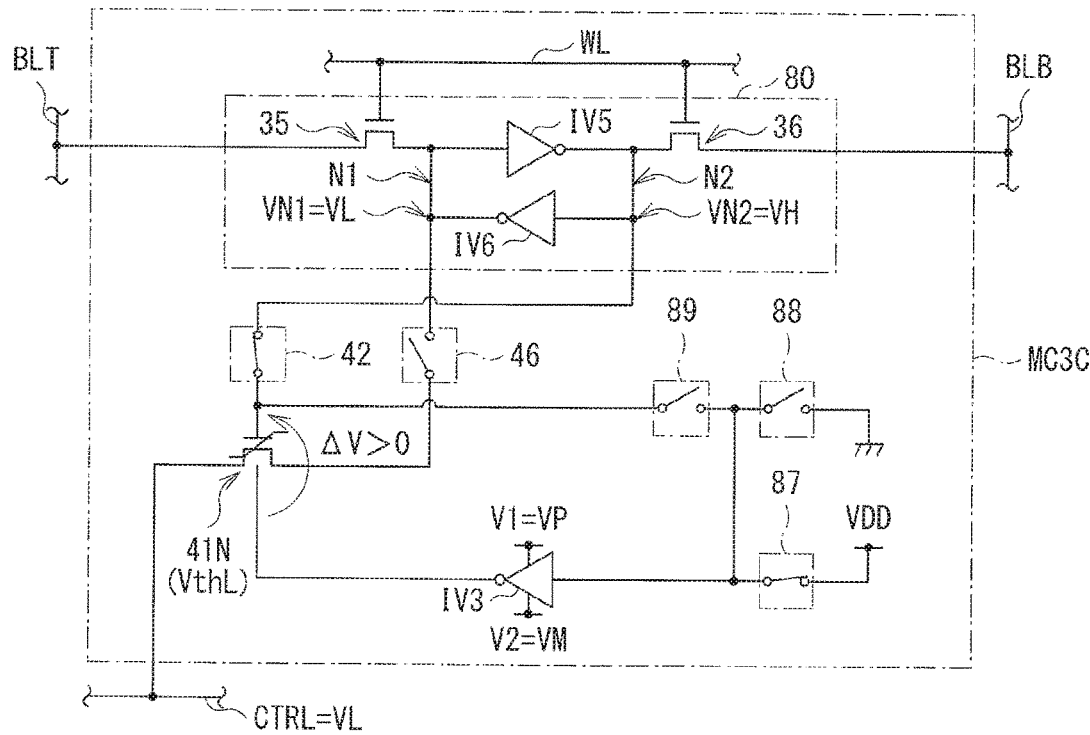
[FIG. 31B]
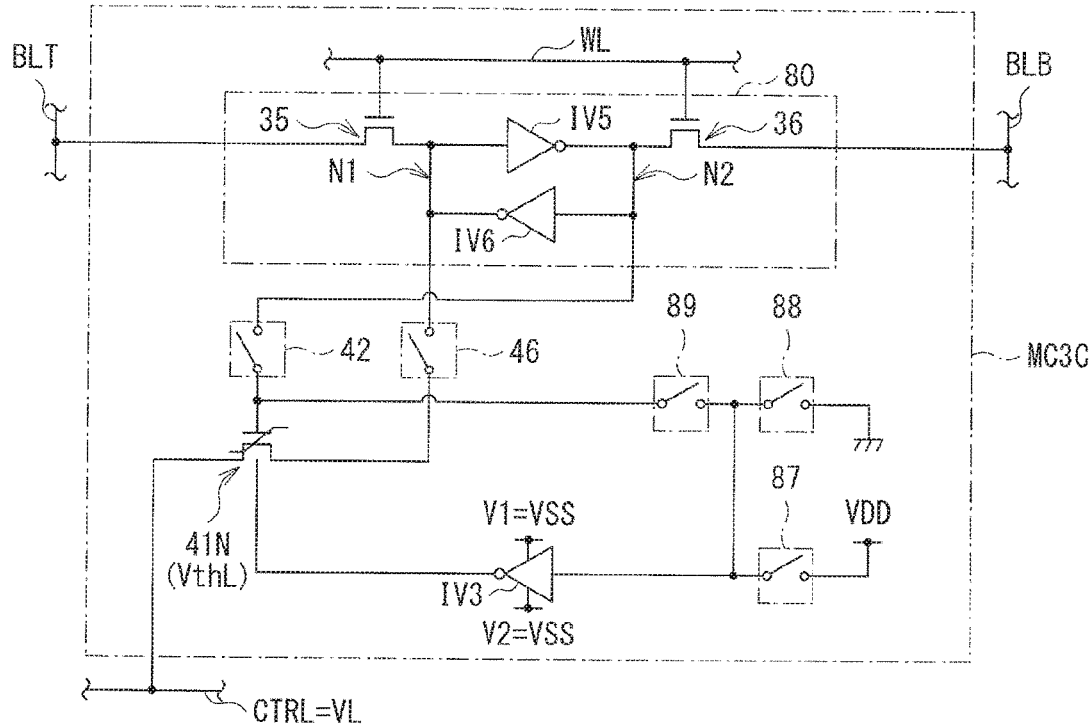

[ FIG. 31C ]
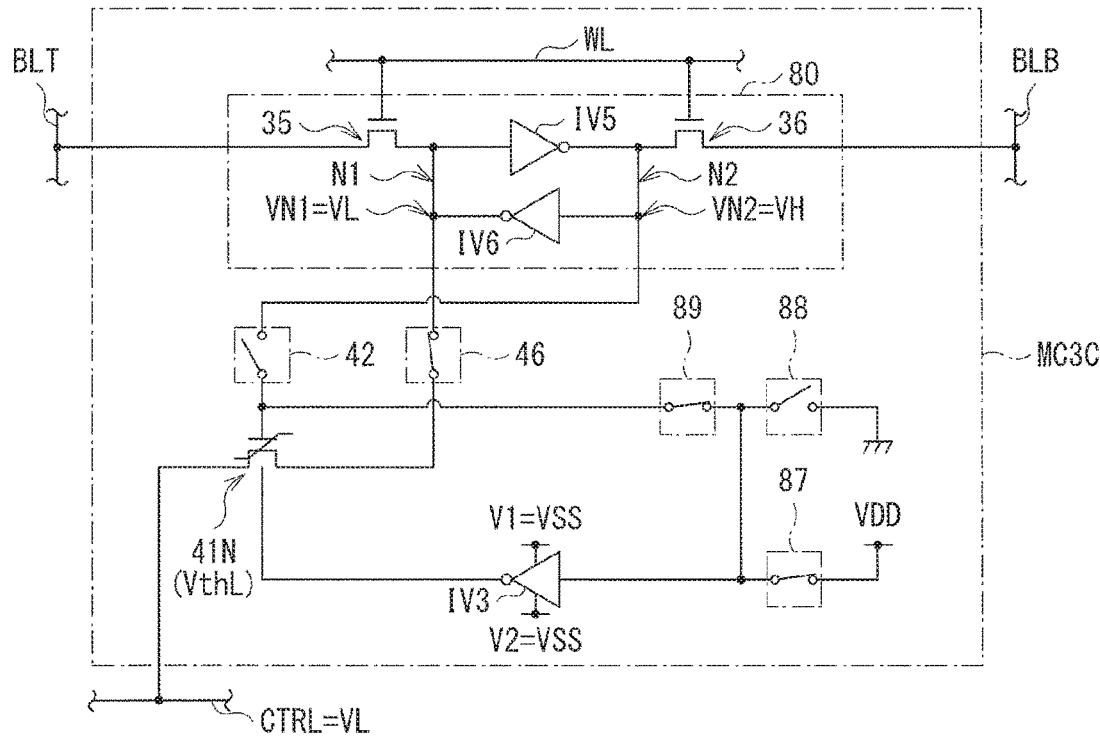
[ FIG. 32A ]
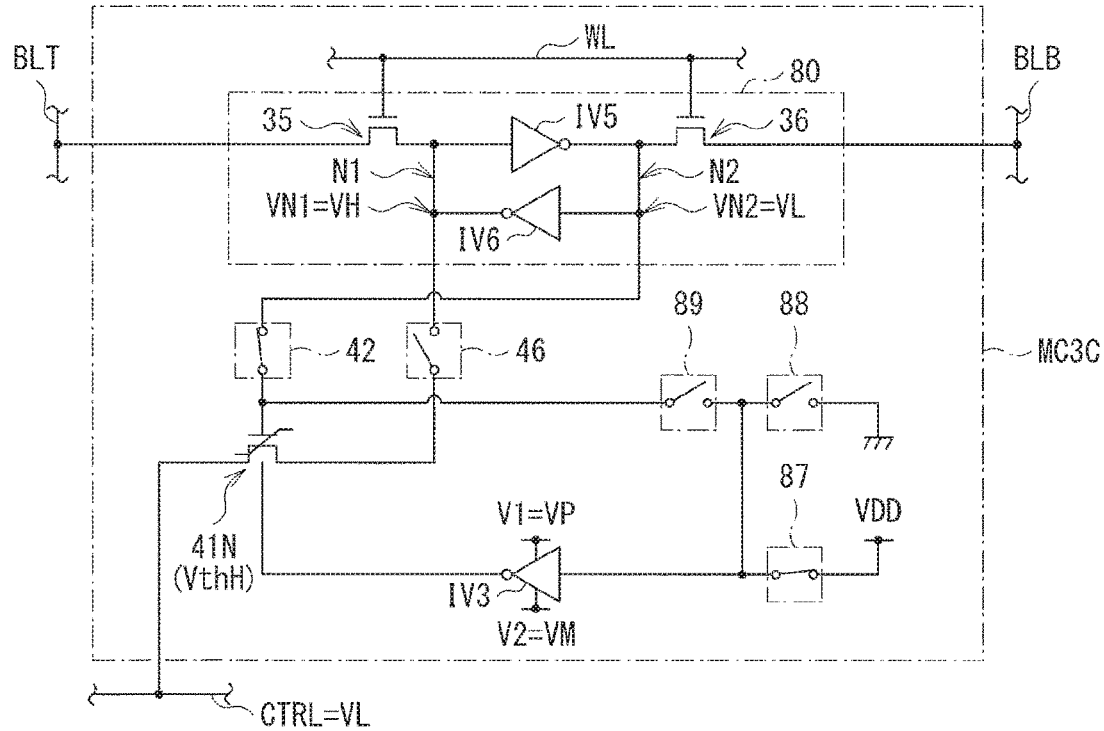

[ FIG. 32B ]
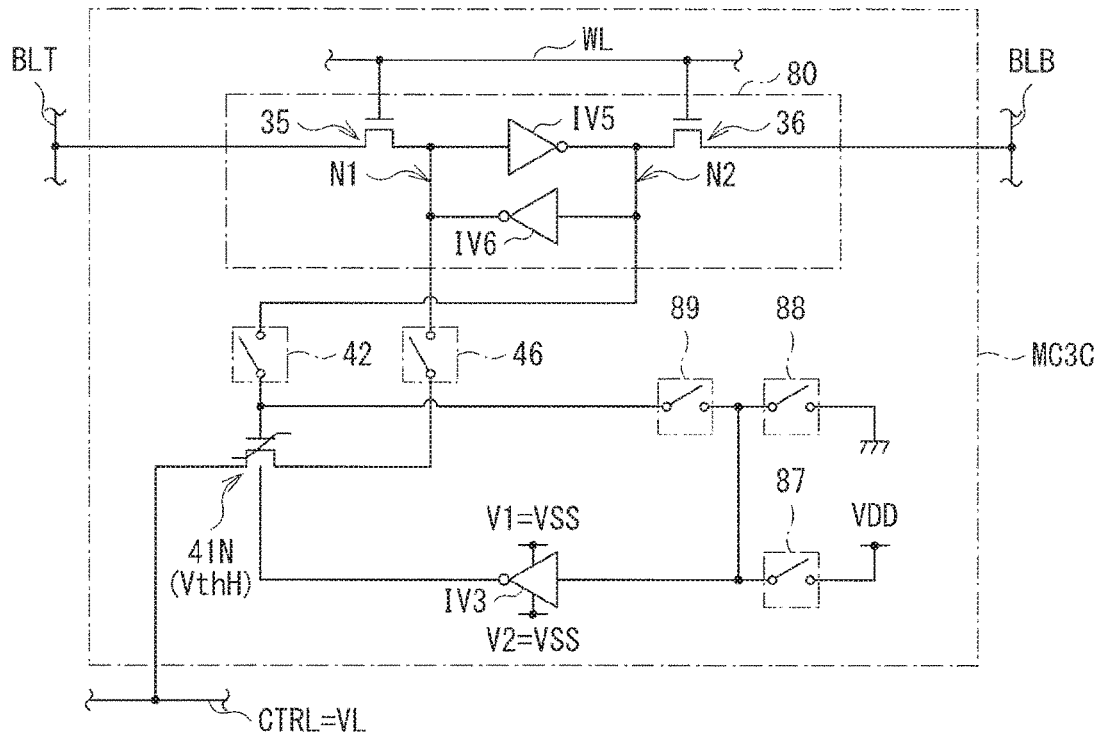
[ FIG. 32C ]
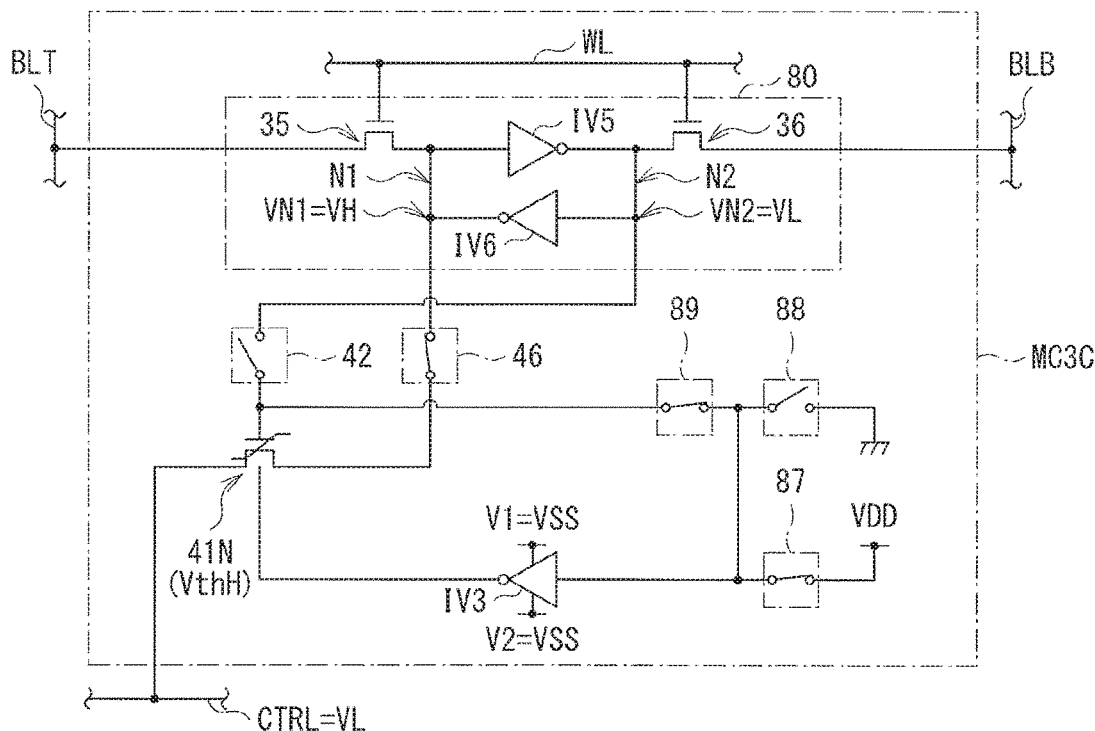

[ FIG. 33A ]
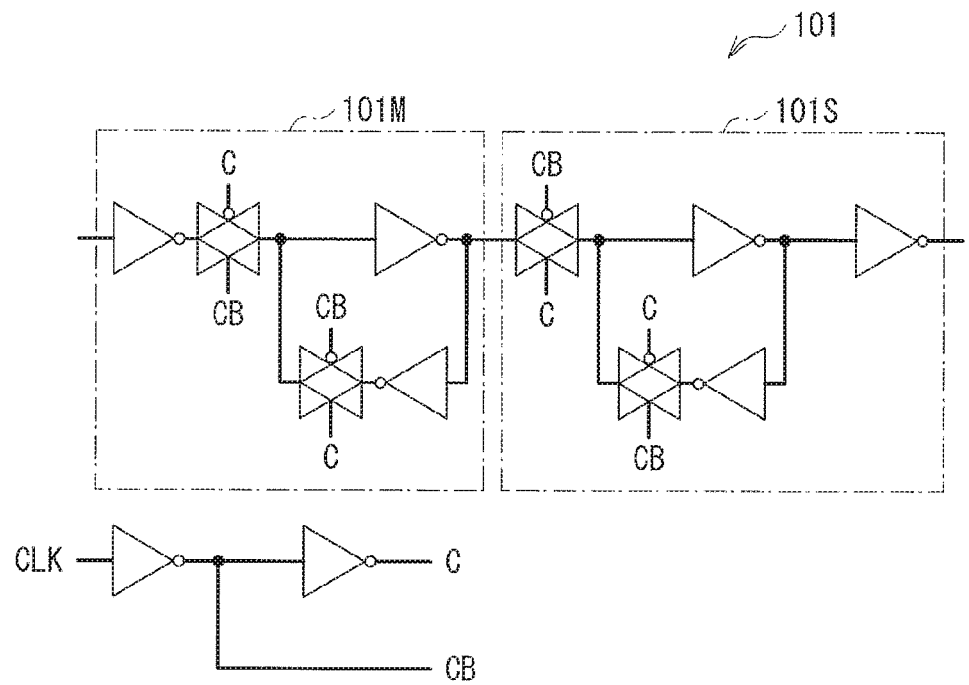
[ FIG. 33B ]
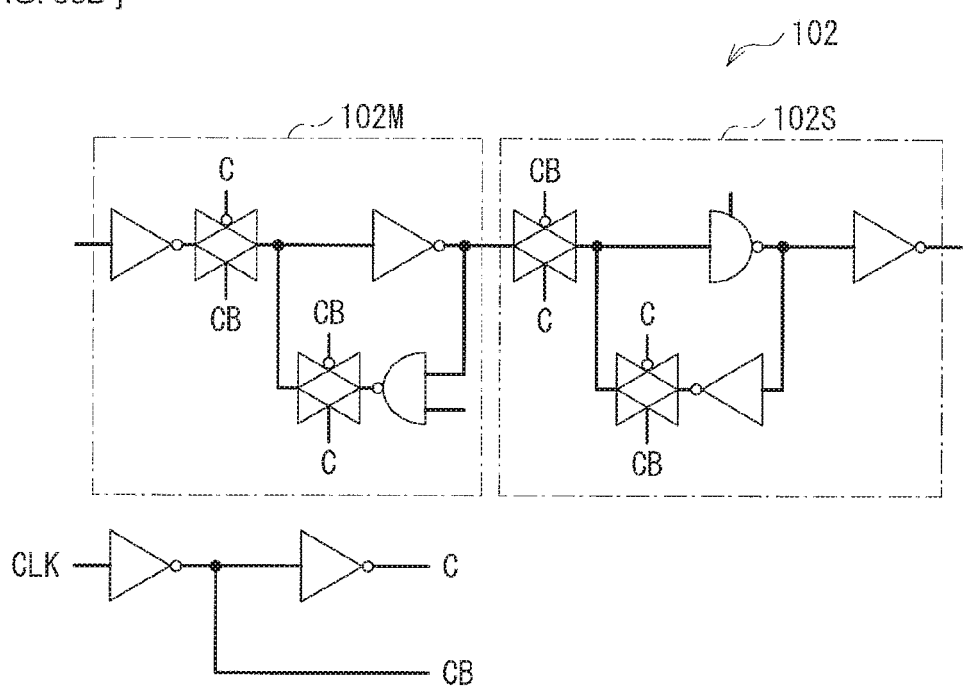

[ FIG. 33C ]
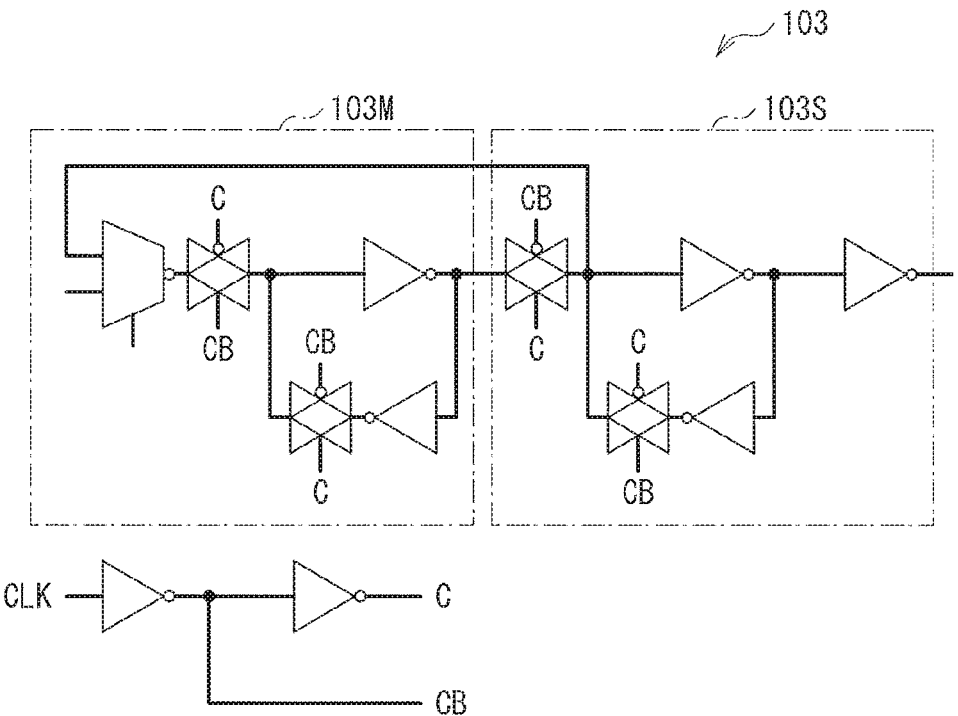
[ FIG. 33D ]
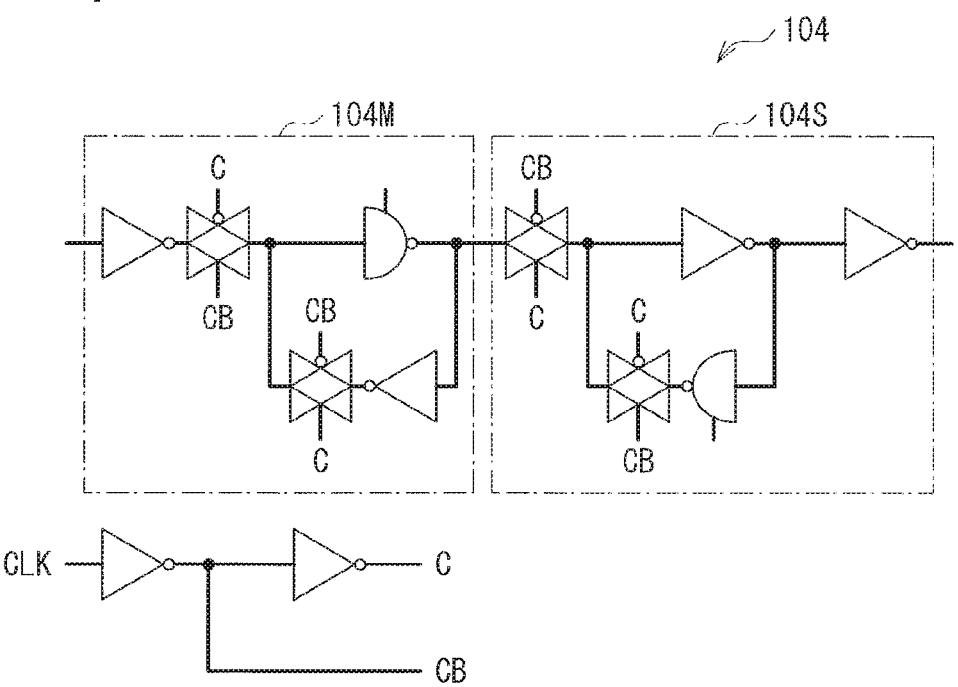

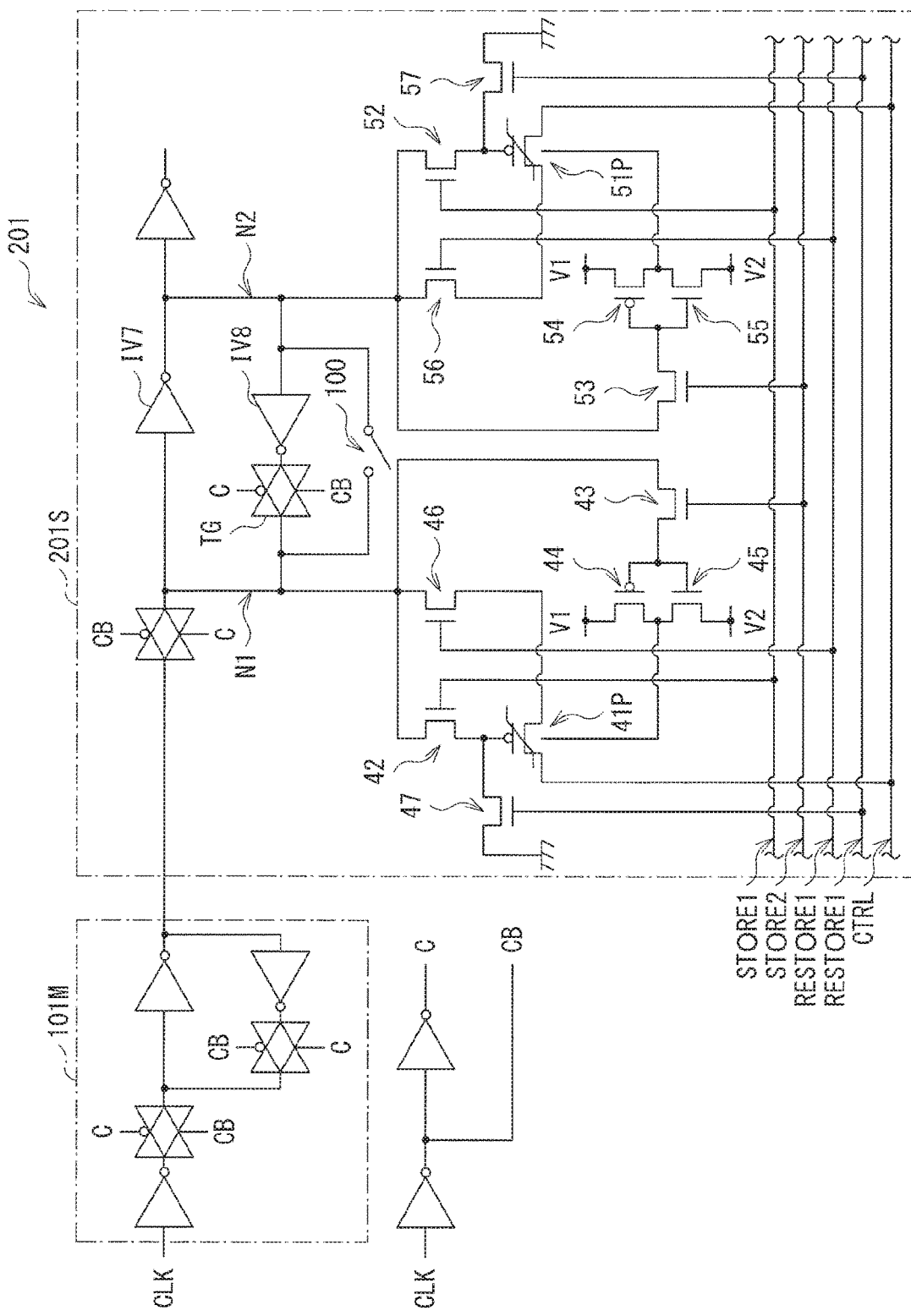
[FIG. 34]

[ FIG. 35 ]
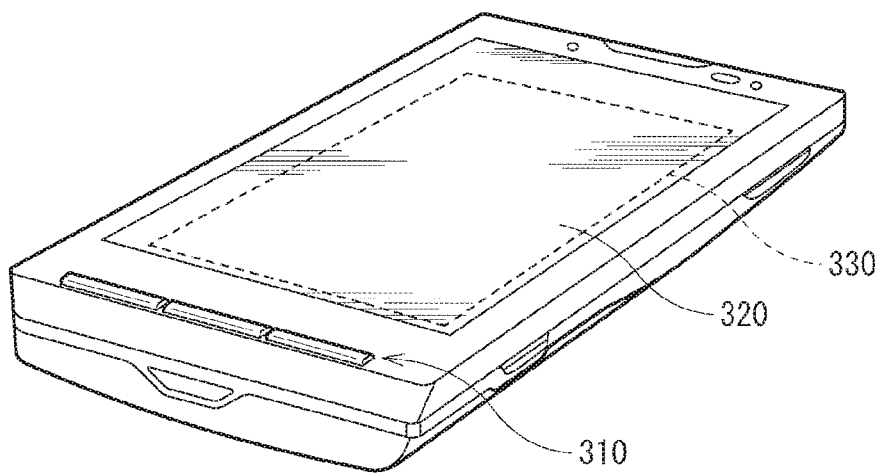

SEMICONDUCTOR CIRCUIT, DRIVING METHOD, AND ELECTRONIC DEVICE WITH LESS DISTURBANCE

CROSS REFERENCE TO RELATED APPLICATIONS

This application is a U.S. National Phase of International Patent Application No. PCT/JP2018/018054 filed on May 10, 2018, which claims priority benefit of Japanese Patent Application No. JP 2017-099730 filed in the Japan Patent Office on May 19, 2017. Each of the above-referenced applications is hereby incorporated herein by reference in its entirety.

TECHNICAL FIELD

The present disclosure relates to a semiconductor circuit including a nonvolatile storage element, a method of driving such a semiconductor circuit, and an electronic device including such a semiconductor circuit.

BACKGROUND ART

Electronic devices are desired to have low power consumption from the viewpoint of ecology. For semiconductor circuits, for example, a so-called power gating technique is often used in which power consumption is reduced by selectively stopping power supply to a portion of the circuits. The circuit the power supply to which is stopped in this manner is desired to return to the operating state in which the power supply has not yet been stopped, immediately after the power supply is restarted. One method of achieving such a short-time return operation is to incorporate a nonvolatile memory in a circuit. For example, PTL 1 discloses a circuit in which SRAM (Static Random Access Memory), which is a volatile memory, and a spin-injection magnetization-reversal type storage element are combined.

CITATION LIST

Patent Literature

PTL 1: International Publication No. WO 2009/028298

SUMMARY OF THE INVENTION

Incidentally, it is desired that it be difficult for a storage circuit to have disturbance, and further improvement is expected.

It is desirable to provide a semiconductor circuit, a driving method, and an electronic device that are able to make disturbance more difficult to generate.

A semiconductor circuit according to an embodiment of the present disclosure includes: a first circuit; a second circuit; a first transistor; a second transistor; a third transistor; and a driving section. The first circuit is configured to generate an inverted voltage of a voltage at a first node, and apply the inverted voltage to a second node. The second circuit is configured to generate an inverted voltage of a voltage at the second node, and apply the inverted voltage to the first node. The first transistor includes a gate, a drain, and a source, and is configured to store a threshold state. The second transistor couples the first node to a first terminal by being turned on. The first terminal is one of the drain or the source of the first transistor. The third transistor couples a first predetermined node to the gate of the first transistor by being turned on. The first predetermined node is one of the first node or the second node. The driving section controls operations of the second transistor and the third transistor, and applies a control voltage to a second terminal. The second terminal is another of the drain or the source of the first transistor.

A driving method according to an embodiment of the present disclosure includes performing first driving in a first period for a semiconductor circuit including a first circuit that is configured to generate an inverted voltage of a voltage at a first node, and apply the inverted voltage to a second node, a second circuit that is configured to generate an inverted voltage of a voltage at the second node, and apply the inverted voltage to the first node, a first transistor that includes a gate, a drain, and a source, and is configured to store a threshold state, a second transistor that couples the first node to a first terminal by being turned on, and a third transistor that couples a first predetermined node to the gate of the first transistor by being turned on. The first terminal is one of the drain or the source of the first transistor. The first predetermined node is one of the first node or the second node. The first driving turns off the second transistor and turns on the third transistor, thereby setting the threshold state of the first transistor to a threshold state corresponding to a voltage at the first predetermined node.

An electronic circuit according to an embodiment of the present disclosure includes: a semiconductor circuit; and a battery. The semiconductor circuit includes a first circuit, a second circuit, a first transistor, a second transistor, a third transistor, and a driving section. The first circuit is configured to generate an inverted voltage of a voltage at a first node, and apply the inverted voltage to a second node. The second circuit is configured to generate an inverted voltage of a voltage at the second node, and apply the inverted voltage to the first node. The first transistor includes a gate, a drain, and a source, and is configured to store a threshold state. The second transistor couples the first node to a first terminal by being turned on. The first terminal is one of the drain or the source of the first transistor. The third transistor couples a first predetermined node to the gate of the first transistor by being turned on. The first predetermined node is one of the first node or the second node. The driving section controls operations of the second transistor and the third transistor, and applies a control voltage to a second terminal. The second terminal is another of the drain or the source of the first transistor.

In the semiconductor circuit, driving method, and electronic device according to the embodiment of the present disclosure, the first circuit and the second circuit cause voltages inverted from each other to appear at the first node and the second node. The first node is coupled by turning on the second transistor to the first terminal that is one of the drain or the source of the first transistor. The first predetermined node that is one of the first node or the second node is coupled to the gate of the first transistor by turning on the third transistor. A control voltage is applied to the second terminal that is another of the drain or the source of the first transistor. The first transistor is able to store a threshold state.

The semiconductor circuit and electronic device according to the embodiment of the present disclosure each includes a first transistor that is able to store a threshold. Accordingly, it is possible to make disturbance more difficult to generate. It should be noted that the effects described here are not necessarily limited, but any of effects described in the present disclosure may be included.

BRIEF DESCRIPTION OF DRAWING

FIG. 1 is a block diagram illustrating a configuration example of a semiconductor circuit according to an embodiment of the present disclosure.

FIG. 2 is a circuit diagram illustrating a configuration example of a memory cell according to a first embodiment.

FIG. 3 is a circuit diagram illustrating a configuration example of a memory cell array including the memory cell illustrated in FIG. 2.

FIG. 4 is a cross-sectional view of a configuration example of a ferroelectric-gate transistor illustrated in FIG. 2.

FIG. 5 is an explanatory diagram illustrating an operation example of the memory cell illustrated in FIG. 2.

FIG. 6A is a circuit diagram illustrating an operation example of the memory cell illustrated in FIG. 2.

FIG. 6B is another circuit diagram illustrating an operation example of the memory cell illustrated in FIG. 2.

FIG. 6C is another circuit diagram illustrating an operation example of the memory cell illustrated in FIG. 2.

FIG. 6D is another circuit diagram illustrating an operation example of the memory cell illustrated in FIG. 2.

FIG. 7 is a circuit diagram illustrating a configuration example of a memory cell according to a modification of the first embodiment.

FIG. 8 is an explanatory diagram illustrating an operation example of the memory cell illustrated in FIG. 7.

FIG. 9 is a circuit diagram illustrating a configuration example of a memory cell according to another modification of the first embodiment.

FIG. 10 is a cross-sectional view of a configuration example of a ferroelectric-gate transistor illustrated in FIG. 9.

FIG. 11A is a circuit diagram illustrating an operation example of the memory cell illustrated in FIG. 9.

FIG. 11B is another circuit diagram illustrating an operation example of the memory cell illustrated in FIG. 9.

FIG. 11C is another circuit diagram illustrating an operation example of the memory cell illustrated in FIG. 9.

FIG. 11D is another circuit diagram illustrating an operation example of the memory cell illustrated in FIG. 9.

FIG. 12 is a block diagram illustrating a configuration example of a semiconductor circuit according to another modification of the first embodiment.

FIG. 13 is a circuit diagram illustrating a configuration example of a memory cell illustrated in FIG. 12.

FIG. 14 is an explanatory diagram illustrating an operation example of the memory cell illustrated in FIG. 13.

FIG. 15 is a block diagram illustrating a configuration example of a semiconductor circuit according to another modification of the first embodiment.

FIG. 16 is a block diagram illustrating a configuration example of a semiconductor circuit according to a second embodiment.

FIG. 17 is a circuit diagram illustrating a configuration example of a memory cell illustrated in FIG. 16.

FIG. 18 is a circuit diagram illustrating a configuration example of a memory cell array including the memory cell illustrated in FIG. 17.

FIG. 19 is an explanatory diagram illustrating an operation example of the memory cell illustrated in FIG. 17.

FIG. 20A is a circuit diagram illustrating an operation example of the memory cell illustrated in FIG. 17.

FIG. 20B is another circuit diagram illustrating an operation example of the memory cell illustrated in FIG. 17.

FIG. 20C is another circuit diagram illustrating an operation example of the memory cell illustrated in FIG. 17.

FIG. 20D is another circuit diagram illustrating an operation example of the memory cell illustrated in FIG. 17.

FIG. 20E is another circuit diagram illustrating an operation example of the memory cell illustrated in FIG. 17.

FIG. 21 is a circuit diagram illustrating a configuration example of a memory cell according to a modification of the second embodiment.

FIG. 22A is a circuit diagram illustrating an operation example of the memory cell illustrated in FIG. 21.

FIG. 22B is another circuit diagram illustrating an operation example of the memory cell illustrated in FIG. 21.

FIG. 22C is another circuit diagram illustrating an operation example of the memory cell illustrated in FIG. 21.

FIG. 22D is another circuit diagram illustrating an operation example of the memory cell illustrated in FIG. 21.

FIG. 22E is another circuit diagram illustrating an operation example of the memory cell illustrated in FIG. 21.

FIG. 23 is a circuit diagram illustrating a configuration example of a memory cell according to a third embodiment.

FIG. 24 is a circuit diagram illustrating a configuration example of a memory cell array including the memory cell illustrated in FIG. 23.

FIG. 25 is an explanatory diagram illustrating an operation example of the memory cell illustrated in FIG. 23.

FIG. 26A is a circuit diagram illustrating an operation example of the memory cell illustrated in FIG. 23.

FIG. 26B is another circuit diagram illustrating an operation example of the memory cell illustrated in FIG. 23.

FIG. 27A is another circuit diagram illustrating an operation example of the memory cell illustrated in FIG. 23.

FIG. 27B is another circuit diagram illustrating an operation example of the memory cell illustrated in FIG. 23.

FIG. 27C is another circuit diagram illustrating an operation example of the memory cell illustrated in FIG. 23.

FIG. 28A is another circuit diagram illustrating an operation example of the memory cell illustrated in FIG. 23.

FIG. 28B is another circuit diagram illustrating an operation example of the memory cell illustrated in FIG. 23.

FIG. 28C is another circuit diagram illustrating an operation example of the memory cell illustrated in FIG. 23.

FIG. 29 is a circuit diagram illustrating a configuration example of a memory cell according to a modification of the third embodiment.

FIG. 30A is a circuit diagram illustrating an operation example of the memory cell illustrated in FIG. 29.

FIG. 30B is another circuit diagram illustrating an operation example of the memory cell illustrated in FIG. 29.

FIG. 31A is another circuit diagram illustrating an operation example of the memory cell illustrated in FIG. 29.

FIG. 31B is another circuit diagram illustrating an operation example of the memory cell illustrated in FIG. 29.

FIG. 31C is another circuit diagram illustrating an operation example of the memory cell illustrated in FIG. 29.

FIG. 32A is another circuit diagram illustrating an operation example of the memory cell illustrated in FIG. 29.

FIG. 32B is another circuit diagram illustrating an operation example of the memory cell illustrated in FIG. 29.

FIG. 32C is another circuit diagram illustrating an operation example of the memory cell illustrated in FIG. 29.

FIG. 33A is a circuit diagram illustrating a configuration example of a flip-flop circuit.

FIG. 33B is a circuit diagram illustrating another configuration example of the flip-flop circuit.

FIG. 33C is a circuit diagram illustrating another configuration example of the flip-flop circuit.

FIG. 33D is a circuit diagram illustrating another configuration example of the flip-flop circuit.

FIG. 34 is a circuit diagram illustrating a configuration example of a flip-flop circuit according to an applied embodiment.

FIG. 35 is a perspective view of a configuration of appearance of a smartphone to which the embodiment is applied.

MODES FOR CARRYING OUT THE INVENTION

The following describes embodiments of the present disclosure in detail with reference to the drawings. It should be noted that description is given in the following order.
1. First Embodiment
2. Second Embodiment
3. Third Embodiment
4. Applied Example and Example of Application 1. First Embodiment Configuration Example FIG. 1 illustrates a configuration example of a semiconductor circuit (semiconductor circuit 1) according to a first embodiment. The semiconductor circuit 1 is a circuit that stores information. The semiconductor circuit 1 includes a control section 11, a power supply transistor 12, and a memory circuit 20.

The control section 11 controls the operation of the memory circuit 20. Specifically, the control section 11 writes information to the memory circuit 20 on the basis of a write command and write data supplied from the outside, and reads information from the memory circuit 20 on the basis of a read command supplied from the outside. In addition, the control section 11 also has a function of controlling power supply to the memory circuit 20 by supplying a power supply control signal SPG to the power supply transistor 12 to turn on and off the power supply transistor 12.

The control section 11 includes a voltage generator 13. The voltage generator 13 is configured by using, for example, a booster circuit, and generates voltages V1 and V2. Specifically, in a store operation OP2 (described below), the voltage generator 13 generates a voltage VP (e.g., "3 V") higher than a power supply voltage VDD (e.g., "1 V"), outputs this voltage VP as the voltage V1, generates a voltage VM (e.g., "−2 V") lower than a grounding voltage VSS ("0 V"), and outputs this voltage VM as the voltage V2. In addition, the voltage generator 13 outputs the grounding voltage VSS as the voltages V1 and V2 in an operation other than the store operation OP2. The voltage generator 13 then supplies the generated voltages V1 and V2 to a memory cell array 21 (described below) of the memory circuit 20.

In this example, the power supply transistor 12 is a P-type MOS (Metal Oxide Semiconductor) transistor, the gate is supplied with the power supply control signal SPG, the source is supplied with the power supply voltage VDD1, and the drain is coupled to the memory circuit 20.

With this configuration, in the semiconductor circuit 1, the power supply transistor 12 is turned on, and the power supply voltage VDD1 is supplied to the memory circuit 20 as the power supply voltage VDD in a case where the memory circuit 20 is operated. In addition, in the semiconductor circuit 1, the power supply transistor 12 is turned off in a case where the memory circuit 20 is not operated. It is possible in the semiconductor circuit 1 to reduce the power consumption by the so-called power gating like this.

The memory circuit 20 stores data. The memory circuit 20 includes the memory cell array 21 and driving sections 22 and 23. In the memory cell array 21, memory cells MC1 are arranged in a matrix.

FIG. 2 illustrates a configuration example of the memory cell MC1. FIG. 3 illustrates a configuration example of the memory cell array 21. The memory cell array 21 includes a plurality of word lines WL, a plurality of bit lines BLT, a plurality of bit lines BLB, a plurality of control lines CL1, a plurality of control lines CL2, a plurality of control lines CL3, a plurality of control lines CL4, and a plurality of control lines CL5. The word lines WL extend in the horizontal direction of FIGS. 2 and 3, and one end of each word line WL is coupled to the driving section 22. A signal SAWL is applied to this word line WL by the driving section 22. The bit lines BLT extend in the vertical direction of FIGS. 2 and 3, and one end of each bit line BLT is coupled to the driving section 23. The bit lines BLB extend in the vertical direction of FIGS. 2 and 3, and one end of each bit line BLB is coupled to the driving section 23. The control lines CL1 extend in the horizontal direction of FIGS. 2 and 3, and one end of each control line CL1 is coupled to the driving section 22. A signal STORE1 is applied to this control line CL1 by the driving section 22. The control lines CL2 extend in the horizontal direction of FIGS. 2 and 3, and one end of each control line CL2 is coupled to the driving section 22. A signal STORE2 is applied to this control line CL2 by the driving section 22. The control lines CL3 extend in the horizontal direction of FIGS. 2 and 3, and one end of each control line CL3 is coupled to the driving section 22. A signal RESTORE1 is applied to this control line CL3 by the driving section 22. The control lines CL4 extend in the horizontal direction of FIGS. 2 and 3, and one end of each control line CL4 is coupled to the driving section 22. A signal RESTORE2 is applied to this control line CL4 by the driving section 22. The control lines CL5 extend in the horizontal direction of FIGS. 2 and 3, and one end of each control line CL5 is coupled to the driving section 22. A signal CTRL is applied to this control line CL5 by the driving section 22.

The memory cell MC1 includes an SRAM (Static Random Access Memory) circuit 30, ferroelectric-gate transistors 41P and 51P, and transistors 42 to 47 and 52 to 57. It should be noted that the following defines the drain and source of each transistor for the convenience of description, but the definition is not limitative. The drain and source may be interchanged.

The SRAM circuit 30 stores one-bit information by positive feedback. The SRAM 30 includes transistors 31 to 36. The transistors 31 and 33 are P-type MOS transistors, and the transistors 32, 34, 35, and 36 are N-type MOS transistors.

The gate of the transistor 31 is coupled to a node N1. The source is supplied with the power supply voltage VDD, and the drain is coupled to a node N2. The gate of the transistor 32 is coupled to the node N1. The source is grounded, and the drain is coupled to the node N2. The transistors 31 and 32 are included in an inverter IV1. The inverter IV1 inverts a voltage VN1 at the node N1, and outputs a result of the inversion to the node N2. The gate of the transistor 33 is coupled to a node N2. The source is supplied with the power supply voltage VDD, and the drain is coupled to a node N1. The gate of the transistor 34 is coupled to the node N2. The source is grounded, and the drain is coupled to the node N1.

The transistors 33 and 34 are included in an inverter IV2. The inverter IV2 inverts a voltage VN2 at the node N2, and outputs a result of the inversion to the node N1. The gate of the transistor 35 is coupled to the word lines WL. The source is coupled to the bit lines BLT, and the drain is coupled to the node N1. The gate of the transistor 36 is coupled to the word lines WL. The source is coupled to the bit lines BLB, and the drain is coupled to the node N2.

With this configuration, the input terminal of the inverter IV1 and the output terminal of the inverter IV2 are coupled to each other via the node N1, and the input terminal of the inverter IV2 and the output terminal of the inverter IV1 are coupled to each other via the node N2. This causes the SRAM circuit 30 to store one-bit information by positive feedback. In the SRAM circuit 30, turning on the transistors 35 and 36 then causes information to be written into the SRAM circuit 30 via the bit lines BLT and BLB. Alternatively, information is read from the SRAM circuit 30.

The ferroelectric-gate transistors 41P and 51P are P-type ferroelectric-gate field-effect transistors (FeFET), and function as nonvolatile memories.

FIG. 4 illustrates a configuration example of the ferroelectric-gate transistor 41P. It should be noted that the same applies to the ferroelectric-gate transistor 51P. The ferroelectric-gate transistor 41P is formed on the surface of a P-type semiconductor substrate 90P in this example. The ferroelectric-gate transistor 41P includes semiconductor layers 91N, 92P, and 93P, a gate insulating film 94, and a gate electrode 95. The semiconductor layer 91N is an N-type semiconductor layer and is formed on the surface of the semiconductor substrate 90P. The semiconductor layer 91N functions as a so-called back gate of the ferroelectric-gate transistor 41P. The semiconductor layers 92P and 93P are P-type semiconductor layers (diffusion layers) and are formed on the surface of the semiconductor layer 91N to be spaced apart from each other. The semiconductor layer 92P functions as the source of the ferroelectric-gate transistor 41P, and the semiconductor layer 93P functions as the drain of the ferroelectric-gate transistor 41P. The gate insulating film 94 and the gate electrode 95 are formed in this order on the surface of a portion of the semiconductor layer 91N sandwiched between the semiconductor layer 92P and the semiconductor layer 93P. The gate insulating film 94 includes a ferroelectric material. In other words, in the ferroelectric-gate transistor 41P, a so-called gate oxide film in a P-type MOS transistor is replaced with the gate insulating film 94 including a ferroelectric material.

With this configuration, for example, when a voltage difference $\Delta V$ (=Vg−Vbg) between a voltage Vg of the gate and a voltage Vbg of the back gate is set to a predetermined positive voltage difference, the ferroelectric is polarized in the gate insulating film 94 in accordance with the direction of the electric field, and the polarization state is maintained in the ferroelectric-gate transistor 41P. This predetermined positive voltage difference is, for example, a voltage of "+2.5 V" or more. As a result, an absolute value IVth1 of the threshold of the ferroelectric-gate transistor 41P becomes high (high-threshold state VthH).

In addition, for example, when a voltage difference $\Delta V$ (=Vg−Vbg) between a voltage Vg of the gate and a voltage Vbg of the back gate is set to a predetermined negative voltage difference, the ferroelectric is polarized in the gate insulating film 94 in accordance with the direction of the electric field, and the polarization state is maintained in the ferroelectric-gate transistor 41P. This predetermined negative voltage difference is, for example, a voltage of "−2.5 V" or less. The direction of the polarization vector at this time is opposite to the direction of the polarization vector in a case where the voltage difference $\Delta V$ is set to a predetermined positive voltage difference. This causes the absolute value IVth1 of the threshold of the ferroelectric-gate transistor 41P to be low (low-threshold state VthL).

In this manner, in the ferroelectric-gate transistors 41P and 51P, the direction of the polarization vector changes in accordance with the polarity of the voltage difference $\Delta V$ (=Vg−Vbg) between the voltage Vg of the gate and the voltage Vbg of the back gate. This changes the threshold state between the high-threshold state VthH and the low-threshold state VthL. Setting the threshold states in this manner allows the ferroelectric-gate transistors 41P and 51P to store information.

As illustrated in FIG. 2, the gate of the ferroelectric-gate transistor 41P is coupled to the drains of the transistors 42 and 47. The source is coupled to the control lines CL5, and the drain is coupled to the drain of the transistor 46. The back gate is coupled to the drains of the transistors 44 and 45. In addition, the gate of the ferroelectric-gate transistor 51P is coupled to the drains of the transistors 52 and 57. The source is coupled to the control lines CL5, and the drain is coupled to the drain of the transistor 56. The back gate is coupled to the drains of the transistors 54 and 55.

The transistors 42, 43, and 45 to 47 are N-type MOS transistors, and the transistor 44 is a P-type MOS transistor. The gate of the transistor 42 is coupled to the control lines CL1. The source is coupled to the node N1, and the drain is coupled to the gate of the ferroelectric-gate transistor 41P and the drain of the transistor 47. The gate of the transistor 43 is coupled to the control lines CL2. The source is coupled to the node N1, and the drain is coupled to the gates of the transistors 44 and 45. The gate of the transistor 44 is coupled to the drain of the transistor 43 and the gate of the transistor 45. The source is supplied with the voltage V1. The drain is coupled to the drain of the transistor 45 and the back gate of the ferroelectric-gate transistors 41P. The gate of the transistor 45 is coupled to the drain of the transistor 43 and the gate of the transistor 44. The source is supplied with the voltage V2. The drain is coupled to the drain of the transistor 44 and the back gate of the ferroelectric-gate transistors 41P. The transistors 44 and 45 are included in an inverter IV3. The gate of the transistor 46 is coupled to the control lines CL3. The source is coupled to the node N1, and the drain is coupled to the drain of the ferroelectric-gate transistor 41P. The gate of the transistor 47 is coupled to the control lines CL4. The source is grounded, and the drain is coupled to the drain of the transistor 42 and the gate of the ferroelectric-gate transistor 41P.

The transistors 52, 53, and 55 to 57 are N-type MOS transistors, and the transistor 54 is a P-type MOS transistor. The gate of the transistor 52 is coupled to the control lines CL1. The source is coupled to the node N2, and the drain is coupled to the gate of the ferroelectric-gate transistor 51P and the drain of the transistor 57. The gate of the transistor 53 is coupled to the control lines CL2. The source is coupled to the node N2, and the drain is coupled to the gates of the transistors 54 and 55. The gate of the transistor 54 is coupled to the drain of the transistor 53 and the gate of the transistor 55. The source is supplied with the voltage V1. The drain is coupled to the drain of the transistor 55 and the back gate of the ferroelectric-gate transistors 51P. The gate of the transistor 55 is coupled to the drain of the transistor 53 and the gate of the transistor 54. The source is supplied with the voltage V2. The drain is coupled to the drain of the transistor 54 and the back gate of the ferroelectric-gate transistors 51P. The transistors 54 and 55 are included in an inverter IV4.

The gate of the transistor 56 is coupled to the control lines CL3. The source is coupled to the node N2, and the drain is coupled to the drain of the ferroelectric-gate transistor 51P. The gate of the transistor 57 is coupled to the control lines CL4. The source is grounded, and the drain is coupled to the drain of the transistor 52 and the gate of the ferroelectric-gate transistor 51P.

In this manner, the memory cell MC1 is provided with the ferroelectric-gate transistors 41P and 51P, and the transistors 42 to 47 and 52 to 57 in addition to the SRAM circuit 30. This makes it possible to cause the ferroelectric-gate transistors 41P and 51P, which are nonvolatile memories, to store the information stored in the SRAM circuit 30, which is a volatile memory, immediately before a standby operation, for example, in a case where the power supply transistor 12 is turned off to perform the standby operation. In a case where returning from the standby operation, the semiconductor circuit 1 is then able to cause the SRAM circuit 30 to store the information stored in the ferroelectric-gate transistors 41P and 51P. This allows the semiconductor circuit 1 to return, in a short time, the state of each memory cell MC1 to the state in which the power supply has not yet been stopped after the power supply is restarted.

The driving section 22 applies signals AWL to the word lines WL, applies the signals STORE1 to the control lines CL1, applies the signals STORE2 to the control lines CL2, applies the signals RESTORE1 to the control lines CL3, applies the signals RESTORE2 to the control lines CL4, and applies the signals CTRL to the control lines CL5 on the basis of control signals supplied from the control section 11.

The driving section 23 writes information to the memory cell array 21 via the bit lines BLT and BLB on the basis of control signals and data supplied from the control section 11. In addition, the driving section 23 reads information from the memory cell array 21 via the bit lines BLT and BLB on the basis of control signals supplied from the control section 11, and supplies the read information to the control section 11.

Here, the inverter IV1 corresponds to a specific example of the "first circuit" in the present disclosure. The inverter IV2 corresponds to a specific example of the "second circuit" in the present disclosure. The ferroelectric-gate transistor 41P corresponds to a specific example of the "first transistor" in the present disclosure. The transistor 46 corresponds to a specific example of the "second transistor" in the present disclosure. The transistor 42 corresponds to a specific example of the "third transistor" in the present disclosure. The transistor 47 corresponds to a specific example of the "fourth transistor" in the present disclosure. The ferroelectric-gate transistor 51P corresponds to a specific example of the "fifth transistor" in the present disclosure. The transistor 56 corresponds to a specific example of the "sixth transistor" in the present disclosure. The transistor 52 corresponds to a specific example of the "seventh transistor" in the present disclosure. The transistor 43 and the inverter IV3 correspond to specific examples of the "voltage setting circuit" in the present disclosure. The voltage VM corresponds to a specific example of the "first voltage" in the present disclosure. The voltage VP corresponds to a specific example of the "second voltage" in the present disclosure.

[Operation and Workings]

Next, the operation and workings of the semiconductor circuit 1 according to the present embodiment are described.

(Overview of Overall Operation)

With reference to FIGS. 1 to 3, the overview of the overall operation of semiconductor circuit 1 is first described. The control section 11 controls the operation of the memory circuit 20. Specifically, the control section 11 writes information to the memory circuit 20 on the basis of a write command and write data supplied from the outside, and reads information from the memory circuit 20 on the basis of a read command supplied from the outside. In addition, the control section 11 controls power supply to the memory circuit 20 by supplying a power supply control signal SPG to the power supply transistor 12 to turn on and off the power supply transistor 12. In addition, the voltage generator 13 of the control section 11 generates the voltages V1 and V2. The power supply transistor 12 performs an on/off operation on the basis of a control signal supplied from the control section 11. Turning on the power supply transistor 12 then causes the memory circuit 20 to be supplied with the power supply voltage VDD1 as the power supply voltage VDD. The driving section 22 of the memory circuit 20 applies signals AWL to the word lines WL, applies the signals STORE1 to the control lines CL1, applies the signals STORE2 to the control lines CL2, applies the signals RESTORE1 to the control lines CL3, applies the signals RESTORE2 to the control lines CL4, and applies the signals CTRL to the control lines CL5 on the basis of control signals supplied from the control section 11. In addition, the driving section 23 writes information to the memory cell array 21 via the bit lines BLT and BLB on the basis of control signals and data supplied from the control section 11. In addition, the driving section 23 reads information from the memory cell array 21 via the bit lines BLT and BLB on the basis of control signals supplied from the control section 11, and supplies the read information to the control section 11.

(Detailed Operation)

In a normal operation OP1, the semiconductor circuit 1 causes the SRAM circuit 30, which is a volatile memory, to store information. For example, in a case where the power supply transistor 12 is turned off to perform a standby operation OP3, the semiconductor circuit 1 then performs the store operation OP2 immediately before the standby operation OP3. This causes the ferroelectric-gate transistors 41P and 51P, which are nonvolatile memories, to store the information stored in the SRAM circuit 30, which is a volatile memory. In a case where the normal operation OP1 is performed after the standby operation OP3, the semiconductor circuit 1 then performs a restore operation OP4. This causes the SRAM circuit 30 to store the information stored in the ferroelectric-gate transistors 41P and 51P. The following describes this operation in detail.

FIG. 5 illustrates an operation example of the certain memory cell MC1 of interest in the semiconductor circuit 1. FIGS. 6A, 6B, 6C, and 6D each illustrate the state of the memory cell MC1. FIG. 6A illustrates a state in the normal operation OP1, and FIG. 6B illustrates a state in the store operation OP2. FIG. 6C illustrates a state in the standby operation OP3, and FIG. 6D illustrates a state in the restore operation OP4. FIGS. 6A, 6B, 6C, and 6D illustrate the inverters IV1 to IV4 by using symbols, and the transistors 42 to 47 and 52 to 57 by using switches corresponding to the operating states of the transistors.

(Normal Operation OP1)

The semiconductor circuit 1 performs the normal operation OP1 to write information to the SRAM circuit 30, which is a volatile memory, or read information from the SRAM circuit 30.

In the normal operation OP1, as illustrated in FIG. 5, the control section 11 sets the voltage of the power supply control signal SPG at a low level. This turns on the power supply transistor 12 (FIG. 1), and supplies the power supply voltage VDD to the memory circuit 20. In addition, as illustrated in FIG. 6A, the control section 11 sets the voltages V1 and V2 to the grounding voltage VSS. As illustrated in FIG. 6A, this supplies the inverters IV3 and IV4 with the grounding voltage VSS. As illustrated in FIG. 5, the driving section 22 sets the voltages of the signals STORE1, STORE2, and RESTORE1 at low levels. This turns off each of the transistors 42, 43, 46, 52, 53, and 56 as illustrated in FIG. 6A. In other words, the SRAM circuit 30 is electrically separated from the ferroelectric-gate transistors 41P and 51P and the inverters IV3 and IV4. In addition, as illustrated in FIG. 5, the driving section 22 sets the voltage of the signal RESTORE2 at a low level. This turns off each of the transistors 47 and 57 as illustrated in FIG. 6A. In addition, as illustrated in FIG. 5, the driving section 22 sets the voltage of the signal CTRL to a low-level voltage VL (e.g., "0 V").

In this normal operation OP1, information is written to the SRAM circuit 30 of the memory cell MC1, or information is read from the SRAM circuit 30. Specifically, in a case where information is written to the SRAM circuit 30, first, the driving section 23 applies, to the bit lines BLT and BLB, signals having mutually inverted voltage levels corresponding to the information to be written. The driving section 22 then sets the voltage of the signal AWL at a high level, thereby turning on the transistors 35 and 36 of the SRAM circuit 30. This causes information corresponding to the voltages of the bit lines BLT and BLB to be written to the SRAM circuit 30. In addition, in a case where information is read from the SRAM circuit 30, the driving section 23 pre-charges each of the bit lines BLT and BLB, for example, with a high-level voltage. Thereafter, the driving section 22 sets the voltage of the signal AWL at a high level, thereby turning on the transistors 35 and 36. This causes the voltage of one of the bit lines BLT and BLB to change in accordance with the information stored in the SRAM circuit 30. The driving section 23 then detects a difference between the voltages of the bit lines BLT and BLB, thereby reading the information stored in the SRAM circuit 30.

In this normal operation OP1, the transistors 42, 47, 52, and 57 are off as illustrated in FIG. 6A. This brings the gates of the ferroelectric-gate transistors 41P and 51P into the floating state, which maintains the threshold states of the ferroelectric-gate transistors 41P and 51P. In this example, the threshold state of the ferroelectric-gate transistor 41P is maintained in the low-threshold state VthL, and the threshold state of the ferroelectric-gate transistor 51P is maintained in the high-threshold state VthH.

(Store Operation OP2)

Next, the store operation OP2 is described. The semiconductor circuit 1 performs the store operation OP2 before performing the standby operation OP3, thereby causing the ferroelectric-gate transistors 41P and 51P to store the information stored in the SRAM circuit 30.

In the store operation OP2, the control section 11 sets the voltage V1 to the voltage VP (e.g., "3 V"), and sets the voltage V2 to the voltage VM (e.g., "−2 V"). As illustrated in FIG. 6B, this supplies the inverters IV3 and IV4 with the voltages VP and VM. As illustrated in FIG. 5, the driving section 22 sets the voltage of the signal AWL at a low level. This turns off the transistors 35 and 36. In addition, as illustrated in FIG. 5, the driving section 22 sets the voltages of the signals STORE1 and STORE2 at high levels in a predetermined length of period. As illustrated in FIG. 6B, this turns on each of the transistors 42, 43, 52, and 53. As a result, in the memory cell MC1, the threshold states of the ferroelectric-gate transistors 41P and 51P are set in accordance with the information stored in the SRAM circuit 30.

In this example, the voltage VN1 of the node N1 is a high-level voltage VH (e.g., "1 V"). This supplies the gate of the ferroelectric-gate transistor 41P with this high-level voltage VH via the transistor 42. In addition, the inverter IV3 outputs the voltage VM (e.g., "−2 V") on the basis of the high-level voltage VH supplied via the transistor 43. This supplies the back gate of the ferroelectric-gate transistor 41P with this voltage VM. Therefore, the voltage difference ΔV (=Vg−Vbg) between the voltage Vg of the gate and the voltage Vbg of the back gate of the ferroelectric-gate transistor 41P is set to a positive voltage difference (e.g., "3 V"). This voltage difference ΔV is a voltage difference enough to set the threshold state of the ferroelectric-gate transistor 41P to the high-threshold state VthH. Accordingly, the threshold state of the ferroelectric-gate transistor 41P is set to the high-threshold state VthH.

In addition, the voltage VN2 of the node N2 is the low-level voltage VL (e.g., "0 V"). This supplies the gate of the ferroelectric-gate transistor 51P with this low-level voltage VL via the transistor 52. In addition, the inverter IV4 outputs the voltage VP (e.g., "3 V") on the basis of the low-level voltage VL supplied via the transistor 53. This supplies the back gate of the ferroelectric-gate transistor 51P with this voltage VP. Therefore, the voltage difference ΔV (=Vg−Vbg) between the voltage Vg of the gate and the voltage Vbg of the back gate of the ferroelectric-gate transistor 51P is set to a negative voltage difference (e.g., "−3 V"). This voltage difference ΔV is a voltage difference enough to set the threshold state of the ferroelectric-gate transistor 51P to the low-threshold state VthL. Accordingly, the threshold state of the ferroelectric-gate transistor 51P is set to the low-threshold state VthL.

(Standby Operation OP3)

The semiconductor circuit 1 then turns off the power supply transistor 12 after the store operation OP2, thereby performing the standby operation OP3.

In the standby operation OP3, as illustrated in FIG. 5, the control section 11 sets the voltage of the power supply control signal SPG at a high level. This turns off the power supply transistor 12 (FIG. 1), and the power supply to the memory circuit 20 is stopped. This causes all the voltages of the signals STORE1, STORE2, RESTORE1, RESTORE2, and CTRL to be set at low levels. In addition, the control section 11 sets the voltages V1 and V2 to the grounding voltage VSS. As illustrated in FIG. 6C, this supplies the inverters IV3 and IV4 with the grounding voltage VSS. In this standby operation OP3, as illustrated in FIG. 6C, the threshold states of the ferroelectric-gate transistors 41P and 51P are maintained.

(Restore Operation OP4)

Next, the restore operation OP4 is described. In a case where the normal operation OP1 is performed after the standby operation OP3, the semiconductor circuit 1 performs a restore operation OP4. This causes the SRAM circuit 30 to store the information stored in the ferroelectric-gate transistors 41P and 51P.

In the restore operation OP4, as illustrated in FIG. 5, the control section 11 sets the voltage of the power supply control signal SPG at a low level. This turns on the power supply transistor 12 (FIG. 1), and supplies the power supply voltage VDD to the memory circuit 20. In addition, the control section 11 sets the voltages V1 and V2 to the grounding voltage VSS. As illustrated in FIG. 6D, this supplies the inverters IV3 and IV4 with the grounding voltage VSS. The driving section 22 has the voltages of the signals RESTORE1 and RESTORE2 set at high levels only for a predetermined length of period immediately after the power supply transistor 12 is turned on. As illustrated in FIG. 6D, this turns on each of the transistors 46, 47, 56, and 57 in this period. In other words, the SRAM circuit 30 is electrically coupled to the ferroelectric-gate transistors 41P and 51P in this period, and the gates of the ferroelectric-gate transistors 41P and 51P are concurrently grounded. In addition, as illustrated in FIG. 5, the driving section 22 sets the voltage of the signal CTRL to the low-level voltage VL (e.g., "0 V"). This causes the node N1 to be grounded via the ferroelectric-gate transistor 41P, and causes the node N2 to be grounded via the ferroelectric-gate transistor 51P. The threshold state of the ferroelectric-gate transistor 41P and the threshold state of the ferroelectric-gate transistor 51P are different from each other. Accordingly, the resistance value between the drain and source of the ferroelectric-gate transistor 41P and the resistance value between the drain and source of the ferroelectric-gate transistor 51P are different from each other. Therefore, in the memory cell MC1, the voltage state of the SRAM circuit 30 is determined in accordance with the threshold states of the ferroelectric-gate transistors 41P and 51P.

In this example, the threshold state of the ferroelectric-gate transistor 41P is the high-threshold state VthH, and the threshold state of the ferroelectric-gate transistor 51P is the low-threshold state VthL. This causes the node N1 to be pulled down with the high resistance value and causes the node N2 to be pulled down with the low resistance value. Accordingly, the voltage VN1 at the node N1 becomes the high-level voltage VH, and the voltage VN2 at the node N2 becomes the low-level voltage VL. In this manner, in the memory cell MC1, the SRAM circuit 30 stores information in accordance with the information stored in the ferroelectric-gate transistors 41P and 51P.

It should be noted that, in this example, the voltages of the signals RESTORE1 and RESTORE2 are set at high levels only for a predetermined length of period immediately after the power supply transistor 12 is turned on, but this is not limitative. Instead, for example, the voltages of the signals RESTORE1 and RESTORE2 may be set at high levels in advance even before the power supply transistor 12 is turned on.

Thereafter, the semiconductor circuit 1 performs the normal operation OP1 (FIG. 6A). After this, the semiconductor circuit 1 repeats the store operation OP2, the standby operation OP3, the restore operation OP4, and the normal operation OP1 in this order.

In a case where the standby operation OP3 is performed in this manner after the normal operation OP1, the semiconductor circuit 1 performs the store operation OP2, thereby causing the ferroelectric-gate transistors 41P and 51P, which are nonvolatile memories, to store the information stored in the SRAM circuit 30, which is a volatile memory. In a case where the semiconductor circuit 1 performs the normal operation OP1 after the standby operation OP3, the semiconductor circuit 1 then performs a restore operation OP4. This causes the SRAM circuit 30 to store the information stored in the ferroelectric-gate transistors 41P and 51P. This allows the semiconductor circuit 1 to return, in a short time, the state of each memory cell MC1 to the state in which the power supply has not yet been stopped after the power supply is restarted.

In addition, the semiconductor circuit 1 is provided with the ferroelectric-gate transistors 41P and 51P, and the inverters IV3 and IV4. When the store operation OP2 is performed, as illustrated in FIG. 6B, the node N1 is coupled to the gate of the ferroelectric-gate transistor 41P and the input terminal of the inverter IV3, and the node N2 is coupled to the gate of the ferroelectric-gate transistor 51P and the input terminal of the inverter IV4. This prevents store currents from flowing from the SRAM circuit 30 to the ferroelectric-gate transistors 41P and 51P in the store operation OP2 when information is stored in the ferroelectric-gate transistors 41P and 51P. Accordingly, it is possible to reduce the possibility of occurrence of so-called disturbance.

In other words, for example, in the technique described in PTL 1, when information is stored in a magnetic tunnel junction (MTJ) element, a store current flows from the SRAM circuit to the magnetic tunnel junction element. This causes the information stored in the SRAM circuit to be lost, which may cause so-called disturbance. In addition, in a case where the size of the transistors of the SRAM circuit is increased to avoid this, the area of the semiconductor circuit becomes large.

Meanwhile, the semiconductor circuit 1 according to the present embodiment causes the ferroelectric-gate transistors 41P and 51P to store information. Especially in this example, the voltages Vg of the gates and the voltages Vbg of the back gates of the ferroelectric-gate transistors 41P and 51P are set, thereby causing the ferroelectric-gate transistors 41P and 51P to store information. This prevents a store current from flowing to the SRAM circuit 30 in the semiconductor circuit 1 in the store operation OP2. Accordingly, it is possible to reduce the possibility of occurrence of disturbance. In addition, the store current does not flow in the store operation OP2 in this manner, which makes it possible to reduce the power consumption.

It should be noted that the ferroelectric-gate transistor may be able to be rewritten fewer times (endurance) than another storage element in some cases. However, the semiconductor circuit 1 does not cause the ferroelectric-gate transistor to store information whenever information is written to the memory cell MC1, but causes the ferroelectric-gate transistor to store information whenever the standby operation OP3 is performed. Accordingly, this is not so problematic even in a case where the ferroelectric-gate transistor may be able to be rewritten fewer times.

Effects

As described above, in the present embodiment, information is stored in the ferroelectric-gate transistor. This prevents a steady-state current from flowing to the SRAM circuit in the store operation. Accordingly, it is possible to reduce the possibility of occurrence of disturbance. In addition, the steady-state current does not flow in this manner, which makes it possible to reduce power consumption.

[Modification 1-1]

In the embodiment described above, as illustrated in FIG. 5, the driving section 22 sets the voltage of the signals CTRL in the control lines CL5 to the low-level voltage VL (e.g., "0 V") in the normal operation OP1, the store operation OP2, and the standby operation OP3, but this is not limitative. Instead, for example, the driving section 22 may set the control lines CL5 in the floating state in the normal operation OP1, the store operation OP2, and the standby operation OP3.

[Modification 1-2]

In the embodiment described above, the control lines CL1 to CL5 are provided as illustrated in FIGS. 2 and 3, but this is not limitative. Instead, the control lines CL2 and CL4 may be omitted, for example, like a memory cell MC1B of a semiconductor circuit 1B illustrated in FIG. 7. In this example, in the memory cell MC1B, the gates of the transistors 42, 43, 52, and 53 are coupled to the control lines CL1, and the gates of the transistors 46, 47, 56, and 57 are coupled to the control lines CL3. In this case, as illustrated in FIG. 8, a driving section 22B of this semiconductor circuit 1B supplies the signals STORE1 to the gates of the transistors 42, 43, 52, and 53, and supplies the signals RESTORE2 to the gates of the transistors 46, 47, 56, and 57. In other words, in the semiconductor circuit 1 according to the embodiment described above, as illustrated in FIG. 5, the signals STORE1 and STORE2 are the same, and the signals RESTORE1 and RESTORE2 are the same. Accordingly, the signals STORE2 and the signals RESTORE2 are omitted in the semiconductor circuit 1B according to the present modification.

[Modification 1-3]

Although the P-type ferroelectric-gate transistors 41P and 51P are used in the embodiment described above, this is not limitative. Instead, for example, N-type ferroelectric-gate transistors may be used. The following describes a semiconductor circuit 1C according to the present modification in detail.

The semiconductor circuit 1C includes a memory circuit 20C. The memory circuit 20C includes a memory cell array 21C in which memory cells MC1C are arranged in a matrix.

FIG. 9 illustrates a configuration example of the memory cell MC1C. The memory cell MC1C includes ferroelectric-gate transistors 41N and 51N. The ferroelectric-gate transistors 41N and 51N are N-type ferroelectric-gate field-effect transistors (FeFET).

FIG. 10 illustrates a configuration example of the ferroelectric-gate transistor 41N. It should be noted that the same applies to the ferroelectric-gate transistor 51N. The ferroelectric-gate transistor 41N includes semiconductor layers 96N, 97P, 92N, and 93N, a gate insulating film 98, and a gate electrode 99. The semiconductor layer 96N is an N-type semiconductor layer and is formed on the surface of the semiconductor substrate 90P. For example, the power supply voltage VDD is applied to this semiconductor layer 96N. The semiconductor layer 97P is a P-type semiconductor layer and is formed on the surface of the semiconductor layer 96N. The semiconductor layer 97P functions as a so-called back gate of the ferroelectric-gate transistor 41N, and is electrically insulated from the semiconductor substrate 90P. The semiconductor layers 92N and 93N are N-type semiconductor layers (diffusion layers) and are formed on the surface of the semiconductor layer 97P to be spaced apart from each other. The semiconductor layer 92N functions as the source of the ferroelectric-gate transistor 41N, and the semiconductor layer 93N functions as the drain of the ferroelectric-gate transistor 41N. The gate insulating film 98 and the gate electrode 99 are formed in this order on the surface of a portion of the semiconductor layer 97P sandwiched between the semiconductor layer 92N and the semiconductor layer 93N. The gate insulating film 98 includes a ferroelectric material. In other words, in the ferroelectric-gate transistor 41N, a so-called gate oxide film in an N-type MOS transistor is replaced with the gate insulating film 948 including a ferroelectric material.

With this configuration, for example, when the voltage difference $\Delta V$ (=Vg−Vbg) between the voltage Vg of the gate and the voltage Vbg of the back gate is set to a predetermined positive voltage difference, the ferroelectric is polarized in the gate insulating film 98 in accordance with the direction of the electric field, and the polarization state is maintained in the ferroelectric-gate transistor 41N. This predetermined positive voltage difference is, for example, a voltage of "+2.5 V" or more. As a result, a threshold Vth of the ferroelectric-gate transistor 41N becomes low (low-threshold state VthL).

In addition, for example, when the voltage difference $\Delta V$ (=Vg−Vbg) between the voltage Vg of the gate and the voltage Vbg of the back gate is set to a predetermined negative voltage difference, the ferroelectric is polarized in the gate insulating film 98 in accordance with the direction of the electric field, and the polarization state is maintained in the ferroelectric-gate transistor 41N. This predetermined negative voltage difference is, for example, a voltage of "−2.5 V" or less. The direction of the polarization vector at this time is opposite to the direction of the polarization vector in a case where the voltage difference $\Delta V$ is set to a predetermined positive voltage difference. This causes the threshold Vth of the ferroelectric-gate transistor 41N to be high (high-threshold state VthH).

As illustrated in FIG. 9, the gate of the ferroelectric-gate transistor 41N is coupled to the drains of the transistors 42 and 47. The source is coupled to the control lines CL5, and the drain is coupled to the drain of the transistor 46. The back gate is coupled to the drains of the transistors 44 and 45. In addition, the gate of the ferroelectric-gate transistor 51N is coupled to the drains of the transistors 52 and 57. The source is coupled to the control lines CL5, and the drain is coupled to the drain of the transistor 56. The back gate is coupled to the drains of the transistors 54 and 55.

In addition, in the memory cell MC1C, the source of the transistor 46 is coupled to the node N2, and the source of the transistor 56 is coupled to the node N1. In addition, the source of the transistor 47 is supplied with the power supply voltage VDD, and the source of the transistor 57 is supplied with the power supply voltage VDD.

Here, the ferroelectric-gate transistor 51N corresponds to a specific example of the "first transistor" in the present disclosure. The transistor 56 corresponds to a specific example of the "second transistor" in the present disclosure. The transistor 52 corresponds to a specific example of the "third transistor" in the present disclosure. The transistor 57 corresponds to a specific example of the "fourth transistor" in the present disclosure. The ferroelectric-gate transistor 41N corresponds to a specific example of the "fifth transistor" in the present disclosure. The transistor 46 corresponds to a specific example of the "sixth transistor" in the present disclosure. The transistor 42 corresponds to a specific example of the "seventh transistor" in the present disclosure. The transistor 53 and the inverter IV4 correspond to specific examples of the "voltage setting circuit" in the present disclosure.

FIGS. 11A, 11B, 11C, and 11D each illustrate the state of the memory cell MC1C. FIG. 11A illustrates a state in the normal operation OP1, and FIG. 11B illustrates a state in the store operation OP2. FIG. 11C illustrates a state in the standby operation OP3, and FIG. 11 D illustrates a state in the restore operation OP4.

(Normal Operation OP1)

In the normal operation OP1, as illustrated in FIG. 5, the control section 11 sets the voltage of the power supply control signal SPG at a low level. This turns on the power supply transistor 12 (FIG. 1), and supplies the power supply voltage VDD to the memory circuit 20C. In addition, as illustrated in FIG. 11A, the control section 11 sets the voltages V1 and V2 to the grounding voltage VSS. As illustrated in FIG. 11A, this supplies the inverters IV3 and IV4 with the grounding voltage VSS. As illustrated in FIG. 5, the driving section 22 sets the voltages of the signals STORE1, STORE2, and RESTORE1 at low levels. This turns off each of the transistors 42, 43, 46, 52, 53, and 56 as illustrated in FIG. 11A. In other words, the SRAM circuit 30 is electrically separated from the ferroelectric-gate transistors 41N and 51N and the inverters IV3 and IV4. In addition, as illustrated in FIG. 5, the driving section 22 sets the voltage of the signal RESTORE2 at a low level. This turns off each of the transistors 47 and 57 as illustrated in FIG. 11A. In addition, as illustrated in FIG. 5, the driving section 22 sets the voltage of the signal CTRL to the low-level voltage VL (e.g., "0 V"). In this example, the threshold state of the ferroelectric-gate transistor 41N is maintained in the high-threshold state VthH, and the threshold state of the ferroelectric-gate transistor 51N is maintained in the low-threshold state VthL.

(Store Operation OP2)

In the store operation OP2, the control section 11 sets the voltage V1 to the voltage VP (e.g., "3 V"), and sets the voltage V2 to the voltage VM (e.g., "−2 V"). As illustrated in FIG. 11B, this supplies the inverters IV3 and IV4 with the voltages VP and VM. As illustrated in FIG. 5, the driving section 22 sets the voltage of the signal AWL at a low level. This turns off the transistors 35 and 36. In addition, as illustrated in FIG. 5, the driving section 22 sets the voltages of the signals STORE1 and STORE2 at high levels in a predetermined length of period. As illustrated in FIG. 11B, this turns on each of the transistors 42, 43, 52, and 53.

In this example, the voltage VN1 of the node N1 is the high-level voltage VH (e.g., "1 V"). This supplies the gate of the ferroelectric-gate transistor 41N with this high-level voltage VH via the transistor 42. In addition, the inverter IV3 outputs the voltage VM (e.g., "−2 V") on the basis of the high-level voltage VH supplied via the transistor 43. This supplies the back gate of the ferroelectric-gate transistor 41N with this voltage VM. Therefore, the voltage difference ΔV (=Vg−Vbg) between the voltage Vg of the gate and the voltage Vbg of the back gate of the ferroelectric-gate transistor 41N is set to a positive voltage difference (e.g., "3 V"). This voltage difference ΔV is a voltage difference enough to set the threshold state of the ferroelectric-gate transistor 41N to the low-threshold state VthL. Accordingly, the threshold state of the ferroelectric-gate transistor 41N is set to the low-threshold state VthL.

In addition, the voltage VN2 of the node N2 is the low-level voltage VL (e.g., "0 V"). This supplies the gate of the ferroelectric-gate transistor 51N with this low-level voltage VL via the transistor 52. In addition, the inverter IV4 outputs the voltage VP (e.g., "3 V") on the basis of the low-level voltage VL supplied via the transistor 53. This supplies the back gate of the ferroelectric-gate transistor 51N with this voltage VP. Therefore, the voltage difference ΔV (=Vg−Vbg) between the voltage Vg of the gate and the voltage Vbg of the back gate of the ferroelectric-gate transistor 51N is set to a negative voltage difference (e.g., "−3 V"). This voltage difference ΔV is a voltage difference enough to set the threshold state of the ferroelectric-gate transistor 51N to the high-threshold state VthH. Accordingly, the threshold state of the ferroelectric-gate transistor 51N is set to the high-threshold state VthH.

(Standby Operation OP3)

In the standby operation OP3, as illustrated in FIG. 5, the control section 11 sets the voltage of the power supply control signal SPG at a high level. This turns off the power supply transistor 12 (FIG. 1), and the power supply to the memory circuit 20C is stopped. This causes all the voltages of the signals STORE1, STORE2, RESTORE1, RESTORE2, and CTRL to be set at low levels. In addition, the control section 11 sets the voltages V1 and V2 to the grounding voltage VSS. As illustrated in FIG. 11C, this supplies the inverters IV3 and IV4 with the grounding voltage VSS. In this standby operation OP3, as illustrated in FIG. 11C, the threshold states of the ferroelectric-gate transistors 41N and 51N are maintained.

(Restore Operation OP4)

In the restore operation OP4, as illustrated in FIG. 5, the control section 11 sets the voltage of the power supply control signal SPG at a low level. This turns on the power supply transistor 12 (FIG. 1), and supplies the power supply voltage VDD to the memory circuit 20C. In addition, the control section 11 sets the voltages V1 and V2 to the grounding voltage VSS. As illustrated in FIG. 11D, this supplies the inverters IV3 and IV4 with the grounding voltage VSS. The driving section 22 has the voltages of the signals RESTORE1 and RESTORE2 set at high levels only for a predetermined length of period immediately after the power supply transistor 12 is turned on. As illustrated in FIG. 11D, this turns on each of the transistors 46, 47, 56, and 57 in this period. In other words, the SRAM circuit 30 is electrically coupled to the ferroelectric-gate transistors 41N and 51N in this period, and the gates of the ferroelectric-gate transistors 41N and 51N are concurrently supplied with the power supply voltage VDD. In addition, as illustrated in FIG. 5, the driving section 22 sets the voltage of the signal CTRL to the low-level voltage VL (e.g., "0 V"). This causes the node N1 to be grounded via the ferroelectric-gate transistor 51N, and causes the node N2 to be grounded via the ferroelectric-gate transistor 41N.

In this example, the threshold state of the ferroelectric-gate transistor 41N is the low-threshold state VthL, and the threshold state of the ferroelectric-gate transistor 51N is the high-threshold state VthH. This causes the node N1 to be pulled down with the high resistance value and causes the node N2 to be pulled down with the low resistance value. Accordingly, the voltage VN1 at the node N1 becomes the high-level voltage VH, and the voltage VN2 at the node N2 becomes the low-level voltage VL.

[Modification 1-4]

Although the power supply transistor 12 is configured by using a P-type MOS transistor in the embodiment described above, this is not limitative. Instead, for example, an N-type MOS transistor may be used to configure the power supply transistor like a semiconductor circuit 1D as illustrated in FIG. 12. The semiconductor circuit 1D includes a control section 11D, a power supply transistor 12D, and a memory circuit 20D. The control section 11D generates a power supply control signal SPGD. In this example, the power supply transistor 12D is an N-type MOS transistor, the gate is supplied with the power supply control signal SPGD, the drain is coupled to the memory circuit 20D, and the source is supplied with the grounding voltage VSS1. With this configuration, in the semiconductor circuit 1D, the power supply transistor 12D is turned on, and the power grounding VSS1 is supplied to the memory circuit 20D as the grounding voltage VSS in a case where the memory circuit 20D is operated. In addition, in the semiconductor circuit 1D, the power supply transistor 12D is turned off in a case where the memory circuit 20D is not operated.

The memory circuit 20D includes a memory cell array 21D and a driving section 22D. The memory cell array 21D includes a memory cell MC1D. In the memory cell MC1D, the source of the transistor 46 is coupled to the node N2, and the source of the transistor 56 is coupled to the node N1 as illustrated in FIG. 13. As illustrated in FIG. 14, in the restore operation OP4, the driving section 22D sets the voltage of the signal CTRL to the high-level voltage VH.

[Modification 1-5]

Although the one power supply transistor 12 is provided in the embodiment described above, this is not limitative. Instead, for example, a plurality of power supply transistors may be provided like a semiconductor circuit 1E illustrated in FIG. 15. The semiconductor circuit 1E includes a control section 11E, a plurality of power supply transistors 121, 122, and . . . , and a memory circuit 20E. The control section 11E respectively supplies a plurality of power supply control signals SPG1, SPG2, . . . to the plurality of power supply transistors 121, 122, . . . , and turns on and off each of the plurality of power supply transistors 121, 122, . . . , thereby controlling the power supply to the memory circuit 20E. The plurality of power supply transistors 121, 122, . . . are provided, for example, in association with a plurality of banks in the memory circuit 20E. This makes it possible in the semiconductor circuit 1E to control the power supply in units of banks of the memory circuit 20E.

[Modification 1-6]

In the embodiment described above, for example, the transistors 42, 43, 46, 47, 52, 53, 56, and 57 are configured by using N-type MOS transistors, but this is not limitative. Instead, a portion or all of these transistors may be configured by using P-type MOS transistors.

[Modification 1-7]

Although the ferroelectric-gate transistors 41P and 51P are used as nonvolatile memories in the embodiment described above, this is not limitative. It is possible to use various transistors for which thresholds are settable.

[Other Modifications]

In addition, two or more of these modifications may be combined.

2. Second Embodiment

Next, a semiconductor circuit 2 according to a second embodiment is described. The method of applying voltages to the back gates of the ferroelectric-gate transistors 41P and 51P in the present embodiment differs from that of the first embodiment. It should be noted that components that are substantially the same as those of the semiconductor circuit 1 according to the first embodiment described above are denoted by the same reference numerals, and descriptions thereof are omitted as appropriate.

FIG. 16 illustrates a configuration example of the semiconductor circuit 2. The semiconductor circuit 2 includes a memory circuit 60. The memory circuit 60 includes a memory cell array 61 and a driving section 62. In this example, the voltage generator 13 of the control section 11 supplies the generated voltages V1 and V2 to the driving section 62. In the memory cell array 61, memory cells MC2 are arranged in a matrix.

FIG. 17 illustrates a configuration example of the memory cell MC2. FIG. 18 illustrates a configuration example of the memory cell array 61. The memory cell array 61 includes the plurality of word lines WL, the plurality of bit lines BLT, the plurality of bit lines BLB, the plurality of control lines CL1, a plurality of control lines CL6, the plurality of control lines CL3, the plurality of control lines CL4, and the plurality of control lines CL5. The control lines CL6 extend in the horizontal direction of FIGS. 17 and 18, and one end of each control line CL6 is coupled to the driving section 62. A signal STORE3 is applied to this control line CL6 by the driving section 62.

The memory cell MC2 includes the SRAM circuit 30, the ferroelectric-gate transistors 41P and 51P, and the transistors 42, 46, 47, 52, 56, and 57. The back gates of the ferroelectric-gate transistors 41P and 51P are coupled to the control lines CL6. In other words, the memory cell MC2 is obtained by omitting the transistors 43 to 45 and 53 to 55, and coupling the back gates of the ferroelectric-gate transistors 41P and 51P to the control lines CL6 in the memory cell MC1 according to the first embodiment (FIG. 2).

The driving section 62 applies signals AWL to the word lines WL, applies the signals STORE1 to the control lines CL1, applies the signals STORE3 to the control lines CL6, applies the signals RESTORE1 to the control lines CL3, applies the signals RESTORE2 to the control lines CL4, and applies the signals CTRL to the control lines CL5 on the basis of control signals supplied from the control section 11.

As illustrated in FIG. 18, the driving section 62 includes transistors 63 and 64. The transistor 63 is a P-type MOS transistor, the gate is supplied with the signal STORE4, the source is supplied with the voltage V1, and the drain is coupled to the control lines CL6. The transistor 64 is an N-type MOS transistor, the gate is supplied with the signal STORE4, the drain is coupled to the control lines CL6, and the source is supplied with the voltage V2. These transistors 63 and 64 are included in an inverter, and the driving section 62 uses this inverter to drive the control lines CL6.

Here, the ferroelectric-gate transistor 41P corresponds to a specific example of the "first transistor" in the present disclosure. The transistor 46 corresponds to a specific example of the "second transistor" in the present disclosure. The transistor 42 corresponds to a specific example of the "third transistor" in the present disclosure. The transistor 47 corresponds to a specific example of the "fourth transistor" in the present disclosure. The ferroelectric-gate transistor 51P corresponds to a specific example of the "fifth transistor" in the present disclosure. The transistor 56 corresponds to a specific example of the "sixth transistor" in the present disclosure. The transistor 52 corresponds to a specific example of the "seventh transistor" in the present disclosure.

FIG. 19 illustrates an operation example of the certain memory cell MC2 of interest in the semiconductor circuit 2. FIGS. 20A, 20B, 20C, 20D, and 20E each illustrate the operating state of the memory cell MC2. FIG. 20A illustrates the state in the normal operation OP1. FIGS. 20B and 20C each illustrate the state in the store operation OP2. FIG. 20D illustrates the state in the standby operation OP3. FIG. 20E illustrates the state in the restore operation OP4. FIGS. 20A, 20B, 20C, 20D, and 20E also each illustrate the transistors 63 and 64 in the driving section 62.

(Normal Operation OP1)

In the normal operation OP1, as illustrated in FIG. 19, the control section 11 sets the voltage of the power supply control signal SPG at a low level. This turns on the power supply transistor 12 (FIG. 16), and supplies the power supply voltage VDD to the memory circuit 60. In addition, the control section 11 sets the voltages V1 and V2 to the grounding voltage VSS. As illustrated in FIG. 20A, this supplies the sources of the transistors 63 and 64 with the grounding voltages VSS. As illustrated in FIG. 19, the driving section 62 sets the voltage of the signal STORE4 at a low level. In addition, as illustrated in FIG. 19, the driving section 62 sets the voltages of the signals STORE1 and RESTORE1 at low levels. This turns off each of the transistors 42, 46, 52, and 56 as illustrated in FIG. 20A. In other words, the SRAM circuit 30 is electrically separated from the ferroelectric-gate transistors 41P and 51P. In addition, as illustrated in FIG. 19, the driving section 62 sets the voltage of the signal RESTORE2 at a low level. This turns off each of the transistors 47 and 57 as illustrated in FIG. 20A. In addition, as illustrated in FIG. 19, the driving section 62 sets the voltage of the signal CTRL to the low-level voltage VL (e.g., "0 V").

In this normal operation OP1, information is written to the SRAM circuit 30 of the memory cell MC2, or information is read from the SRAM circuit 30. As illustrated in FIG. 20A, the transistors 42, 47, 52, and 57 are off. This brings the gates of the ferroelectric-gate transistors 41P and 51P into the floating state, which maintains the threshold states of the ferroelectric-gate transistors 41P and 51P.

(Store Operation OP2)

In the store operation OP2, the control section 11 sets the voltage V1 to the voltage VP (e.g., "3 V"), and sets the voltage V2 to the voltage VM (e.g., "−2 V"). As illustrated in FIGS. 20B and 20C, this supplies the source of the transistor 63 with the voltage VP, and supplies the source of the transistor 64 with the voltage VM. As illustrated in FIG. 19, the driving section 62 sets the voltage of the signal STORE1 at a high level. As illustrated in FIGS. 20B and 20C, this turns on each of the transistors 42 and 52.

In this store operation OP2, each memory cell MC2 causes the ferroelectric-gate transistors 41P and 51P to store the information stored in the SRAM circuit 30 by using two steps. First, as illustrated in FIG. 19, the driving section 62 sets the voltage of the signal STORE4 at a high level in a first step, and sets the voltage of the signal STORE4 at a low level in a second step. This causes the threshold states of the ferroelectric-gate transistors 41P and 51P to be set in accordance with the information stored in the SRAM circuit 30.

Specifically, in the first step, the driving section 62 sets the voltage of the signal STORE4 at a high level, thereby turning on the transistor 64 and turning off the transistor 63 as illustrated in FIG. 20B. As a result, the voltages Vbg of the back gates of the ferroelectric-gate transistors 41P and 51P become the voltages VM (e.g., "−2 V"). This causes the threshold state of any one of the ferroelectric-gate transistors 41P and 51P to change.

In this example, the voltage VN1 of the node N1 is the high-level voltage VH (e.g., "1 V"). This supplies the gate of the ferroelectric-gate transistor 41P with the high-level voltage VH via the transistor 42. The back gate of the ferroelectric-gate transistor 41P is supplied with the voltage VM (e.g., "−2 V"). Accordingly, the voltage difference ΔV (=Vg−Vbg) between the voltage Vg of the gate and the voltage Vbg of the back gate of the ferroelectric-gate transistor 41P is set to a positive voltage difference (e.g., "3 V"). This voltage difference ΔV is a voltage difference enough to set the threshold state of the ferroelectric-gate transistor 41P to the high-threshold state VthH. Accordingly, the threshold state of the ferroelectric-gate transistor 41P is set to the high-threshold state VthH. Meanwhile, the voltage VN2 of the node N2 is the low-level voltage VL (e.g., "0 V"). This supplies the gate of the ferroelectric-gate transistor 51P with the low-level voltage VL via the transistor 52. The back gate of the ferroelectric-gate transistor 51P is supplied with the voltage VM (e.g., "−2 V"). Accordingly, the voltage difference ΔV (=Vg−Vbg) between the voltage Vg of the gate and the voltage Vbg of the back gate of the ferroelectric-gate transistor 51P is set to a positive voltage difference (e.g., "2 V"). This voltage difference ΔV is a voltage difference insufficient to set the threshold state of the ferroelectric-gate transistor 51P to the high-threshold state VthH. However, the threshold state of the ferroelectric-gate transistor 51P has already been set to the high-threshold state VthH, and the threshold state is thus to be maintained in the high-threshold state VthH.

Next, in the second step, the driving section 62 sets the voltage of the signal STORE4 at a low level, thereby turning on the transistor 63 and turning off the transistor 64 as illustrated in FIG. 20C. As a result, the voltages Vbg of the back gates of the ferroelectric-gate transistors 41P and 51P become the voltages VP (e.g., "3 V"). This causes a change in the threshold state of the ferroelectric-gate transistor of the ferroelectric-gate transistors 41P and 51P whose threshold state has not changed in the first step.

In this example, the gate of the ferroelectric-gate transistor 41P is supplied with the high-level voltage VH (e.g., "1 V"), and the back gate of the ferroelectric-gate transistor 41P is supplied with the voltage VP (e.g., "3 V"). Therefore, the voltage difference ΔV (=Vg−Vbg) between the voltage Vg of the gate and the voltage Vbg of the back gate of the ferroelectric-gate transistor 41P is set to a negative voltage difference (e.g., "−2 V"). However, this voltage difference ΔV is a voltage difference insufficient to set the threshold state of the ferroelectric-gate transistor 41P to the low-threshold state VthL. Accordingly, the threshold state of the ferroelectric-gate transistor 41P is maintain in the high-threshold state VthH. Meanwhile, the gate of the ferroelectric-gate transistor 51P is supplied with the low-level voltage VL (e.g., "0 V"), and the back gate of the ferroelectric-gate transistor 51P is supplied with the voltage VP (e.g., "3 V"). Therefore, the voltage difference ΔV (=Vg−Vbg) between the voltage Vg of the gate and the voltage Vbg of the back gate of the ferroelectric-gate transistor 51P is set to a negative voltage difference (e.g., "−3 V"). This voltage difference ΔV is a voltage difference enough to set the threshold state of the ferroelectric-gate transistor 51P to the low-threshold state VthL. Accordingly, the threshold state of the ferroelectric-gate transistor 51P is set to the low-threshold state VthL.

(Standby Operation OP3)

In the standby operation OP3, as illustrated in FIG. 19, the control section 11 sets the voltage of the power supply control signal SPG at a high level. This turns off the power supply transistor 12 (FIG. 16), and the power supply to the memory circuit 60 is stopped. In this standby operation OP3, as illustrated in FIG. 20D, the threshold states of the ferroelectric-gate transistors 41P and 51P are maintained.

(Restore Operation OP4)

In the restore operation OP4, as illustrated in FIG. 19, the control section 11 sets the voltage of the power supply control signal SPG at a low level. This turns on the power supply transistor 12 (FIG. 16), and supplies the power supply voltage VDD to the memory circuit 60. In addition, the control section 11 sets the voltages V1 and V2 to the grounding voltage VSS. As illustrated in FIG. 20E, this supplies the sources of the transistors 63 and 64 with the grounding voltages VSS. As illustrated in FIG. 19, the driving section 62 sets the voltage of the signal STORE4 at a low level. In addition, the driving section 62 has the voltages of the signals RESTORE1 and RESTORE2 set at high levels only for a predetermined length of period immediately after the power supply transistor 12 is turned on. As illustrated in FIG. 20E, this turns on each of the transistors 46, 47, 56, and 57 in this period. In other words, the SRAM circuit 30 is electrically coupled to the ferroelectric-gate transistors 41P and 51P in this period, and the gates of the ferroelectric-gate transistors 41P and 51P are concurrently grounded. In addition, as illustrated in FIG. 19, the driving section 62 sets the voltage of the signal CTRL to the low-level voltage VL (e.g., "0 V"). This causes the node N1 to be grounded via the ferroelectric-gate transistor 41P, and causes the node N2 to be grounded via the ferroelectric-gate transistor 51P. This causes the voltage state of the SRAM circuit 30 to be determined in accordance with the threshold states of the ferroelectric-gate transistors 41P and 51P.

In this example, the threshold state of the ferroelectric-gate transistor 41P is the high-threshold state VthH, and the threshold state of the ferroelectric-gate transistor 51P is the low-threshold state VthL. This causes the node N1 to be pulled down with the high resistance value and causes the node N2 to be pulled down with the low resistance value. Accordingly, the voltage VN1 at the node N1 becomes the high-level voltage VH, and the voltage VN2 at the node N2 becomes the low-level voltage VL. In this manner, in the memory cell MC2, the SRAM circuit 30 stores information in accordance with the information stored in the ferroelectric-gate transistors 41P and 51P.

In this manner, in the semiconductor circuit 2, the driving section 62 drives the back gates of the ferroelectric-gate transistors 41P and 51P via the control lines CL6. This makes it possible to simplify the configuration of each memory cell MC2. As a result, it is possible in the semiconductor circuit 2 to reduce the area of the semiconductor circuit.

In the present embodiment, the driving section drives the back gates of the ferroelectric-gate transistors. This makes it possible to simplify the configuration of the memory cell. Accordingly, it is possible to reduce the area of the semiconductor circuit.

The other effects are similar to those of the first embodiment.

[Modification 2-1]

Although the P-type ferroelectric-gate transistors 41P and 51P are used in the embodiment described above, this is not limitative. Instead, for example, the N-type ferroelectric-gate transistors 41N and 51N may be used. The following describes a semiconductor circuit 2A according to the present modification in detail.

The semiconductor circuit 2A includes a memory circuit 60C. The memory circuit 60C includes a memory cell array 61C in which memory cells MC2A are arranged in a matrix.

FIG. 21 illustrates a configuration example of the memory cell MC2A of the semiconductor circuit 2A. The memory cell MC2A includes the ferroelectric-gate transistors 41N and 51N. The gate of the ferroelectric-gate transistor 41N is coupled to the drains of the transistors 42 and 47. The source is coupled to the control lines CL5, and the drain is coupled to the drain of the transistor 46. The back gate is coupled to the control lines CL6. In addition, the gate of the ferroelectric-gate transistor 51N is coupled to the drains of the transistors 52 and 57. The source is coupled to the control lines CL5, and the drain is coupled to the drain of the transistor 56. The back gate is coupled to the control lines CL6.

In addition, in the memory cell MC2A, the source of the transistor 46 is coupled to the node N2, and the source of the transistor 56 is coupled to the node N1. In addition, the source of the transistor 47 is supplied with the power supply voltage VDD, and the source of the transistor 57 is supplied with the power supply voltage VDD.

Here, the ferroelectric-gate transistor 51N corresponds to a specific example of the "first transistor" in the present disclosure. The transistor 56 corresponds to a specific example of the "second transistor" in the present disclosure. The transistor 52 corresponds to a specific example of the "third transistor" in the present disclosure. The transistor 57 corresponds to a specific example of the "fourth transistor" in the present disclosure. The ferroelectric-gate transistor 41N corresponds to a specific example of the "fifth transistor" in the present disclosure. The transistor 46 corresponds to a specific example of the "sixth transistor" in the present disclosure. The transistor 42 corresponds to a specific example of the "seventh transistor" in the present disclosure.

FIGS. 22A, 22B, 22C, 22D, and 22E each illustrate the operating state of the memory cell MC2A. FIG. 22A illustrates the state in the normal operation OP1. FIGS. 22B and 22C each illustrate the state in the store operation OP2. FIG. 22D illustrates the state in the standby operation OP3. FIG. 22E illustrates the state in the restore operation OP4. FIGS. 22A, 22B, 22C, 22D, and 22E also each illustrate the transistors 63 and 64 in the driving section 62.

(Normal Operation OP1)

In the normal operation OP1, as illustrated in FIG. 19, the control section 11 sets the voltage of the power supply control signal SPG at a low level. This turns on the power supply transistor 12 (FIG. 16), and supplies the power supply voltage VDD to the memory circuit 60C. In addition, the control section 11 sets the voltages V1 and V2 to the grounding voltage VSS. As illustrated in FIG. 22A, this supplies the sources of the transistors 63 and 64 with the grounding voltages VSS. As illustrated in FIG. 19, the driving section 62 sets the voltage of the signal STORE4 at a low level. In addition, as illustrated in FIG. 19, the driving section 62 sets the voltages of the signals STORE1 and RESTORE1 at low levels. This turns off each of the transistors 42, 46, 52, and 56 as illustrated in FIG. 22A. In other words, the SRAM circuit 30 is electrically separated from the ferroelectric-gate transistors 41N and 51N. In addition, as illustrated in FIG. 19, the driving section 62 sets the voltage of the signal RESTORE2 at a low level. This turns off each of the transistors 47 and 57 as illustrated in FIG. 22A. In addition, as illustrated in FIG. 19, the driving section 62 sets the voltage of the signal CTRL to the low-level voltage VL (e.g., "0 V"). In this example, the threshold state of the ferroelectric-gate transistor 41N is maintained in the high-threshold state VthH, and the threshold state of the ferroelectric-gate transistor 51N is maintained in the low-threshold state VthL.

(Store Operation OP2)

In the store operation OP2, the control section 11 sets the voltage V1 to the voltage VP (e.g., "3 V"), and sets the voltage V2 to the voltage VM (e.g., "−2 V"). As illustrated in FIGS. 22B and 22C, this supplies the source of the transistor 63 with the voltage VP, and supplies the source of the transistor 64 with the voltage VM. As illustrated in FIG. 19, the driving section 62 sets the voltage of the signal STORE1 at a high level. As illustrated in FIGS. 22B and 22C, this turns on each of the transistors 42 and 52.

Then, in the first step, the driving section 62 sets the voltage of the signal STORE4 at a high level, thereby turning on the transistor 64 and turning off the transistor 63 as illustrated in FIG. 22B. As a result, the voltages Vbg of the back gates of the ferroelectric-gate transistors 41N and 51N become the voltages VM (e.g., "−2 V"). This causes the threshold state of any one of the ferroelectric-gate transistors 41N and 51N to change.

In this example, the voltage VN1 of the node N1 is the high-level voltage VH (e.g., "1 V"). This supplies the gate of the ferroelectric-gate transistor 41N with the high-level voltage VH via the transistor 42. The back gate of the ferroelectric-gate transistor 41N is supplied with the voltage VM (e.g., "−2 V"). Accordingly, the voltage difference ΔV (=Vg−Vbg) between the voltage Vg of the gate and the voltage Vbg of the back gate of the ferroelectric-gate transistor 41N is set to a positive voltage difference (e.g., "3 V"). This voltage difference ΔV is a voltage difference enough to set the threshold state of the ferroelectric-gate transistor 41N to the low-threshold state VthL. Accordingly, the threshold state of the ferroelectric-gate transistor 41N is set to the low-threshold state VthL. Meanwhile, the voltage VN2 of the node N2 is the low-level voltage VL (e.g., "0 V"). This supplies the gate of the ferroelectric-gate transistor 51N with the low-level voltage VL via the transistor 52. The back gate of the ferroelectric-gate transistor 51N is supplied with the voltage VM (e.g., "−2 V"). Accordingly, the voltage difference ΔV (=Vg−Vbg) between the voltage Vg of the gate and the voltage Vbg of the back gate of the ferroelectric-gate transistor 51N is set to a positive voltage difference (e.g., "2 V"). This voltage difference ΔV is a voltage difference insufficient to set the threshold state of the ferroelectric-gate transistor 51N to the low-threshold state VthL. However, the threshold state of the ferroelectric-gate transistor 51N has already been set to the low-threshold state VthL, and the threshold state is thus to be maintained in the low-threshold state VthL.

Next, in the second step, the driving section 62 sets the voltage of the signal STORE4 at a low level, thereby turning on the transistor 63 and turning off the transistor 64 as illustrated in FIG. 22C. As a result, the voltages Vbg of the back gates of the ferroelectric-gate transistors 41N and 51N become the voltages VP (e.g., "3 V"). This causes a change in the threshold state of the ferroelectric-gate transistor of the ferroelectric-gate transistors 41N and 51N whose threshold state has not changed in the first step.

In this example, the gate of the ferroelectric-gate transistor 41N is supplied with the high-level voltage VH (e.g., "1 V"), and the back gate of the ferroelectric-gate transistor 41N is supplied with the voltage VP (e.g., "3 V"). Therefore, the voltage difference ΔV (=Vg−Vbg) between the voltage Vg of the gate and the voltage Vbg of the back gate of the ferroelectric-gate transistor 41N is set to a negative voltage difference (e.g., "−2 V"). However, this voltage difference ΔV is a voltage difference insufficient to set the threshold state of the ferroelectric-gate transistor 41N to the high-threshold state VthH. Accordingly, the threshold state of the ferroelectric-gate transistor 41N is maintain in the low-threshold state VthL. Meanwhile, the gate of the ferroelectric-gate transistor 51N is supplied with the low-level voltage VL (e.g., "0 V"), and the back gate of the ferroelectric-gate transistor 51N is supplied with the voltage VP (e.g., "3 V"). Therefore, the voltage difference ΔV (=Vg−Vbg) between the voltage Vg of the gate and the voltage Vbg of the back gate of the ferroelectric-gate transistor 51N is set to a negative voltage difference (e.g., "−3 V"). This voltage difference ΔV is a voltage difference enough to set the threshold state of the ferroelectric-gate transistor 51N to the high-threshold state VthH. Accordingly, the threshold state of the ferroelectric-gate transistor 51N is set to the high-threshold state VthH.

(Standby Operation OP3)

In the standby operation OP3, as illustrated in FIG. 19, the control section 11 sets the voltage of the power supply control signal SPG at a high level. This turns off the power supply transistor 12 (FIG. 16), and the power supply to the memory circuit 60C is stopped. In this standby operation OP3, as illustrated in FIG. 22D, the threshold states of the ferroelectric-gate transistors 41N and 51N are maintained.

(Restore Operation OP4)

In the restore operation OP4, as illustrated in FIG. 19, the control section 11 sets the voltage of the power supply control signal SPG at a low level. This turns on the power supply transistor 12 (FIG. 16), and supplies the power supply voltage VDD to the memory circuit 60C. In addition, the control section 11 sets the voltages V1 and V2 to the grounding voltage VSS. As illustrated in FIG. 22E, this supplies the sources of the transistors 63 and 64 with the grounding voltages VSS. As illustrated in FIG. 19, the driving section 62 sets the voltage of the signal STORE4 at a low level. In addition, the driving section 62 has the voltages of the signals RESTORE1 and RESTORE2 set at high levels only for a predetermined length of period immediately after the power supply transistor 12 is turned on. As illustrated in FIG. 22E, this turns on each of the transistors 46, 47, 56, and 57 in this period. In other words, the SRAM circuit 30 is electrically coupled to the ferroelectric-gate transistors 41N and 51N in this period, and the gates of the ferroelectric-gate transistors 41N and 51N are concurrently supplied with the power supply voltage VDD. In addition, as illustrated in FIG. 19, the driving section 62 sets the voltage of the signal CTRL to the low-level voltage VL (e.g., "0 V"). This causes the node N1 to be grounded via the ferroelectric-gate transistor 51N, and causes the node N2 to be grounded via the ferroelectric-gate transistor 41N.

In this example, the threshold state of the ferroelectric-gate transistor 41N is the low-threshold state VthL, and the threshold state of the ferroelectric-gate transistor 51N is the high-threshold state VthH. This causes the node N1 to be pulled down with the high resistance value and causes the node N2 to be pulled down with the low resistance value. Accordingly, the voltage VN1 at the node N1 becomes the high-level voltage VH, and the voltage VN2 at the node N2 becomes the low-level voltage VL.

[Modification 2-2]

Each modification of the first embodiment described above may be applied to the semiconductor circuit 2 according to the embodiment described above.

3. Third Embodiment

Next, a semiconductor circuit 3 according to a third embodiment is described. In the present embodiment, one ferroelectric-gate transistor is provided to each memory cell. It should be noted that components that are substantially the same as those of the semiconductor circuit 1 according to the first embodiment described above are denoted by the same reference numerals, and descriptions thereof are omitted as appropriate.

As illustrated in FIG. 1, the semiconductor circuit 3 includes a control section 19 and a memory circuit 70.

The control section 19 includes a voltage generator 14. In a reset operation OP0 (described below) and the store operation OP2, the voltage generator 14 generates the voltage VP (e.g., "3 V") higher than the power supply voltage VDD (e.g., "1 V"), outputs this voltage VP as the voltage V1, generates the voltage VM (e.g., "−2 V") lower than the grounding voltage VSS ("0 V"), and outputs this voltage VM as the voltage V2.

The memory circuit 70 includes a memory cell array 71 and a driving section 72. In the memory cell array 71, memory cells MC3 are arranged in a matrix.

FIG. 23 illustrates a configuration example of the memory cell MC3. FIG. 24 illustrates a configuration example of the memory cell array 71. The memory cell array 71 includes the plurality of word lines WL, the plurality of bit lines BLT, the plurality of bit lines BLB, the plurality of control lines CL1, a plurality of control lines CL7, the plurality of control lines CL3, a plurality of control lines CL8, a plurality of control lines CL9, and the plurality of control lines CL5. The control lines CL7 extend in the horizontal direction of FIGS. 23 and 34, and one end of each control line CL7 is coupled to the driving section 72. A signal STORE5 is applied to this control line CL7 by the driving section 72. The control lines CL8 extend in the horizontal direction of FIGS. 23 and 34, and one end of each control line CL8 is coupled to the driving section 72. A signal RESET1 is applied to this control line CL8 by the driving section 72. The control lines CL9 extend in the horizontal direction of FIGS. 23 and 34, and one end of each control line CL9 is coupled to the driving section 72. A signal RESET2 is applied to this control line CL9 by the driving section 72.

The memory cell MC3 includes an SRAM circuit 80, the ferroelectric-gate transistor 41P, and the transistors 42, 44 to 46, and 87 to 89.

The SRAM circuit 80 includes transistors 81 to 84, 35, and 36. The transistors 81 to 84 respectively correspond to the transistors 31 to 34 in the embodiment described above. The transistors 81 and 82 are included in an inverter IV5, and the transistors 83 and 84 are included in an inverter IV6. In this example, a gate length L83 of the transistor 83 is made equal to a gate length L81 of the transistor 81, and a gate width W83 of the transistor 83 is made greater than a gate width W81 of the transistor 81 (W83>W81). In addition, a gate length L82 of the transistor 82 is made equal to a gate length L84 of the transistor 84, and a gate width W82 of the transistor 82 is made greater than a gate width W84 of the transistor 84 (W82>W84). This facilitates the inverter IV6 to output the high-level voltage VH and facilitates the inverter IV5 to output the low-level voltage VL immediately after the power supply is turned on.

In addition, in the memory cell MC3, as described below, the currents flowing from the transistor 83 of the inverter IV6 to the node N1 are larger than the currents flowing from the node N1 to the control lines CL5 in the restore operation OP4 in a case where the threshold state of the ferroelectric-gate transistor 41P is the high-threshold state VthH. The currents flowing from the transistor 83 of the inverter IV6 to the node N1 are smaller than the currents flowing from the node N1 to the control lines CL5 in a case where the threshold state of the ferroelectric-gate transistor 41P is the low-threshold state VthL.

The transistors 87 to 89 are N-type MOS transistors. The gate of the transistor 87 is coupled to the control lines CL7. The source is grounded, and the drain is coupled to the node N3. The gate of the transistor 88 is coupled to the control lines CL8. The source is supplied with the power supply voltage VDD, and the drain is coupled to a node N3. The gate of the transistor 89 is coupled to the control lines CL9. The source is coupled to the node N3, and the drain is coupled to the gate of the ferroelectric-gate transistor 41P and the drain of the transistor 42. The input terminal of the inverter IV3 including the transistors 44 and 45 is coupled to the node N3.

The driving section 72 applies signals AWL to the word lines WL, applies the signals STORE1 to the control lines CL1, applies the signals STORE5 to the control lines CL7, applies the signals RESTORE1 to the control lines CL3, applies the signals RESET1 to the control lines CL8, applies the signals RESET2 to the control lines CL9, and applies the signals CTRL to the control lines CL5 on the basis of control signals supplied from the control section 19.

Here, the ferroelectric-gate transistor 41P corresponds to a specific example of the "first transistor" in the present disclosure. The transistor 46 corresponds to a specific example of the "second transistor" in the present disclosure. The transistor 42 corresponds to a specific example of the "third transistor" in the present disclosure. The transistor 81 corresponds to a specific example of the "eighth transistor" in the present disclosure. The transistor 83 corresponds to a specific example of the "ninth transistor" in the present disclosure. The transistor 84 corresponds to a specific example of the "tenth transistor" in the present disclosure. The transistor 82 corresponds to a specific example of the "eleventh transistor" in the present disclosure. The transistors 87 to 89 and the inverter IV3 correspond to specific examples of the "control circuit" in the present disclosure. The transistor 89 corresponds to a specific example of the "fourth transistor" in the present disclosure. The inverter IV3 corresponds to a specific example of the "voltage setting circuit" in the present disclosure.

Similarly to the semiconductor circuit 1, in a normal operation OP1, the semiconductor circuit 3 causes the SRAM circuit 80, which is a volatile memory, to store information. Then, for example, in a case where the standby operation OP3 is performed by turning off the power supply transistor 12, the semiconductor circuit 3 first performs a reset operation OP0 and sets the threshold state of the ferroelectric-gate transistor 41P to the high-threshold state VthH. Then, performing the store operation OP2 immediately before the standby operation OP3 causes the ferroelectric-gate transistor 41P, which is a nonvolatile memory, to store the information stored in the SRAM circuit 80, which is a volatile memory. In a case where the normal operation OP1 is performed after the standby operation OP3, the semiconductor circuit 3 then performs the restore operation OP4. This causes the SRAM circuit 80 to store the information stored in the ferroelectric-gate transistor 41P. The following describes this operation in detail.

FIG. 25 illustrates an operation example of the certain memory cell MC3 of interest in the semiconductor circuit 3. FIGS. 26A, 26B, 27A, 27B, and 27C, 28A, 28B, and 28C each illustrate the operation state of the memory cell MC3. FIG. 26A illustrates the state in the reset operation OPO, and FIG. 26B illustrates the state in the normal operation OP1. FIGS. 27A, 27B, and 27C each illustrate the state in a case where the voltage VN1 at the node N1 is the low-level voltage VL (VN1=VL). FIG. 27A illustrates the state in the store operation OP2. FIG. 27B illustrates the state in the standby operation OP3. FIG. 27C illustrates the state in the restore operation OP4. FIGS. 28A, 28B, and 28C each illustrate the state in a case where the voltage VN1 at the node N1 is the high-level voltage VH (VN1=VH). FIG. 28A illustrates the state in the store operation OP2. FIG. 28B illustrates the state in the standby operation OP3. FIG. 28C illustrates the state in the restore operation OP4.

(Reset Operation OP0)

The semiconductor circuit 3 first performs the reset operation OP0, thereby resetting, in advance, the threshold state of the ferroelectric-gate transistor 41P to a predetermined resistance state (high-threshold state VthH in this example).

In the reset operation OP0, as illustrated in FIG. 25, the control section 19 sets the voltage of the power supply control signal SPG at a low level. This turns on the power supply transistor 12 (FIG. 1), and supplies the power supply voltage VDD to the memory circuit 70. In addition, the control section 19 sets the voltage V1 to the voltage VP (e.g., "3 V"), and sets the voltage V2 to the voltage VM (e.g., "−2 V"). As illustrated in FIG. 26A, this supplies the inverter IV3 with the voltages VP and VM. As illustrated in FIG. 25, the driving section 72 sets the voltages of the signals STORE1 and RESTORE1 at low levels. This turns off each of the transistors 42 and 46 as illustrated in FIG. 26A. In other words, the SRAM circuit 80 is electrically separated from the ferroelectric-gate transistor 41P. In addition, as illustrated in FIG. 25, the driving section 72 sets the voltage of the signal STORE5 at a low level. As illustrated in FIG. 26A, this turns off the transistor 87. In addition, as illustrated in FIG. 25, the driving section 72 sets the voltages of the signals RESET1 and RESET2 at high levels in a predetermined length of period. As illustrated in FIG. 26A, this turns on the transistors 88 and 89. In addition, as illustrated in FIG. 25, the driving section 72 sets the voltage of the signal CTRL to the low-level voltage VL (e.g., "0 V").

The gate of the ferroelectric-gate transistor 41P is supplied with the power supply voltage VDD (e.g., "1 V") via the transistors 88 and 89. In addition, the inverter IV3 outputs the voltage VM (e.g., "−2 V") on the basis of the high-level voltage VH (power supply voltage VDD) supplied via the transistor 88. This supplies the back gate of the ferroelectric-gate transistor 41P with this voltage VM. Therefore, the voltage difference ΔV (=Vg−Vbg) between the voltage Vg of the gate and the voltage Vbg of the back gate of the ferroelectric-gate transistor 41P is set to a positive voltage difference (e.g., "3 V"). This voltage difference ΔV is a voltage difference enough to set the threshold state of the ferroelectric-gate transistor 41P to the high-threshold state VthH. Accordingly, the threshold state of the ferroelectric-gate transistor 41P is set to the high-threshold state VthH.

(Normal Operation OP1)

In the normal operation OP1, the control section 19 sets the voltages V1 and V2 to the grounding voltages VSS. As illustrated in FIG. 26B, this supplies the inverter IV3 with the grounding voltage VSS. As illustrated in FIG. 25, the driving section 72 sets the voltages of the signals RESET1 and RESET2 at low levels. This turns off each of the transistors 88 and 89 as illustrated in FIG. 26B.

In this normal operation OP1, information is written to the SRAM circuit 80 of the memory cell MC3, or information is read from the SRAM circuit 80. At this time, as illustrated in FIG. 26B, the transistors 42 and 89 are off. This brings the gate of the ferroelectric-gate transistor 41P into the floating state, which maintains the threshold state of the ferroelectric-gate transistor 41P in the high-threshold state VthH.

(Store Operation OP2)

In the store operation OP2, the control section 19 sets the voltage V1 to the voltage VP (e.g., "3 V"), and sets the voltage V2 to the voltage VM (e.g., "−2 V"). As illustrated in FIGS. 27A and 28A, this supplies the inverter IV3 with the voltages VP and VM. As illustrated in FIG. 25, the driving section 72 sets the voltages of the signals STORE1 and STORE5 at high levels. As illustrated in FIGS. 27A and 28A, this turns on each of the transistors 42 and 87. As a result, in the memory cell MC3, the threshold state of the ferroelectric-gate transistor 41P is set in accordance with the information stored in the SRAM circuit 80.

Specifically, for example, as illustrated in FIG. 27A, in a case where the voltage VN1 at the node N1 is the low-level voltage VL (e.g., "0 V"), the gate of the ferroelectric-gate transistor 41P is supplied with this low-level voltage VL via the transistor 42. In addition, the inverter IV3 outputs the voltage VP (e.g., "3 V") on the basis of the low-level voltage VL (grounding voltage VSS) supplied via the transistor 87. This supplies the back gate of the ferroelectric-gate transistor 41P with this voltage VP. Therefore, the voltage difference ΔV (=Vg−Vbg) between the voltage Vg of the gate and the voltage Vbg of the back gate of the ferroelectric-gate transistor 41P is set to a negative voltage difference (e.g., "−3 V"). This voltage difference ΔV is a voltage difference enough to set the threshold state of the ferroelectric-gate transistor 41P to the low-threshold state VthL. Accordingly, the threshold state of the ferroelectric-gate transistor 41P is set to the low-threshold state VthL.

In addition, for example, as illustrated in FIG. 28A, in a case where the voltage VN1 at the node N1 is the high-level voltage VH (e.g., "1 V"), the gate of the ferroelectric-gate transistor 41P is supplied with this high-level voltage VH via the transistor 42. Meanwhile, the back gate of the ferroelectric-gate transistor 41P is supplied with the voltage VP (e.g., "3 V"). Therefore, the voltage difference ΔV (=Vg−Vbg) between the voltage Vg of the gate and the voltage Vbg of the back gate of the ferroelectric-gate transistor 41P is set to a negative voltage difference (e.g., "−2 V"). This voltage difference ΔV is a voltage difference insufficient to set the threshold state of the ferroelectric-gate transistor 41P to the low-threshold state VthL. Accordingly, the threshold state of the ferroelectric-gate transistor 41P is maintain in the high-threshold state VthH.

(Standby Operation OP3)

In the standby operation OP3, as illustrated in FIG. 25, the control section 19 sets the voltage of the power supply control signal SPG at a high level. This turns off the power supply transistor 12 (FIG. 1), and the power supply to the memory circuit 20 is stopped. In this standby operation OP3, as illustrated in FIGS. 27B and 28B, the threshold state of the ferroelectric-gate transistor 41P is maintained.

(Restore Operation OP4)

In the restore operation OP4, as illustrated in FIG. 25, the control section 19 sets the voltage of the power supply control signal SPG at a low level. This turns on the power supply transistor 12 (FIG. 1), and supplies the power supply voltage VDD to the memory circuit 70. In addition, the control section 19 sets the voltages V1 and V2 to the grounding voltage VSS. As illustrated in FIGS. 27C and 28C, this supplies the inverter IV3 with the grounding voltage VSS. The driving section 72 has the voltages of the signals RESTORE1, RESET2, and STORE5 set at high levels only for a predetermined length of period immediately after the power supply transistor 12 is turned on. As illustrated in FIGS. 27C and 28C, this turns on each of the transistors 46, 87, and 89 in this period. In other words, the SRAM circuit 80 is electrically coupled to the ferroelectric-gate transistor 41P in this period, and the gate of the ferroelectric-gate transistor 41P is concurrently grounded. In addition, as illustrated in FIG. 25, the driving section 72 sets the voltage of the signal CTRL to the low-level voltage VL (e.g., "0 V"). This causes the node N1 to be grounded via the ferroelectric-gate transistor 41P. This causes the voltage state of the SRAM circuit 80 to be determined in accordance with the threshold state of the ferroelectric-gate transistor 41P.

Specifically, for example, as illustrated in FIG. 27C, in a case where the threshold state of the ferroelectric-gate transistor 41P is the low-threshold state VthL, the node N1 is pulled down with a low resistance value. At this time, the currents flowing from the transistor 83 of the inverter IV6 to the node N1 are smaller than the currents flowing from the node N1 to the control lines CL5 via the ferroelectric-gate transistor 41P. Therefore, the voltage VN1 of the node N1 is set to the low-level voltage VL, and the voltage VN2 of the node N2 is set to the high-level voltage VH.

In addition, for example, as illustrated in FIG. 28C, in a case where the threshold state of the ferroelectric-gate transistor 41P is the high-threshold state VthH, the node N1 is pulled down with a high resistance value. At this time, the currents flowing from the transistor 83 of the inverter IV6 to the node N1 are larger than the currents flowing from the node N1 to the control lines CL5 via the ferroelectric-gate transistor 41P. Therefore, the voltage VN1 of the node N1 is set to the high-level voltage VH, and the voltage VN2 of the node N2 is set to the low-level voltage VL.

In this manner, in the memory cell MC3, the SRAM circuit 80 stores information in accordance with the information stored in the ferroelectric-gate transistor 41P.

In this manner, in the semiconductor circuit 3, each memory cell MC3 is provided with the one ferroelectric-gate transistor 41P. This makes it possible to reduce the number of elements in the semiconductor circuit 3 as compared with the semiconductor circuit 1 according to the first embodiment. Accordingly, it is possible to reduce the area of the memory cell MC3. As a result, it is possible to reduce the area of the entire semiconductor circuit 3.

In addition, in the semiconductor circuit 3, the SRAM circuit 80 is configured to facilitate the voltage at the node N1 to reach the high-level voltage immediately after the power supply is turned on. Specifically, in the SRAM circuit 80, the gate width W83 of the transistor 83 in the inverter IV6 is greater than the gate width W81 of the transistor 81 in the inverter IV5 (W83>W81), and the gate width W82 of the transistor 82 in the inverter IV5 is greater than the gate width W84 of the transistor 84 in the inverter IV6 (W82>W84). Further, in the SRAM circuit 80, the currents flowing from the transistor 83 of the inverter IV6 to the node N1 are larger than the currents flowing from the node N1 to the control lines CL5 in a case where the threshold state of the ferroelectric-gate transistor 41P is the high-threshold state VthH (FIG. 28C). The currents flowing from the transistor 83 of the inverter IV6 to the node N1 are smaller than the currents flowing from the node N1 to the control lines CL5 in a case where the threshold state of the ferroelectric-gate transistor 41P is the low-threshold state VthL (FIG. 27C). This makes it possible in the semiconductor circuit 3 to achieve the restore operation OP4 with the one ferroelectric-gate transistor 41P.

In other words, for example, in a case where the inverters IV5 and IV6 are replaced with the inverters IV1 and IV2 according to the first embodiment in the memory cell MC3, it may not be possible to set the voltage VN1 of the node N1 to the high-level voltage VH in the restore operation OP4. In other words, in a case where the threshold state of the ferroelectric-gate transistor 41P is the low-threshold state VthL, the node N1 is pulled down with a low resistance value in the restore operation OP4. This makes it possible to set the voltage VN1 to the low-level voltage VL. However, in a case where the threshold state of the ferroelectric-gate transistor 41P is the high-threshold state VthH, the node N1 is pulled down with a high resistance value. This makes it difficult to set the voltage VN1 to the high-level voltage VH.

Meanwhile, in the semiconductor circuit 3, the SRAM circuit 80 is configured to facilitate the voltage VN1 at the node N1 to reach the high-level voltage VH immediately after the power supply is turned on. This causes the voltage VN1 to be the low-level voltage VL because, as illustrated in FIG. 27C, the node N1 is pulled down with the low resistance value in a case where the threshold state of the ferroelectric-gate transistor 41P is the low-threshold state VthL. In a case where the threshold state of the ferroelectric-gate transistor 41P is the high-threshold state VthH, the voltage VN1 becomes the high-level voltage VH as illustrated in FIG. 28C. In other words, even if the node N1 is pulled down with the high resistance value, the voltage VN1 is not significantly influenced, but becomes the high-level voltage VH. This makes it possible in the semiconductor circuit 3 to achieve the restore operation OP4 with the one ferroelectric-gate transistor 41P.

As described above, in the present embodiment, each memory cell is provided with one ferroelectric-gate transistor. This makes it possible to reduce the area of the semiconductor circuit.

In the present embodiment, the SRAM circuit is configured to facilitate the voltage at the node N1 to be a high-level voltage immediately after the power supply is turned on. This makes it possible to achieve the restore operation with one ferroelectric-gate transistor.

The other effects are similar to those of the first embodiment.

[Modification 3-1]

In the embodiment described above, the gate widths W of the transistors 81 to 84 in the inverters IV5 and IV6 are each set, but this is not limitative. Instead, for example, the gate lengths L of the transistors 81 to 84 in the inverters IV5 and IV6 may be each set. Specifically, for example, the gate length L83 of the transistor 83 in the inverter IV6 may be less than the gate length L81 of the transistor 81 in the inverter IV5 (L83<L81), and the gate length L82 of the transistor 82 in the inverter IV5 may be less than the gate length L84 of the transistor 84 in the inverter IV6 (L82<L84). Even in this case, it is possible to facilitate the voltage VN1 at the node N1 to be set to the high-level voltage VH immediately after the power supply is turned on.

[Modification 3-2]

In the embodiment described above, the gate width W83 of the transistor 83 in the inverter IV6 is greater than the gate width W81 of the transistor 81 in the inverter IV4 (W83>W81), and the gate width W82 of the transistor 82 in the inverter IV5 is greater than the gate width W84 of the transistor 84 in the inverter IV6 (W82>W84). This is not, however, limitative. Instead, the gate widths W82 and W84 of the transistors 82 and 84 may be made equal to each other, and the gate width W83 of the transistor 83 in the inverter IV6 may be made greater than the gate width W81 of the transistor 81 in the inverter IV5 (W83>W81). In addition, for example, the gate widths W81 and W83 of the transistors 81 and 83 may be made equal to each other, and the gate width W82 of the transistor 82 in the inverter IV5 may be made greater than the gate width W84 of the transistor 84 in the inverter IV6 (W82>W84). Even in this case, it is possible to facilitate the voltage VN1 at the node N1 to be set to the high-level voltage VH immediately after the power supply is turned on.

[Modification 3-3]

Although the P-type ferroelectric-gate transistor 41P is used in the embodiment described above, this is not limitative. Instead, for example, the N-type ferroelectric-gate transistor 41N may be used. The following describes a semiconductor circuit 3C according to the present modification in detail.

The semiconductor circuit 3C includes a memory circuit 70C. The memory circuit 70C includes a driving section 72C and a memory cell array 71C in which memory cells MC3C are arranged in a matrix.

FIG. 29 illustrates a configuration example of the memory cell MC3C. The memory cell MC3C includes the ferroelectric-gate transistor 41N. The gate of the ferroelectric-gate transistor 41N is coupled to the drains of the transistors 42 and 89. The source is coupled to the control lines CL5, and the drain is coupled to the drain of the transistor 46. The back gate is coupled to the drains of the transistors 44 and 45. In addition, in this memory cell MC3C, the source of the transistor 42 is coupled to the node N2, the source of the transistor 87 is supplied with the power supply voltage VDD, and the source of the transistor 88 is grounded.

Here, the ferroelectric-gate transistor 41N corresponds to a specific example of the "first transistor" in the present disclosure. The transistor 46 corresponds to a specific example of the "second transistor" in the present disclosure. The transistor 42 corresponds to a specific example of the "third transistor" in the present disclosure. The transistors 87 to 89 and the inverter IV3 correspond to specific examples of the "control circuit" in the present disclosure.

FIGS. 30A, 30B, 31A, 31B, 31C, 32A, 32B, and 32C each illustrate the operation state of the memory cell MC3C. FIG. 30A illustrates the state in the reset operation OP0, and FIG. 30B illustrates the state in the normal operation OP1. FIGS. 31A, 31 B, and 31C each illustrate the state in a case where the voltage VN2 at the node N2 is the high-level voltage VH (VN2=VH). FIG. 31A illustrates the state in the store operation OP2. FIG. 31B illustrates the state in the standby operation OP3. FIG. 31C illustrates the state in the restore operation OP4.

FIGS. 32A, 32B, and 32C each illustrate the state in a case where the voltage VN2 at the node N2 is the low-level voltage VL (VN2=VL). FIG. 32A illustrates the state in the store operation OP2. FIG. 32B illustrates the state in the standby operation OP3. FIG. 32C illustrates the state in the restore operation OP4.

(Reset Operation OP0)

In the reset operation OP0, as illustrated in FIG. 25, the control section 19 of the semiconductor circuit 3C sets the voltage of the power supply control signal SPG at a low level. This turns on the power supply transistor 12 (FIG. 1), and supplies the power supply voltage VDD to the memory circuit 70C. In addition, the control section 19 sets the voltage V1 to the voltage VP (e.g., "3 V"), and sets the voltage V2 to the voltage VM (e.g., "−2 V"). As illustrated in FIG. 30A, this supplies the inverter IV3 with the voltages VP and VM. As illustrated in FIG. 25, the driving section 72C sets the voltages of the signals STORE1 and RESTORE1 at low levels. This turns off each of the transistors 42 and 46 as illustrated in FIG. 30A. In other words, the SRAM circuit 80 is electrically separated from the ferroelectric-gate transistor 41N. In addition, as illustrated in FIG. 25, the driving section 72C sets the voltage of the signal STORE5 at a low level. As illustrated in FIG. 30A, this turns off the transistor 87. In addition, as illustrated in FIG. 25, the driving section 72C sets the voltages of the signals RESET1 and RESET2 at high levels in a predetermined length of period. As illustrated in FIG. 30A, this turns on the transistors 88 and 89. In addition, as illustrated in FIG. 25, the driving section 72C sets the voltage of the signal CTRL to the low-level voltage VL (e.g., "0 V").

The gate of the ferroelectric-gate transistor 41N is grounded via the transistors 88 and 89. In addition, the inverter IV3 outputs the voltage VP (e.g., "3 V") on the basis of the low-level voltage VL (grounding voltage VSS) supplied via the transistor 88. This supplies the back gate of the ferroelectric-gate transistor 41N with this voltage VP. Therefore, the voltage difference ΔV (=Vg−Vbg) between the voltage Vg of the gate and the voltage Vbg of the back gate of the ferroelectric-gate transistor 41N is set to a negative voltage difference (e.g., "−3 V"). This voltage difference ΔV is a voltage difference enough to set the threshold state of the ferroelectric-gate transistor 41N to the high-threshold state VthH. Accordingly, the threshold state of the ferroelectric-gate transistor 41N is set to the high-threshold state VthH.

(Normal Operation OP1)

In the normal operation OP1, the control section 19 sets the voltages V1 and V2 to the grounding voltages VSS. As illustrated in FIG. 30B, this supplies the inverter IV3 with the grounding voltage VSS. As illustrated in FIG. 25, the driving section 72C sets the voltages of the signals RESET1 and RESET2 at low levels. This turns off each of the transistors 88 and 89 as illustrated in FIG. 30B. This causes the threshold state of the ferroelectric-gate transistor 41N to be maintained in the high-threshold state VthH.

(Store Operation OP2)

In the store operation OP2, the control section 19 sets the voltage V1 to the voltage VP (e.g., "3 V"), and sets the voltage V2 to the voltage VM (e.g., "−2 V"). As illustrated in FIGS. 31A and 32A, this supplies the inverter IV3 with the voltages VP and VM. As illustrated in FIG. 25, the driving section 72C sets the voltages of the signals STORE1 and STORE5 at high levels. As illustrated in FIGS. 31A and 32A, this turns on each of the transistors 42 and 87.

For example, as illustrated in FIG. 31A, in a case where the voltage VN2 at the node N2 is the high-level voltage VH (e.g., "1 V"), the gate of the ferroelectric-gate transistor 41N is supplied with this high-level voltage VH via the transistor 42. In addition, the inverter IV3 outputs the voltage VM (e.g., "−2 V") on the basis of the high-level voltage VH (power supply voltage VDD) supplied via the transistor 87. This supplies the back gate of the ferroelectric-gate transistor 41N with this voltage VM. Therefore, the voltage difference ΔV (=Vg−Vbg) between the voltage Vg of the gate and the voltage Vbg of the back gate of the ferroelectric-gate transistor 41N is set to a positive voltage difference (e.g., "3 V"). This voltage difference ΔV is a voltage difference enough to set the threshold state of the ferroelectric-gate transistor 41N to the low-threshold state VthL. Accordingly, the threshold state of the ferroelectric-gate transistor 41N is set to the low-threshold state VthL.

In addition, for example, as illustrated in FIG. 32A, in a case where the voltage VN2 at the node N2 is the low-level voltage VL (e.g., "0 V"), the gate of the ferroelectric-gate transistor 41N is supplied with this low-level voltage VL via the transistor 42. Meanwhile, the back gate of the ferroelectric-gate transistor 41N is supplied with the voltage VM (e.g., "−2 V"). Therefore, the voltage difference ΔV (=Vg−Vbg) between the voltage Vg of the gate and the voltage Vbg of the back gate of the ferroelectric-gate transistor 41N is set to a positive voltage difference (e.g., "2 V"). This voltage difference ΔV is a voltage difference insufficient to set the threshold state of the ferroelectric-gate transistor 41N to the low-threshold state VthL. Accordingly, the threshold state of the ferroelectric-gate transistor 41N is maintain in the high-threshold state VthH.

(Standby Operation OP3)

In the standby operation OP3, as illustrated in FIG. 25, the control section 19 sets the voltage of the power supply control signal SPG at a high level. This turns off the power supply transistor 12 (FIG. 1), and the power supply to the memory circuit 70C is stopped. In this standby operation OP3, as illustrated in FIGS. 31B and 32B, the threshold state of the ferroelectric-gate transistor 41N is maintained.

(Restore Operation OP4)

In the restore operation OP4, as illustrated in FIG. 25, the control section 19 sets the voltage of the power supply control signal SPG at a low level. This turns on the power supply transistor 12 (FIG. 1), and supplies the power supply voltage VDD to the memory circuit 70C. In addition, the control section 19 sets the voltages V1 and V2 to the grounding voltage VSS. As illustrated in FIGS. 31C and 32C, this supplies the inverter IV3 with the grounding voltage VSS. The driving section 72C has the voltages of the signals RESTORE1, RESET2, and STORE5 set at high levels only for a predetermined length of period immediately after the power supply transistor 12 is turned on. As illustrated in FIGS. 31C and 32C, this turns on each of the transistors 46, 87, and 89 in this period. In other words, the SRAM circuit 80 is electrically coupled to the ferroelectric-gate transistor 41N in this period, and the gates of the ferroelectric-gate transistor 41N are concurrently supplied with the power supply voltage VDD. In addition, as illustrated in FIG. 25, the driving section 72C sets the voltage of the signal CTRL to the low-level voltage VL (e.g., "0 V"). This causes the node N1 to be grounded via the ferroelectric-gate transistor 41N. This causes the voltage state of the SRAM circuit 80 to be determined in accordance with the threshold state of the ferroelectric-gate transistor 41N.

Specifically, for example, as illustrated in FIG. 31C, in a case where the threshold state of the ferroelectric-gate transistor 41N is the low-threshold state VthL, the node N1 is pulled down with a low resistance value. At this time, the currents flowing from the transistor 83 of the inverter IV6 to the node N1 are smaller than the currents flowing from the node N1 to the control lines CL5 via the ferroelectric-gate transistor 41N. Therefore, the voltage VN1 of the node N1 is set to the low-level voltage VL, and the voltage VN2 of the node N2 is set to the high-level voltage VH.

In addition, for example, as illustrated in FIG. 33C, in a case where the threshold state of the ferroelectric-gate transistor 41N is the high-threshold state VthH, the node N1 is pulled down with a high resistance value. At this time, the currents flowing from the transistor 83 of the inverter IV6 to the node N1 are larger than the currents flowing from the node N1 to the control lines CL5 via the ferroelectric-gate transistor 41N. Therefore, the voltage VN1 of the node N1 is set to the high-level voltage VH, and the voltage VN2 of the node N2 is set to the low-level voltage VL.

[Modification 3-4]

Each modification of the first embodiment described above may be applied to the semiconductor circuit 3 according to the embodiment described above.

4. Applied Example and Example of Application

Next, an applied example of the technology described in the embodiments and modification described above, and an example of application of the technology described in the embodiments and modification described above to an electronic device are described.

Applied Example

In the embodiments described above, the present technology is applied to an SRAM circuit, but this is not limitative. For example, the present technology may be applied to flip-flop circuits 101 to 104 illustrated in FIGS. 33A, 33B, 33C, and 33D. The flip-flop circuit 101 is a so-called master-slave D-type flip-flop circuit including a master latch circuit 101 M and a slave latch circuit 101S. The same applies to the flip-flop circuits 102 to 104.

FIG. 34 illustrates a configuration example of a flip-flop 201 according to the present applied example. The flip-flop circuit 201 includes the master latch circuit 101M and a slave latch circuit 201S. The technology according to the first embodiment described above is applied to this slave latch circuit 201S. The slave latch circuit 201S includes inverters IV7 and IV8, a transmission gate TG, a switch 100, ferroelectric-gate transistors 41P and 51P, and transistors 42 to 47 and 52 to 57. The input terminal of the inverter IV7 is coupled to the node N1, and the output terminal is coupled to the node N2. The input terminal of the inverter IV8 is coupled to the node N2, and the output terminal is coupled to one end of the transmission gate TG and one end of the switch 100. The one end of the transmission gate TG is coupled to the output terminal of the inverter IV8 and the one end of the switch 100, and the other end is coupled to the node N1. The one end of the switch 100 is coupled to the output terminal of the inverter IV8 and the one end of the transmission gate TG, and the other end is coupled to the node N1. The switch 100 is turned off in a case where the normal operation OP1 is performed. The switch 100 is turned on in a case where, for example, the store operation OP2 and the restore operation OP4 are performed.

It should be noted that, in this example, the technology according to the embodiment described above is applied to the slave latch circuit, but this is not limitative. Instead, for example, the technology according to the embodiment described above may be applied to the master latch circuit.

(Example of Application to Electronic Device)

FIG. 35 illustrates the appearance of a smartphone to which the semiconductor circuit according to the embodiments described above or the like is applied. This smartphone includes, for example, a main body 310, a display section 320, and a battery 330.

The semiconductor circuit according to the embodiments or the like is applicable to electronic devices in various fields such as digital cameras, notebook personal computers, portable game consoles, and video cameras in addition to such a smartphone. The present technology is effective especially when applied to a portable electronic device including a battery.

Although the present technology has been described above with reference to several embodiments and modifications, and a specific applied example thereof and an example of application to an electronic device, the present technology is not limited to these embodiments and the like, and it is possible to make various modifications.

For example, in the applied example described above, the present technology is applied to a D-type flip-flop circuit, but is not limited thereto. For example, the present technology may be applied to another flip-flop circuit or a latch circuit.

It should be noted that the effects described in the present specification are merely illustrative, but not limited. Other effects may be included.

It should be noted that the present technology may be configured as below.

(1)

A semiconductor circuit including:

a first circuit that is configured to generate an inverted voltage of a voltage at a first node, and apply the inverted voltage to a second node;

a second circuit that is configured to generate an inverted voltage of a voltage at the second node, and apply the inverted voltage to the first node;

a first transistor that includes a gate, a drain, and a source, and is configured to store a threshold state;

a second transistor that couples the first node to a first terminal by being turned on, the first terminal being one of the drain or the source of the first transistor;

a third transistor that couples a first predetermined node to the gate of the first transistor by being turned on, the first predetermined node being one of the first node or the second node; and a driving section that controls operations of the second transistor and the third transistor, and applies a control voltage to a second terminal, the second terminal being another of the drain or the source of the first transistor.

(2)
The semiconductor circuit according to (1), in which the first transistor further includes a gate insulating layer including a ferroelectric material.

(3)
The semiconductor circuit according to (1) or (2), in which
the first transistor further includes a back gate, and
the threshold state of the first transistor is selectively set to a high-threshold state or a low-threshold state on the basis of a polarity of a voltage difference between a voltage of the gate and a voltage of the back gate of the first transistor.

(4)
The semiconductor circuit according to (3), further including a voltage setting circuit that is configured to set the voltage of the back gate of the first transistor on the basis of a voltage of the first predetermined node, in which
the driving section further controls the operation of the voltage setting circuit.

(5)
The semiconductor circuit according to (4), in which
the voltage of the first predetermined node is a high-level voltage or a low-level voltage, and
the voltage setting circuit
sets the voltage of the back gate of the first transistor to a first voltage lower than the high-level voltage in a case where the voltage of the first predetermined node is the high-level voltage, and
sets the voltage of the back gate of the first transistor to a second voltage higher than the low-level voltage in a case where the voltage of the first predetermined node is the low-level voltage.

(6)
The semiconductor circuit according to (5), in which
the first voltage is lower than the low-level voltage, and
the second voltage is higher than the high-level voltage.

(7)
The semiconductor circuit according to (5) or (6), in which the driving section turns off the second transistor, turns on the third transistor, and controls an operation of the voltage setting circuit to cause the voltage setting circuit to set the voltage of the back gate of the first transistor in a first period.

(8)
The semiconductor circuit according to (3), in which the driving section further sets the voltage of the back gate of the first transistor.

(9)
The semiconductor circuit according to (8), in which
a voltage of the first predetermined node is a high-level voltage or a low-level voltage, and
the driving section
turns off the second transistor and turns on the third transistor in a first period,
sets the voltage of the back gate of the first transistor to a first voltage lower than the high-level voltage in a first sub-period of the first period, and
sets the voltage of the back gate of the first transistor to a second voltage higher than the low-level voltage in a second sub-period of the first period.

(10)
The semiconductor circuit according to (7) or (9), further including a fourth transistor that supplies a third voltage to the gate of the first transistor by being turned on, in which
the driving section turns on the second transistor and the fourth transistor, and turns off the third transistor in a second period after the first period.

(11)
The semiconductor circuit according to any of (1) to (10), further including:
a fifth transistor that includes a gate, a drain, and a source, and is configured to store a threshold state;
a sixth transistor that couples the second node to a third terminal by being turned on, the third terminal being one of the drain or the source of the fifth transistor; and
a seventh transistor that couples a second predetermined node to the gate of the fifth transistor by being turned on, the second predetermined node being another of the first node or the second node, in which
the driving section further controls operations of the sixth transistor and the seventh transistor, and applies the control voltage to a fourth terminal, the fourth terminal being another of the drain or the source of the fifth transistor.

(12)
The semiconductor circuit according to (3), further including a control circuit that includes a fourth transistor and a voltage setting circuit, and is configured to set the threshold state of the first transistor to a predetermined threshold state, the fourth transistor setting the voltage of the gate of the first transistor by being turned on, the voltage setting circuit being configured to set the voltage of the back gate of the first transistor, in which
the driving section further controls an operation of the control circuit.

(13)
The semiconductor circuit according to (12), in which the first circuit and the second circuit are configured to facilitate the voltage at the first node to be a predetermined voltage after a power supply is turned on.

(14)
The semiconductor circuit according to (13), in which the driving section
controls the operation of the control circuit in a third period to cause the voltage setting circuit to set the voltage of the back gate of the first transistor to one of a first voltage or a second voltage, thereby causing the control circuit to set the threshold state of the first transistor to the predetermined threshold state, and
turns on the third transistor, turns off the second transistor and the fourth transistor, and controls the operation of the control circuit to cause the voltage setting circuit to set the voltage of the back gate of the first transistor to another of the first voltage or the second voltage in a first period after the third period.

(15)
The semiconductor circuit according to (14), in which the driving section turns on the second transistor, turns off the third transistor, and controls the operation of the control circuit to set the voltage of the gate of the first transistor to a third voltage by turning on the fourth transistor in a second period after the first period.

(16)
The semiconductor circuit according to any of (13) to (15), in which
the first circuit includes an eighth transistor that couples a first power supply and the second node to each other by being turned on, the first power supply corresponding to the predetermined voltage, and
the second circuit includes a ninth transistor that couples the first power supply and the first node to each other by being turned on, the ninth transistor having a gate width greater than a gate width of the eighth transistor.

(17)

The semiconductor circuit according to any of (13) to (16), in which the second circuit includes a tenth transistor that couples a second power supply and the first node to each other by being turned on, the second power supply corresponding to a voltage different from the predetermined voltage, and the first circuit includes an eleventh transistor that couples the second power supply and the second node to each other by being turned on, the eleventh transistor having a gate width greater than a gate width of the tenth transistor.

(18)

The semiconductor circuit according to any of (13) to (17), in which the first circuit includes an eighth transistor that couples a first power supply and the second node to each other by being turned on, the first power supply corresponding to the predetermined voltage, and the second circuit includes a ninth transistor that couples the first power supply and the first node to each other by being turned on, the ninth transistor having a gate length less than a gate length of the eighth transistor.

(19)

The semiconductor circuit according to any of (13) to (18), in which the second circuit includes a tenth transistor that couples a second power supply and the first node to each other by being turned on, the second power supply corresponding to a voltage different from the predetermined voltage, and the first circuit includes an eleventh transistor that couples the second power supply and the second node to each other by being turned on, the eleventh transistor having a gate length less than a gate length of the tenth transistor.

(20)

The semiconductor circuit according to any of (13) to (19), in which the second circuit includes a ninth transistor that couples a first power supply and the first node to each other by being turned on, the first power supply corresponding to the predetermined voltage, the driving section turns on the second transistor, turns off the third transistor, and controls the operation of the control circuit to set the voltage of the gate of the first transistor to a third voltage by turning on the fourth transistor in a second period, and a current value of a current flowing from the first power supply to the first node via the ninth transistor in the second period after the power supply is turned on is between a first current value and a second current value, the first current value being for a current flowing from the first node to the first transistor when the threshold state of the first transistor is the high-threshold state, the second current value being for a current flowing from the first node to the first transistor when the threshold state of the first transistor is the low-threshold state.

(21)

The semiconductor circuit according to any of (1) to (20), in which the first circuit and the second circuit are included in an SRAM circuit.

(22)

The semiconductor circuit according to any of (1) to (20), in which the first circuit and the second circuit are included in a latch circuit.

(23)

A driving method including performing first driving in a first period for a semiconductor circuit including a first circuit that is configured to generate an inverted voltage of a voltage at a first node, and apply the inverted voltage to a second node, a second circuit that is configured to generate an inverted voltage of a voltage at the second node, and apply the inverted voltage to the first node, a first transistor that includes a gate, a drain, and a source, and is configured to store a threshold state, a second transistor that couples the first node to a first terminal by being turned on, the first terminal being one of the drain or the source of the first transistor, and a third transistor that couples a first predetermined node to the gate of the first transistor by being turned on, the first predetermined node being one of the first node or the second node, the first driving turning off the second transistor and turning on the third transistor, thereby setting the threshold state of the first transistor to a threshold state corresponding to a voltage at the first predetermined node.

(24)

The driving method according to (23), in which second driving is performed in a second period after the first period, the second driving turning on the second transistor and turning off the third transistor, thereby setting the voltage at the first node to a voltage corresponding to the threshold state of the first transistor.

(25)

An electronic device including:

a semiconductor circuit; and a battery that supplies the semiconductor circuit with a power supply voltage, the semiconductor circuit including a first circuit that is configured to generate an inverted voltage of a voltage at a first node, and apply the inverted voltage to a second node, a second circuit that is configured to generate an inverted voltage of a voltage at the second node, and apply the inverted voltage to the first node, a first transistor that includes a gate, a drain, and a source, and is configured to store a threshold state, a second transistor that couples the first node to a first terminal by being turned on, the first terminal being one of the drain or the source of the first transistor, a third transistor that couples a first predetermined node to the gate of the first transistor by being turned on, the first predetermined node being one of the first node or the second node, and a driving section that controls operations of the second transistor and the third transistor, and applies a control voltage to a second terminal, the second terminal being another of the drain or the source of the first transistor.

This application claims the priority on the basis of Japanese Patent Application No. 2017-099730 filed with Japan Patent Office on May 19, 2017, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor circuit, comprising:

a first circuit configured to:

generate a first inverted voltage of a voltage at a first nodel; and apply the first inverted voltage to a second node;

a second circuit configured to:

generate a second inverted voltage of a voltage at the second nodel; and apply the second inverted voltage to the first node;

a first transistor that includes a gate, a drain, and a source, wherein the first transistor is configured to store a first threshold state;
a second transistor configured to couple the first node to a first of the drain or the source of the first transistor;
a third transistor configured to couple a first determined node to the gate of the first transistor, wherein the first determined node is one of the first node or the second node, and a source of the third transistor is directly connected to the first determined node; and
a driving section configured to:
control operations of the second transistor and the third transistor; and
apply a control voltage to a second of the drain or the source of the first transistor.

2. The semiconductor circuit according to claim 1, wherein the first transistor further includes a gate insulating layer including a ferroelectric material.

3. The semiconductor circuit according to claim 1, wherein
the first transistor further includes a back gate,
the first threshold state of the first transistor is selectively set to one of a high-threshold state or a low-threshold state based on a polarity of a voltage difference between a voltage of the gate and a voltage of the back gate of the first transistor, and
the high-threshold state is higher than the low-threshold state .

4. The semiconductor circuit according to claim 3, further comprising a voltage setting circuit that is configured to set the voltage of the back gate of the first transistor based on a voltage of the first determined node, wherein
the driving section is further configured to control an controls the operation of the voltage setting circuit.

5. The semiconductor circuit according to claim 4, wherein the voltage of the first determined node is one of a high-level voltage or a low-level voltage, and
the voltage setting circuit is further configured to:
set the voltage of the back gate of the first transistor to a first voltage lower than the high-level voltage, in a case the voltage of the first determined node is the high-level voltage, and
set the voltage of the back gate of the first transistor to a second voltage higher than the low-level voltage, in a case the voltage of the first determined node is the low-level voltage.

6. The semiconductor circuit according to claim 5, wherein
the first voltage is lower than the low-level voltage, and the second voltage is higher than the high-level voltage.

7. The semiconductor circuit according to claim 5, wherein the driving section is configured to:
turn off the second transistor;
turn on the third transistor; and
control the operation of the voltage setting circuit to cause the voltage setting circuit to set the voltage of the back gate of the first transistor in a first period.

8. The semiconductor circuit according to claim 3, wherein the driving section is further configured to set the voltage of the back gate of the first transistor.

9. The semiconductor circuit according to claim 8, wherein
a voltage of the first determined node is one of a high-level voltage or a low-level voltage, and
the driving section is further configured to:
turn off the second transistor and turn on the third transistor in a first period;
set the voltage of the back gate of the first transistor to a first voltage lower than the high-level voltage in a first sub-period of the first period, and
set the voltage of the back gate of the first transistor to a second voltage higher than the low-level voltage in a second sub-period of the first period.

10. The semiconductor circuit according to claim 7, further comprising a fourth transistor configured to supply a third voltage to the gate of the first transistor, wherein
the driving section is further configured to:
turn on the second transistor and the fourth transistor; and
turn off the third transistor in a second period after the first period.

11. The semiconductor circuit according to claim 1, further comprising:
a fifth transistor that includes a gate, a drain, and a source, wherein the fifth transistor is configured to store a second threshold state;
a sixth transistor configured to couple the second node to a third terminal, wherein the third terminal is one of the drain or the source of the fifth transistor; and
a seventh transistor configured to couple a second determined node to the gate of the fifth transistor, wherein the second determined node is another of the first node or the second node, wherein
the driving section is further configured to:
control operations of the sixth transistor and the seventh transistor, and
apply the control voltage to a fourth terminal, wherein the fourth terminal is another of the drain or the source of the fifth transistor.

12. The semiconductor circuit according to claim 3, further comprising a control circuit that includes a fourth transistor and a voltage setting circuit, wherein
the control circuit is configured to set the first threshold state of the first transistor to a determined threshold state,
the fourth transistor sets the voltage of the gate of the first transistor by being turned on,
the voltage setting circuit is configured to set the voltage of the back gate of the first transistor, and
the driving section is further configured to control an operation of the control circuit.

13. The semiconductor circuit according to claim 12, wherein the first circuit and the second circuit are further configured to facilitate the voltage at the first node to be a determined voltage after a power supply is turned on.

14. The semiconductor circuit according to claim 13, wherein the driving section is configured to:
control the operation of the control circuit in a third period to cause the voltage setting circuit to set the voltage of the back gate of the first transistor to one of a first voltage or a second voltage, to thereby cause the control circuit to set the first threshold state of the first transistor to the determined threshold state;
turn on the third transistor, turn off the second transistor and the fourth transistor; and
control the operation of the control circuit to cause the voltage setting circuit to set the voltage of the back gate of the first transistor to another of the first voltage or the second voltage in a first period after the third period.

15. The semiconductor circuit according to claim 14, wherein the driving section is further configured to:

turn on the second transistor;
turn off the third transistor; and
control the operation of the control circuit to set the voltage of the gate of the first transistor to a third voltage by turning on the fourth transistor in a second period after the first period.

16. The semiconductor circuit according to claim 13, wherein
the first circuit further includes an eighth transistor configured to couple a first power supply to the second node,
the first power supply corresponds to the determined voltage,
the second circuit further includes a ninth transistor configured to couple the first power supply to the first node, and
the ninth transistor has a gate width greater than a gate width of the eighth transistor.

17. The semiconductor circuit according to claim 13, wherein
the second circuit further includes a tenth transistor configured to couple a second power supply to the first node to each other,
the second power supply corresponds to a voltage different from the determined voltage,
the first circuit further includes an eleventh transistor configured to couple the second power supply to the second node, and
the eleventh transistor has a gate width greater than a gate width of the tenth transistor.

18. The semiconductor circuit according to claim 13, wherein
the first circuit further includes an eighth transistor configured to couple a first power supply to the second node,
the first power supply corresponds to the determined voltage,
the second circuit further includes a ninth transistor configured to couple the first power supply to the first node, and
the ninth transistor has a gate length less than a gate length of the eighth transistor.

19. The semiconductor circuit according to claim 13, wherein
the second circuit further includes a tenth transistor configured to couple a second power supply to the first node,
the second power supply corresponds to a voltage different from the determined voltage,
the first circuit further includes an eleventh transistor configured to couple the second power supply to the second node, and
the eleventh transistor has a gate length less than a gate length of the tenth transistor.

20. The semiconductor circuit according to claim 13, wherein
the second circuit includes a ninth transistor configured to couple first power supply to the first node,
the first power supply corresponds to the determined voltage,
the driving section is configured to:
turn on the second transistor;
turn off the third transistor; and
control the operation of the control circuit to set the voltage of the gate of the first transistor to a third voltage by turning on the fourth transistor in a second period, and
a current value of a current flowing from the first power supply to the first node via the ninth transistor in the second period after the power supply is turned on is between a first current value and a second current value,
the first current value is for a current flowing from the first node to the first transistor when the first threshold state of the first transistor is the high-threshold state, and
the second current value is for a current flowing from the first node to the first transistor when the first threshold state of the first transistor is the low-threshold state.

21. The semiconductor circuit according to claim 1, wherein the first circuit and the second circuit are included in an SRAM circuit.

22. The semiconductor circuit according to claim 1, wherein the first circuit and the second circuit are included in a latch circuit.

23. A driving method, comprising:
performing first driving in a first period for a semiconductor circuit, wherein the semiconductor circuit includes:
a first circuit configured to:
generate a first inverted voltage of a voltage at a first node; and
apply the first inverted voltage to a second node;
a second circuit configured to:
generate a second inverted voltage of a voltage at the second node; and
apply the second inverted voltage to the first node;
a first transistor that includes a gate, a drain, and a source, wherein the first transistor is configured to store a first threshold state;
a second transistor configured to couple the first node to a first terminal, wherein the first terminal is one of the drain or the source of the first transistor; and
a third transistor configured to couple a first determined node to the gate of the first transistor, wherein the first determined node is one of the first node or the second node, and a source of the third transistor is directly connected to the first determined node,
wherein the first driving turns off the second transistor and turns on the third transistor, thereby setting the first threshold state of the first transistor to a threshold state corresponding to a voltage at the first determined node.

24. The driving method according to claim 23, further comprising performing a second driving in a second period after the first period, wherein the second driving turns on the second transistor and turns off the third transistor, thereby setting the voltage at the first node to a voltage corresponding to the first threshold state of the first transistor.

25. An electronic device, comprising:
a semiconductor circuit; and
a battery that supplies the semiconductor circuit with a power supply voltage,
wherein the semiconductor circuit comprises:
a first circuit configured to:
generate a first inverted voltage of a voltage at a first node; and
apply the first inverted voltage to a second node;
a second circuit configured to:
generate a second inverted voltage of a voltage at the second node; and
apply the second inverted voltage to the first node;
a first transistor that includes a gate, a drain, and a source, wherein the first transistor is configured to store a first threshold state;

a second transistor configured to couple the first node to a first of the drain or the source of the first transistor;

a third transistor configured to couple a first determined node to the gate of the first transistor, wherein the first determined node is one of the first node or the second node, and a source of the third transistor is directly connected to the first determined node; and a driving section configured to:
  control operations of the second transistor and the third transistor; and
  apply a control voltage to a second of the drain or the source of the first transistor.

26. A semiconductor circuit, comprising:

a first circuit configured to:
  generate a first inverted voltage of a voltage at a first node; and
  apply the first inverted voltage to a second node;

a second circuit configured to:
  generate a second inverted voltage of a voltage at the second node; and
  apply the second inverted voltage to the first node;

a first transistor includes a gate, a drain, a source, and a back gate, wherein
  the first transistor is configured to store a threshold state, and
  the threshold state of the first transistor is selectively set to one of a high-threshold state or a low-threshold state based on a polarity of a voltage difference between a voltage of the gate and a voltage of the back gate of the first transistor;

a second transistor configured to couple the first node to a first terminal by being turned on, wherein the first terminal is one of the drain or the source of the first transistor;

a third transistor configured to couple a determined node to the gate of the first transistor by being turned on, wherein
  the determined node is one of the first node or the second node, and
  the voltage of the determined node is one of a high-level voltage or a low-level voltage;

a voltage setting circuit configured to:
  set the voltage of the back gate of the first transistor to a first voltage lower than the high-level voltage, in a case the voltage of the determined node is the high-level voltage; and
  set the voltage of the back gate of the first transistor to a second voltage higher than the low-level voltage, in a case the voltage of the determined node is the low-level voltage; and a driving section configured to:
  control operations of the second transistor and the third transistor;
  control an operation of the voltage setting circuit; and
  apply a control voltage to a second terminal, wherein the second terminal is another of the drain or the source of the first transistor.

* * * * *